(12) United States Patent
Barth et al.

(10) Patent No.: US 7,360,050 B2
(45) Date of Patent: Apr. 15, 2008

(54) INTEGRATED CIRCUIT MEMORY DEVICE HAVING DELAYED WRITE CAPABILITY

(75) Inventors: Richard M. Barth, Palo Alto, CA (US); Frederick A. Ware, Los Altos Hills, CA (US); Donald C. Stark, Los Altos, CA (US); Craig E. Hampel, San Jose, CA (US); Paul G. Davis, San Jose, CA (US); Abhijit M. Abhyankar, Sunnyvale, CA (US); James A. Gasbarro, Mountain View, CA (US); David Nguyen, San Jose, CA (US)

(73) Assignee: Rambus Inc., Los Altos, CA (US)

( * ) Notice: Subject to any disclaimer, the term of this patent is extended or adjusted under 35 U.S.C. 154(b) by 1 day.

(21) Appl. No.: 11/681,375

(22) Filed: Mar. 2, 2007

(65) Prior Publication Data
US 2007/0147143 A1 Jun. 28, 2007

Related U.S. Application Data

(60) Continuation of application No. 11/059,216, filed on Feb. 15, 2005, now Pat. No. 7,197,611, which is a continuation of application No. 10/128,167, filed on Apr. 22, 2002, now Pat. No. 6,868,474, which is a division of application No. 09/169,206, filed on Oct. 9, 1998, now Pat. No. 6,401,167.

(60) Provisional application No. 60/061,770, filed on Oct. 10, 1997.

(51) Int. Cl.
*G06F 12/00* (2006.01)
(52) U.S. Cl. .................. 711/167; 711/105; 711/169; 365/190; 365/222
(58) Field of Classification Search ............... 365/190, 365/222, 233, 230.03, 189.01; 711/169, 711/168, 167, 105, 5, 100, 154; 370/375
See application file for complete search history.

(56) References Cited

U.S. PATENT DOCUMENTS

| 3,950,735 A | 4/1976 | Patel |
| 4,183,095 A | 1/1980 | Ward |
| 4,315,308 A | 2/1982 | Jackson |
| 4,330,852 A | 5/1982 | Redwine et al. |

(Continued)

FOREIGN PATENT DOCUMENTS

EP 0339224 11/1989

(Continued)

OTHER PUBLICATIONS

Haining, T. R. et al., "Management Policies For Non-Volatile Write Caches", International Conference on Performance, Computing, and Communications, Feb. 10-12, 1999 pp. 321-328.*

(Continued)

*Primary Examiner*—Pierre-Michel Bataille
(74) *Attorney, Agent, or Firm*—Morgan, Lewis & Bockius LLP

(57) ABSTRACT

An integrated circuit memory device has a first set of pins to receive, using a clock signal, a row address followed by a column address. The device has a second set of pins to receive, using the clock signal, a sense command and a write command. The sense command specifies that the device activate a row of memory cells identified by the row address. The write command specifies that the memory device receive write data and store the write data at a location, identified by the column address, in the row of memory cells. The write command is posted internally to the memory device after a first delay has transpired from a first time period in which the write command is received at the second set of pins. The write data is received at a third set of pins after a second delay has transpired from the first time period.

31 Claims, 44 Drawing Sheets

U.S. PATENT DOCUMENTS

| | | |
|---|---|---|
| 4,337,523 A | 6/1982 | Hotta et al. |
| 4,445,204 A | 4/1984 | Nishiguchi |
| 4,499,536 A | 2/1985 | Gemma et al. |
| 4,528,661 A | 7/1985 | Bahr et al. |
| 4,637,018 A | 1/1987 | Flora et al. |
| 4,646,270 A | 2/1987 | Voss |
| 4,712,190 A | 12/1987 | Guglielmi et al. |
| 4,719,602 A | 1/1988 | Hag et al. |
| 4,755,937 A | 7/1988 | Glier |
| 4,763,249 A | 8/1988 | Bomba et al. |
| 4,792,926 A | 12/1988 | Roberts |
| 4,792,929 A | 12/1988 | Olson et al. |
| 4,799,199 A | 1/1989 | Scales, III et al. |
| 4,800,530 A | 1/1989 | Itoh et al. |
| 4,821,226 A | 4/1989 | Christopher et al. |
| 4,825,411 A | 4/1989 | Hamano |
| 4,845,664 A | 7/1989 | Anthias et al. |
| 4,845,677 A | 7/1989 | Chappell et al. |
| 4,849,937 A | 7/1989 | Yoshimoto |
| 4,866,675 A | 9/1989 | Kawashima |
| 4,875,192 A | 10/1989 | Matsumoto |
| 4,882,712 A | 11/1989 | Ohno et al. |
| 4,891,791 A | 1/1990 | Iijima |
| 4,916,670 A | 4/1990 | Suzuki et al. |
| 4,920,483 A | 4/1990 | Pogue et al. |
| 4,928,265 A | 5/1990 | Higuchi et al. |
| 4,937,734 A | 6/1990 | Bechtiksheim |
| 4,945,516 A | 7/1990 | Kashiyama |
| 4,953,128 A | 8/1990 | Kawai |
| 5,001,672 A | 3/1991 | Ebbers et al. |
| 5,077,693 A | 12/1991 | Hardee et al. |
| 5,083,296 A | 1/1992 | Hara et al. |
| 5,111,386 A | 5/1992 | Fujishima et al. |
| 5,124,589 A | 6/1992 | Shiomi et al. |
| 5,140,688 A | 8/1992 | White et al. |
| 5,179,687 A | 1/1993 | Hidaka et al. |
| 5,260,905 A | 11/1993 | Mori |
| 5,276,858 A | 1/1994 | Oak et al. |
| 5,301,278 A | 4/1994 | Bowater et al. |
| 5,305,278 A | 4/1994 | Inoue |
| 5,311,483 A | 5/1994 | Takasugi |
| 5,319,755 A | 6/1994 | Farmwald et al. |
| 5,323,358 A | 6/1994 | Toda et al. |
| 5,327,390 A | 7/1994 | Takasugi |
| 5,337,285 A | 8/1994 | Ware et al. |
| 5,339,276 A | 8/1994 | Taksugi |
| 5,341,341 A | 8/1994 | Fukuzo |
| 5,345,573 A | 9/1994 | Bowden, III et al. |
| 5,365,489 A | 11/1994 | Jeong |
| 5,381,376 A | 1/1995 | Kim et al. |
| 5,381,538 A | 1/1995 | Amini et al. |
| 5,384,745 A | 1/1995 | Konishi et al. |
| 5,386,385 A | 1/1995 | Stephens, Jr. |
| 5,390,149 A | 2/1995 | Vogley et al. |
| 5,392,239 A | 2/1995 | Margulis et al. |
| 5,404,338 A | 4/1995 | Murai et al. |
| 5,404,463 A | 4/1995 | McGarvey |
| 5,432,468 A | 7/1995 | Moriyama et al. |
| 5,444,667 A | 8/1995 | Obara |
| 5,452,401 A | 9/1995 | Lin |
| 5,455,803 A | 10/1995 | Kodama |
| 5,471,607 A | 11/1995 | Garde |
| 5,483,640 A | 1/1996 | Isfeld et al. ............... 709/200 |
| 5,504,874 A | 4/1996 | Galles et al. |
| 5,508,960 A | 4/1996 | Pinkham ............... 365/189.01 |
| 5,511,024 A | 4/1996 | Ware et al. |
| 5,533,204 A | 7/1996 | Tipley |
| 5,548,786 A | 8/1996 | Amini et al. |
| 5,553,248 A | 9/1996 | Melo et al. |
| 5,598,376 A | 1/1997 | Merritt et al. |
| 5,611,058 A | 3/1997 | Moore et al. |
| 5,638,531 A | 6/1997 | Crump et al. |
| 5,649,161 A | 7/1997 | Andrade et al. |
| 5,655,113 A | 8/1997 | Leung |
| 5,659,515 A | 8/1997 | Matsuo et al. ............... 365/222 |
| 5,673,226 A | 9/1997 | Yumitori et al. ............ 365/190 |
| 5,680,361 A | 10/1997 | Ware et al. |
| 5,715,407 A | 2/1998 | Barth et al. |
| 5,748,914 A | 5/1998 | Barth et al. |
| 5,758,132 A | 5/1998 | Strålin |
| 5,764,963 A | 6/1998 | Ware et al. |
| 5,765,020 A | 6/1998 | Barth et al. |
| 5,774,409 A | 6/1998 | Yamazaki et al. ...... 365/230.03 |
| 5,778,419 A | 7/1998 | Hansen et al. |
| 5,781,918 A | 7/1998 | Lieberman et al. ............ 711/5 |
| 5,793,227 A | 8/1998 | Goldrian |
| 5,796,995 A | 8/1998 | Nasserbakht et al. |
| 5,802,356 A | 9/1998 | Gaskins et al. |
| 5,805,873 A | 9/1998 | Roy ......................... 713/502 |
| 5,815,693 A | 9/1998 | McDermott et al. |
| 5,844,855 A | 12/1998 | Ware et al. |
| 5,870,350 A | 2/1999 | Bertin et al. ................. 365/233 |
| 5,872,996 A | 2/1999 | Barth et al. |
| 5,884,100 A | 3/1999 | Normoyle et al. |
| 5,886,948 A | 3/1999 | Ryan ......................... 365/233 |
| 5,896,545 A | 4/1999 | Barth et al. |
| 5,917,760 A | 6/1999 | Miller ........................ 365/194 |
| 5,918,058 A | 6/1999 | Budd |
| 5,940,340 A | 8/1999 | Ware et al. |
| 5,956,284 A | 9/1999 | Ware et al. |
| 5,970,019 A | 10/1999 | Suzuki et al. .......... 365/230.06 |
| 5,987,620 A | 11/1999 | Tran |
| 6,006,290 A | 12/1999 | Suh ............................ 711/105 |
| 6,035,369 A | 3/2000 | Ware et al. |
| 6,065,092 A | 5/2000 | Roy ............................. 711/5 |
| 6,075,730 A | 6/2000 | Barth et al. |
| 6,125,078 A * | 9/2000 | Ooishi et al. ............... 365/233 |
| 6,134,638 A | 10/2000 | Olarig et al. |
| 6,209,071 B1 | 3/2001 | Barth et al. |
| 6,226,723 B1 | 5/2001 | Gustavson et al. ......... 711/170 |
| 6,260,097 B1 | 7/2001 | Farmwald et al. |
| 6,263,448 B1 | 7/2001 | Tsern et al. |
| 6,266,285 B1 | 7/2001 | Farmwald et al. |
| 6,266,737 B1 | 7/2001 | Ware et al. |
| 6,304,937 B1 | 10/2001 | Farmwald et al. |
| 6,314,051 B1 | 11/2001 | Farmwald et al. |
| 6,321,316 B1 | 11/2001 | Manning ..................... 711/167 |
| 6,343,352 B1 | 1/2002 | Davis et al. |
| 6,401,167 B1 | 6/2002 | Barth et al. |
| 6,404,178 B2 * | 6/2002 | Kato ........................... 323/316 |
| 6,442,644 B1 | 8/2002 | Gustavson et al. |
| 6,462,998 B1 * | 10/2002 | Proebsting .................. 365/205 |
| 6,470,405 B2 | 10/2002 | Barth et al. ................. 710/100 |
| 6,493,789 B2 | 12/2002 | Ware et al. |
| 6,496,897 B2 | 12/2002 | Ware et al. |
| 6,570,873 B1 | 5/2003 | Isoyama et al. .............. 370/375 |
| 6,584,037 B2 | 6/2003 | Farmwald et al. .......... 365/233 |
| 6,591,353 B1 | 7/2003 | Barth et al. ................. 711/167 |
| 6,640,292 B1 | 10/2003 | Barth et al. |
| 6,681,288 B2 | 1/2004 | Ware et al. |
| 6,701,446 B2 | 3/2004 | Tsern et al. |
| 6,757,779 B1 | 6/2004 | Nataraj et al. ............... 711/108 |
| 6,889,300 B2 | 5/2005 | Davis et al. ................. 711/169 |
| 6,931,201 B2 | 8/2005 | Ware et al. ................. 365/194 |
| 6,931,467 B2 | 8/2005 | Barth et al. ................. 710/100 |
| 7,047,375 B2 | 5/2006 | Davis et al. ................. 711/158 |

FOREIGN PATENT DOCUMENTS

| | | |
|---|---|---|
| EP | 0535670 A1 | 4/1993 |
| EP | 0561370 A2 | 9/1993 |
| EP | 0638858 A1 | 2/1995 |
| EP | 0778575 A2 | 6/1997 |
| FR | 2695227 | 3/1994 |

| | | |
|---|---|---|
| JP | 58-192154 | 11/1983 |
| JP | 61-107453 | 5/1986 |
| JP | 61-160556 | 10/1986 |
| JP | 62-016289 | 1/1987 |
| JP | 63-034795 | 2/1988 |
| JP | 63-091766 | 4/1988 |
| JP | 63-217452 | 9/1988 |
| JP | 63-239676 | 10/1988 |
| JP | 01-236494 | 9/1989 |

OTHER PUBLICATIONS

Shiratake, S. et al, "A Pseudo Multi-Bank DRAM with Categorized Access Sequence", Symposium on VLSI Circuits, Jun. 17-19, 1999 pp. 127-130.*

"Architectural Overview," Rambus Inc., 1992, p. 1-24.

Gillingham, Peter, "SLDRAM Architectural and Functional Overview", SLDRAM Consortium, Aug. 29, 1997.

Gillingham, Peter and Vogley, Bill, "SLDRAM: High-Performance, Open-Standard Memory", *IEEE Micro*, v.17, n.6, pp. 29-30, Nov. 1997.

Kristiansen, E.H., Alnes, Knut, Bakka, Bjorn O, and Jenssen, Mant, "Scalable Coherent Interface", Eurobus Conference Proceedings, May 1989.

MoSys, Inc., MD904 to MD920, ½ to 2 ½ MByte Multibank DRAM (MDRAM9®) 128K×32 to 656K×32 Preliminary Information, 1996.

"MT4LC4M4E9 (S) 4 MEG×DRAM," Micron Semiconductor, Inc., 1994, pp. 1-183/1-196.

"M5M4V16807ATP-10, 12-, -15 Target Spec. (Rev p.3)," Mitsubishi Electric, May 7, 2003, pp. 1-36.

Pryzbylski, S.A., "New DRAM Technologies, A Comprehensive Analysis of the New Architectures," pp. iii-iv, 19-21, 38-58, 77-203 (MicroDesign Resource 1994).

Rambus Inc, 16/18Mbit (2M×8/9) & 64/72Mbit (8M×8/9) Concurrent RDRAM Data Sheet, Jul. 1996.

Rambus Inc, 8/9-Mbit (1M×8/9) and 16/18 (2M×8/9) RDRAM Data Sheet, Mar. 1996.

SLDRAM Inc., "400 Mb/s/pin SLDRAM", Jul. 9, 1998.

TMS626402, "2097 152?Word by Bank Synchronous Dynamic Random?Access Memory," Texas Instruments, 1994, pp. 5?3?3?23.

* cited by examiner

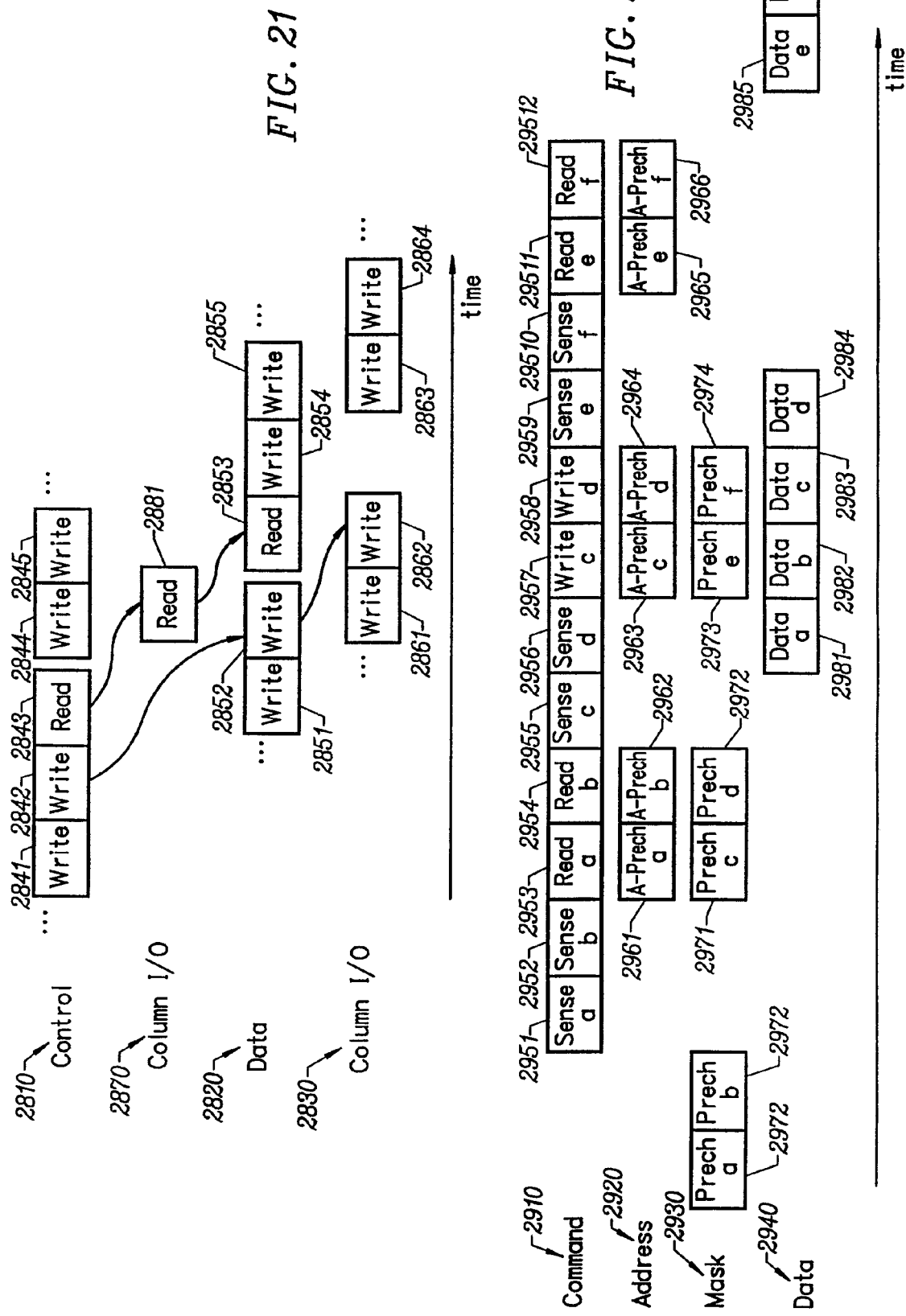

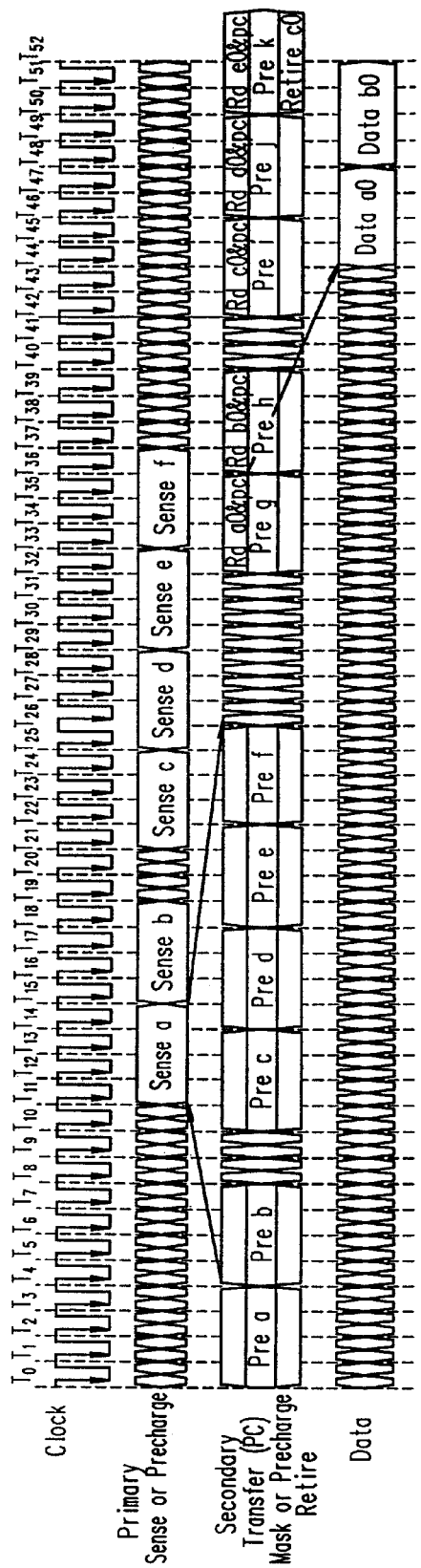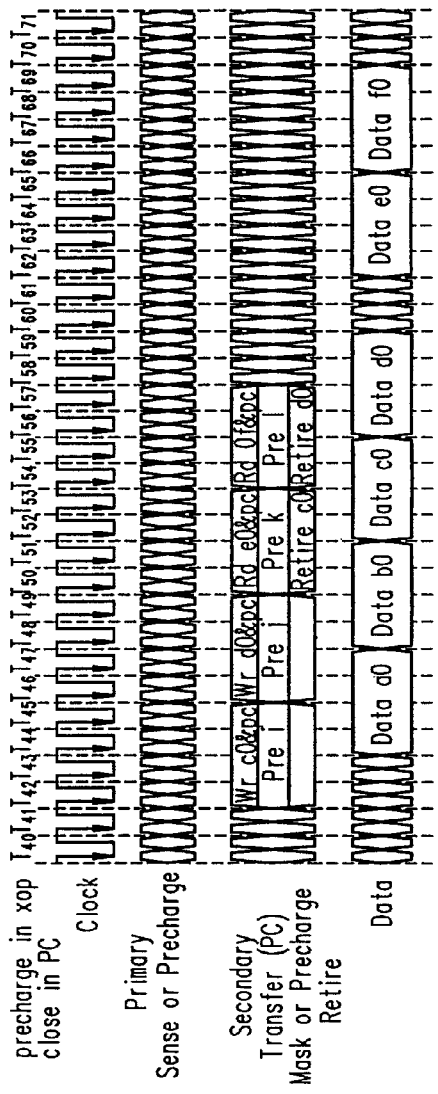
FIG. 40

INTEGRATED CIRCUIT MEMORY DEVICE HAVING DELAYED WRITE CAPABILITY

This application is a continuation of U.S. patent application Ser. No. 11/059,216, filed Feb. 15, 2005, now U.S. Pat. No. 7,197,611, which is a continuation of U.S. patent application Ser. No. 10/128,167, filed Apr. 22, 2002, now U.S. Pat. No. 6,868,474, which is a divisional of U.S. patent application Ser. No. 09/169,206, filed Oct. 9, 1998, now U.S. Pat. No. 6,401,167, which claims priority to U.S. Provisional Patent Application No. 60/061,770, filed Oct. 10, 1997, all of which are herein incorporated by referenced in their entirety.

BACKGROUND OF THE INVENTION

1. Field of the Invention

The present invention relates generally to electronic systems for data storage and retrieval. More particularly, the invention is directed toward improved methods and structures for memory devices.

2. Description of the Related Art

In any engineered design there are compromises between cost and performance. The present invention introduces novel methods and structures for reducing the cost of memory devices while minimally compromising their performance. The description of the invention requires a significant amount of background including: application requirements, memory device physical construction, and memory device logical operation.

Memory device application requirements can be most easily understood with respect to memory device operation. FIG. 1 shows the general organization of a memory device. Memory device 101 consists of a core 102 and an interface 103. The core is responsible for storage of the information. The interface is responsible for translating the external signaling used by the interconnect 105 to the internal signaling carried on bus 104. The primitive operations of the core include at least a read operation. Generally, there are other operations required to manage the state of the core 102. For example, a conventional dynamic random access memory (DRAM) has at least write, precharge, and sense operations in addition to the read operation.

For purposes of illustrating the invention a conventional DRAM core will be described. FIG. 2 is a block diagram of a conventional DRAM core 102. Since the structure and operation of a conventional DRAM core is well known in the art only a brief overview is presented here.

A conventional DRAM core 202 mainly comprises storage banks 211 and 221, row decoder and control circuitry 210, and column data path circuit comprising column amplifiers 260 and column decoder and control circuitry 230. Each of the storage banks comprises storage arrays 213 and 223 and sense amplifiers 212 and 222.

There may be many banks, rather than just the two illustrated. Physically the row and column decoders may be replicated in order to form the logical decoder shown in FIG. 2. The column i/o lines 245 may be either bidirectional, as shown, or unidirectional, in which case separate column i/o lines are provided for read and write operations.

The operation of a conventional DRAM core is divided between row and column operations. Row operations control the storage array word lines 241 and the sense amplifiers via line 242. These operations control the movement of data from the selected row of the selected storage array to the selected sense amplifier via the bit lines 251 and 252. Column operations control the movement of data from the selected sense amplifiers to and from the external data connections 204d and 204e.

Device selection is generally accomplished by one of the following choices:
- matching an externally presented device address against an internally stored device address;
- requiring separate operation control lines, such as RAS and CAS, for each set of memory devices that are to be operated in parallel; and
- providing at least one chip select control on the memory device.

FIG. 3 illustrates the timing required to perform the row operations of precharge and sense. In their abstract form these operations can be defined as
- precharge(device, bank)—prepare the selected bank of the selected device for sensing; and
- sense(device, bank, row)—sense the selected row of the selected bank of the selected device.

The operations and device selection arguments are presented to the core via the PRECH and SENSE timing signals while the remaining arguments are presented as signals which have setup and hold relationships to the timing signals. Specifically, as shown in FIGS. 2-4, PRECH and PRECHBANK form signals on line 204a in which PRECHBANK presents the "bank" argument of the precharge operation, while SENSE, SENSEBANK and SENSEROW form signals on line 204b in which SENSEBANK and SENSEROW present the "bank" and "row" arguments, respectively, for the sense operation. Each of the key primary row timing parameters, $t_{RP}$, $t_{RAS,min}$, and $t_{RCD}$ can have significant variations between devices using the same design and across different designs using the same architecture.

FIG. 5 and FIG. 6 illustrate the timing requirements of the read and write operations, respectively. These operations can be defined abstractly as:
- data=read (device, bank, column)—transfer the data in the subset of the sense amplifiers specified by "column" in the selected "bank" of the selected "device" to the READDATA lines; and
- write (device, bank, column, mask, data)—store the data presented on the WRITEDATA lines into the subset of the sense amplifiers specified by "column" in the selected "bank" of the selected "device"; optionally store only a portion of the information as specified by "mask".

More recent conventional DRAM cores allow a certain amount of concurrent operation between the functional blocks of the core. For example, it is possible to independently operate the precharge and sense operations or to operate the column path simultaneously with row operations. To take advantage of this concurrency each of the following groups may operate somewhat independently:
- PRECH and PRECHBANK on lines 204a;
- SENSE, SENSEBANK, and SENSEROW on lines 204b;
- COLCYC 204f on line, COLLAT and COLADDR on lines 204g, WRITE and WMASK one lines 204c, READDATA on line 204d, and WRITEDATA on line 204.

There are some restrictions on this independence. For example, as shown in FIG. 3, operations on the same bank observe the timing restrictions of $t_{RP}$ and $t_{RAS,min}$. If accesses are to different banks, then the restrictions of FIG. 4 for $t_{SS}$ and $t_{PP}$ may have to be observed.

The present invention, while not limited by such values, has been optimized to typical values as shown in Table 1.

TABLE 1

Typical Core Timing Values

| Symbol | Value (ns) |
|---|---|
| $t_{RP}$ | 20 |
| $t_{RAS,Min}$ | 50 |
| $t_{RCD}$ | 20 |
| $t_{PP}$ | 20 |
| $t_{SS}$ | 20 |
| $t_{PC}$ | 10 |
| $t_{DAC}$ | 7 |

FIG. 7 shows the permissible sequence of operations for a single bank of a conventional DRAM core. It shows the precharge 720, sense 721, read 722, and write 723, operations as nodes in a graph. Each directed arc between operations indicates an operation which may follow. For example, arc 701 indicates that a precharge operation may follow a read operation.

The series of memory operations needed to satisfy any application request can be covered by the nominal and transitional operation sequences described in Table 2 and Table 3. These sequences are characterized by the initial and final bank states as shown in FIG. 8.

The sequence of memory operations is relatively limited. In particular, there is a universal sequence:

precharge, sense, transfer (read or write), and close.

In this sequence, close is an alternative timing of precharge but is otherwise functionally identical. This universal sequence allows any sequence of operations needed by an application to be performed in one pass through it without repeating any step in that sequence. A control mechanism that implements the universal sequence can be said to be conflict free. A conflict free control mechanism permits a new application reference to be started for every minimum data transfer. That is, the control mechanism itself will never introduce a resource restriction that stalls the memory requestor. There may be other reasons to stall the memory requester, for example references to different rows of the same bank may introduce bank contention, but lack of control resources will not be a reason for stalling the memory requestor

TABLE 2

Nominal Transactions

| Initial Bank State | Final Bank State | Transaction Type | Operations Performed |
|---|---|---|---|
| closed | closed | empty | sense, series of column operations, precharge |
| open | open | miss | precharge, sense, series of column operations |
| | | hit | series of column operations |

TABLE 3

Transitional Transactions

| Initial Bank State | Final Bank State | Transaction Type | Operations Performed |
|---|---|---|---|
| closed | open | empty | sense, <series of column operations>(optional) |
| open | closed | miss | <precharge, sense, series of column operations>(optional), precharge |
| | | hit | <series of column operations> (optional), precharge |

Memory applications may be categorized as follows:

main memory—references generated by a processor, typically with several levels of caches;

graphics—references generated by rendering and display refresh engines; and unified—combining the reference streams of main memory and graphics.

Applications may also be categorized by their reference stream characteristics. According to the application partition mentioned above reference streams can be characterized in the following fashion:

First, main memory traffic can be cached or uncached processor references. Such traffic is latency sensitive since typically a processor will stall when it gets a cache miss or for any other reason needs data fetched from main memory. Addressing granularity requirements are set by the transfer size of the processor cache which connects to main memory. A typical value for the cache transfer size is 32 bytes. Since multiple memory interfaces may run in parallel it is desirable that the memory system perform well for transfer sizes smaller than this. Main memory traffic is generally not masked; that is, the vast bulk of its references are cache replacements which need not be written at any finer granularity than the cache transfer size.

Another type of reference stream is for graphics memory. Graphics memory traffic tends to be bandwidth sensitive rather than latency sensitive. This is true because the two basic graphics engines, rendering and display refresh, can both be highly pipelined. Latency is still important since longer latency requires larger buffers in the controller and causes other second order problems. The ability to address small quanta of information is important since typical graphics data structures are manipulated according to the size of the triangle being rendered, which can be quite small. If small quanta cannot be accessed then bandwidth will be wasted transferring information which is not actually used. Traditional graphics rendering algorithms benefit substantially from the ability to mask write data; that is, to merge data sent to the memory with data already in the memory. Typically this is done at the byte level, although finer level, e.g. bit level, masking can sometimes be advantageous.

As stated above, unified applications combine the characteristics of main memory and graphics memory traffic. As electronic systems achieve higher and higher levels of integration the ability to handle these combined reference streams becomes more and more important.

Although the present invention can be understood in light of the previous application classification, it will be appreciated by those skilled in the art that the invention is not limited to the mentioned applications and combinations but has far wider application. In addition to the specific performance and functionality characteristics mentioned above it is generally important to maximize the effective bandwidth of the memory system and minimize the service time. Maximizing effective bandwidth requires achieving a proper balance between control and data transport bandwidth. The control bandwidth is generally dominated by the addressing information delivered to the memory device. The service time is the amount of time required to satisfy a request once it is presented to the memory system. Latency is the service time of a request when the memory system is otherwise devoid of traffic. Resource conflicts, either for the interconnect between the requester and the memory devices, or for resources internal to the memory devices such as the banks, generally determine the difference between latency and service time. It is desirable to minimize average service time, especially for processor traffic.

The previous section introduced the performance aspects of the cost-performance tradeoff that is the subject of the present invention. In this section the cost aspects are discussed. These aspects generally result from the physical construction of a memory device, including the packaging of the device.

FIG. 9 shows the die of a memory device 1601 inside of a package 1620. For typical present day device packages, the bond pads, such as 1610, have center to center spacing significantly less than the pins of the device, such as 1640. This requires that there be some fan-in from the external pins to the internal bonding pads. As the number of pads increases the length of the package wiring, such as 1630, grows. Observe that elements 1630 and 1640 are alternately used to designate package wiring.

There are many negative aspects to the increase in the length of the package wiring 1640, including the facts that: the overall size of the package increases, which costs more to produce and requires more area and volume when the package is installed in the next level of the packaging hierarchy, such as on a printed circuit board. Also, the stub created by the longer package wiring can affect the speed of the interconnect. In addition, mismatch in package wiring lengths due to the fan-in angle can affect the speed of the interconnect due to mismatched parasitics.

The total number of signal pins has effects throughout the packaging hierarchy. For example, the memory device package requires more material, the next level of interconnect, such as a printed circuit board, requires more area, if connectors are used they will be more expensive, and the package and die area of the master device will grow.

In addition to all these cost concerns based on area and volume of the physical construction another cost concern is power. Each signal pin, especially high speed signal pins, requires additional power to run the transmitters and receivers in both the memory devices as well as the master device. Added power translates to added cost since the power is supplied and then dissipated with heat sinks.

The memory device illustrated in FIG. 10 uses techniques typical of present day memory devices. In this device 1701, a single shared command bus 1710 in conjunction with the single address bus 1720 and mask bus 1730 is used to specify all of the primitive operations comprising precharge, sense, read, and write in addition to any other overhead operations such as power management.

FIG. 11 illustrates the operation of the memory device of FIG. 10. The illustrated reference sequence, when classified according to Table 2 and the universal sequence previously described comprises:
write empty—sense 1851, write 1853 with mask 1871, data 1881, close(precharge) 1861;
write miss—precharge 1852, sense 1854, write 1856 with mask 1872, data 1882;
read hit—read 1857, tristate control 1873, data 1883; and
transitional write miss—precharge 1855, sense 1858, write 1859, mask 1874, data 1884, close (precharge) 1862.

In FIG. 11 each box represents the amount of time required to transfer one bit of information across a pin of the device.

In addition to illustrating a specific type of prior art memory device, FIG. 11 can be used to illustrate a number of techniques for specifying data transfers. One prior art technique uses an internal register to specify the number of data packets transferred for each read or write operation. When this register is set to its minimum value and the reference is anything besides a hit then the device has insufficient control bandwidth to specify all the required operations while simultaneously keeping the data pins highly utilized. This is shown in FIG. 11 by the gaps between data transfers. For example there is a gap between data a, 1881 and data b, 1882. Even if sufficient control bandwidth were provided some prior art devices would also require modifications to their memory cores in order to support high data pin utilization.

The technique of specifying the burst size in a register makes it difficult to mix transfer sizes unless the burst size is always programmed to be the minimum, which then increases control overhead. The increase in control overhead may be so substantial as to render the minimum burst size impractical in many system designs.

Regardless of the transfer burst size, the technique of a single unified control bus, using various combinations of the command pins 1810, address pins 1820, and mask pins 1830 places limitations on the ability to schedule the primitive operations. A controller which has references in progress that are simultaneously ready to use the control resources must sequentialize them, leading to otherwise unnecessary delay.

Read operations do not require masking information. This leaves the mask pins 1830 available for other functions. Alternately, the mask pins during read operations may specify which bytes should actually be driven across the pins as illustrated by box 1873.

Another technique is an alternative method of specifying that a precharge should occur by linking it to a read or write operation. When this is done the address components of the precharge operation need not be respecified; instead, a single bit can be used to specify that the precharge should occur. One prior art method of coding this bit is to share an address bit not otherwise needed during a read or write operation. This is illustrated by the "A-Prech" boxes, 1861 and 1862.

FIG. 12 shows a sequence of four read references each comprising all the steps of the universal sequence. Although the nominal transactions of Table 2 do not require the multiple precharge steps of the universal sequence it is useful to examine how well a device handles the universal sequence in order to understand its ability to support mixed empty and miss nominal transactions, as well as the transitional transactions of Table 3. As can be seen, the data pins are poorly utilized. This indicates that control contention will limit the ability of the device to transfer data for various mixes of application references. The utilization of the data pins could be improved by making the burst length longer. However, the applications, such as graphics applications, require small length transfers rather than large ones.

Another technique makes the delay from write control information to data transfer different from the delay of read control information to data transfer. When writes and reads are mixed, this leads to difficulties in fully utilizing the data pins.

Thus, current memory devices have inadequate control bandwidth for many application reference sequences. Current memory devices are unable to handle minimum size transfers. Further, current memory devices utilize the available control bandwidth in ways that do not support efficient applications. Current memory devices do not schedule the use of the data pins in an efficient manner. In addition, current memory devices inefficiently assign a bonding pad for every pin of the device.

BRIEF DESCRIPTION OF THE DRAWINGS

FIG. 21 illustrates mixed read and write timing in accordance with an embodiment of the invention.

FIG. 22 illustrates a unified control universal read and write sequence with mask precharge and delayed write in accordance with the invention.

FIG. 40 illustrates reads or unmasked writes in accordance with an embodiment of the invention.

Like reference numerals refer to corresponding parts throughout the drawings.

DESCRIPTION OF EMBODIMENTS

Figure 12:
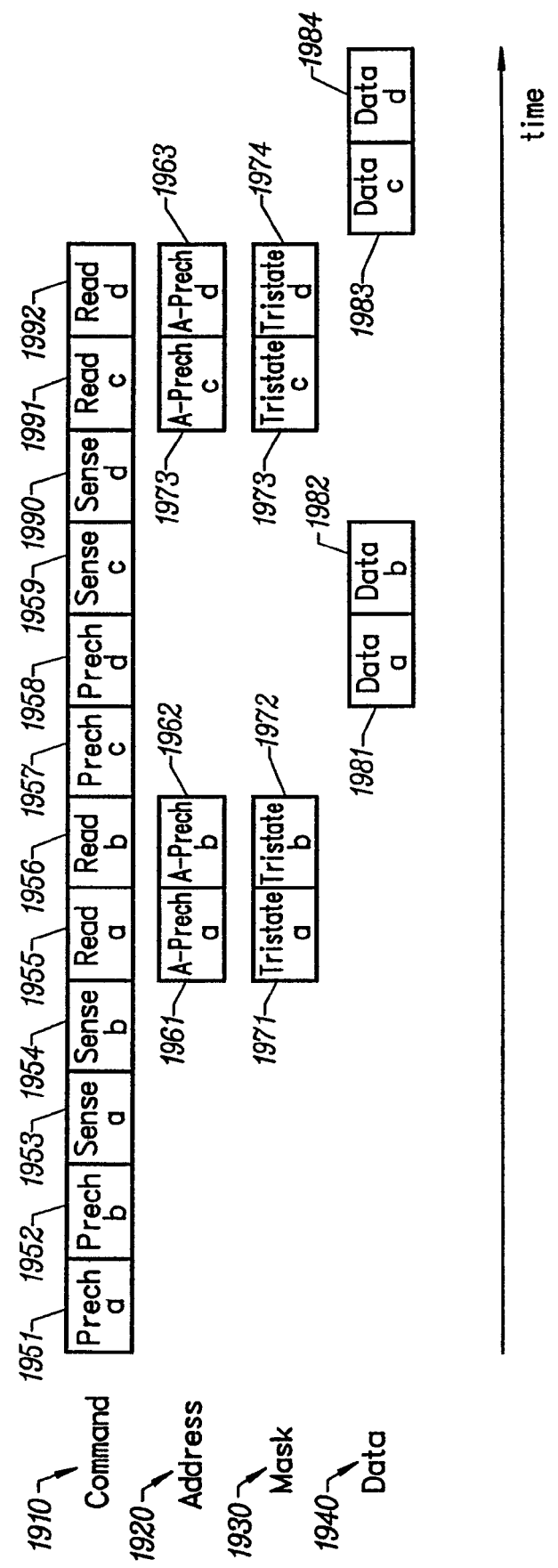
FIG. 12 illustrates a unified control universal read sequence in accordance with an embodiment of the invention.
Figure 13:
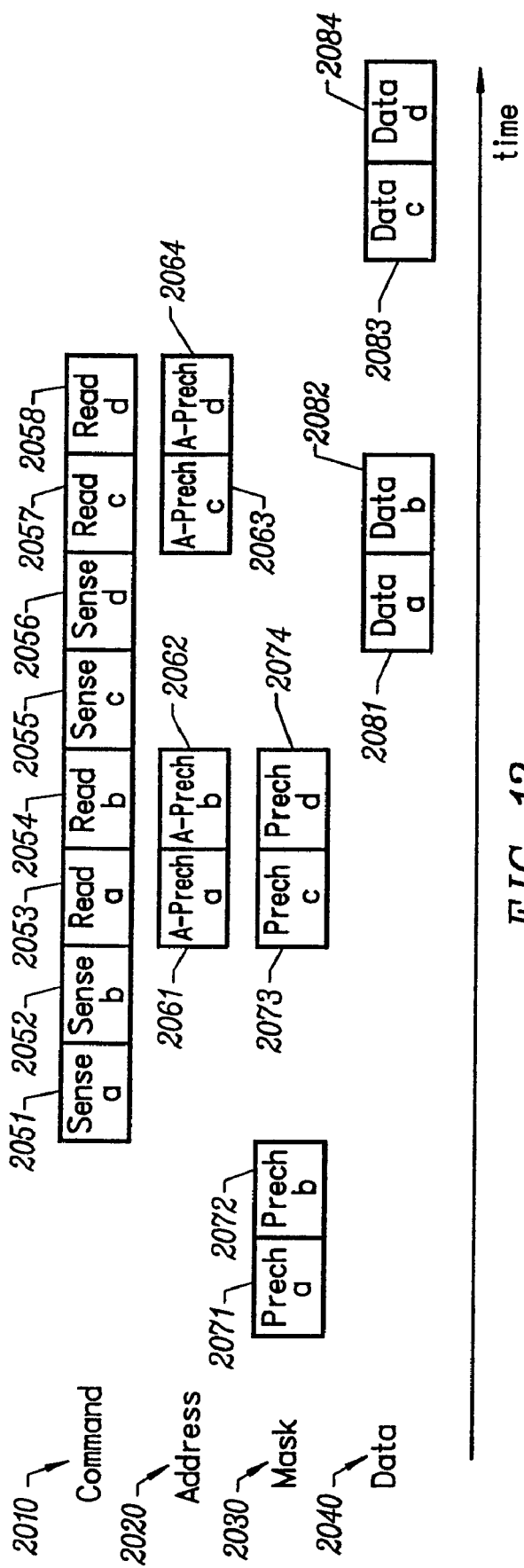
FIG. 13 illustrates a unified control universal read sequence with mask precharge in accordance with an embodiment of the invention.

FIG. 13 shows a timing diagram according to an embodiment of the present invention in which the Mask pins 2030 carry a precharge specification rather than either the write mask information or the tristate control information, as shown in connection with FIG. 12. This use of the Mask pins need not be exclusive. There are multiple ways in which to indicate how the information presented on the Mask pins is to be used. For example:

- in one embodiment according to the present invention, a register within the device specifies whether the mask pins are to be used for masking, tristate control, or precharge control;
- in another embodiment according to the present invention, the encoding of the command pins is extended to specify, on a per operation basis, how the mask pins are to be used; and
- in another embodiment according to the present invention, a register bit indicates whether tristate control is enabled or not and, in the case it is not enabled, an encoding of the command pins indicates if a write is masked or not; in this embodiment all reads and unmasked writes may use the Mask pins to specify a precharge operation while masked writes do not have this capability since the Mask pins are used for mask information There are many alternatives for how to code the precharge information on the mask pins. In one embodiment in which there are two mask pins and the memory device has two banks, one pin indicates whether an operation should occur and the other pin indicates which bank to precharge. In an alternative embodiment, in which the minimum data transfer requires more than one cycle, more banks are addressed by using the same pins for more than one cycle to extend the size of the bank address field.

Using the mask pins to specify a precharge operation and the associated bank address requires another way of specifying the device argument. In one embodiment the device is specified in some other operation. For example, the precharge specified by the mask pins shares device selection with a chip select pin that also conditions the main command pins. In another embodiment, additional control bandwidth is added to the device. For example, an additional chip select pin is added for sole use by the recoded mask pin precharge. In yet another example of using additional control bandwidth in which the minimum data transfer requires more than one cycle, the device address is coded on the additional bits, the device address being compared to an internal device address register.

In FIG. 13 it can be seen that the data pins are better utilized. For example, the offset between data block 1982 and 1983 in FIG. 12 is reduced from 4 units of time to the 2 units of time between data blocks 2082 and 2083 of FIG. 13. This is accomplished because the precharge specification has been moved from the primary command pins, 2010, to the mask pins 2030 so there is more time available on the command pins to specify the sense and read or write operations.

Delaying Write Data

Figure 14:
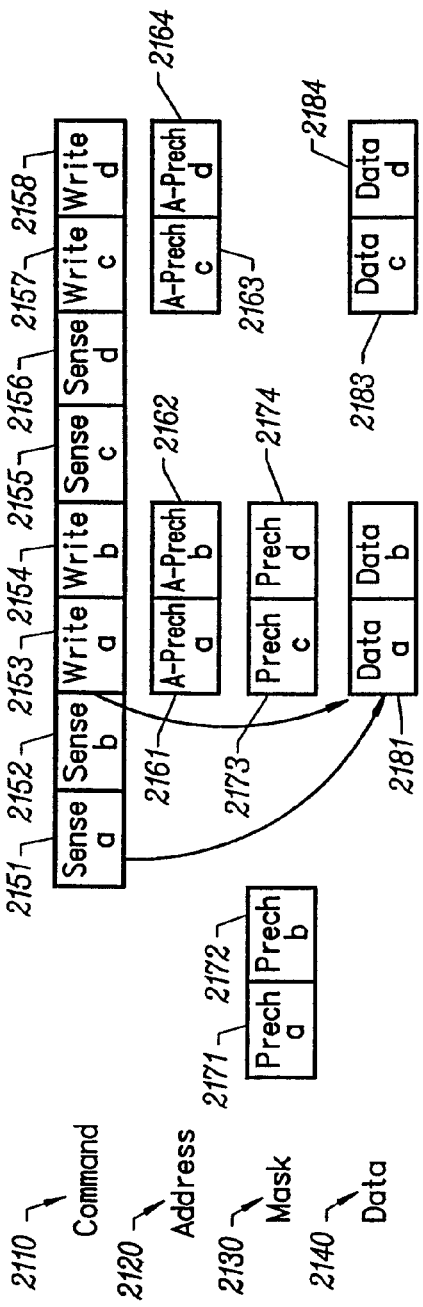
FIG. 14 illustrates a unified control universal write sequence with mask precharge in accordance with an embodiment of the invention.
Figure 15:
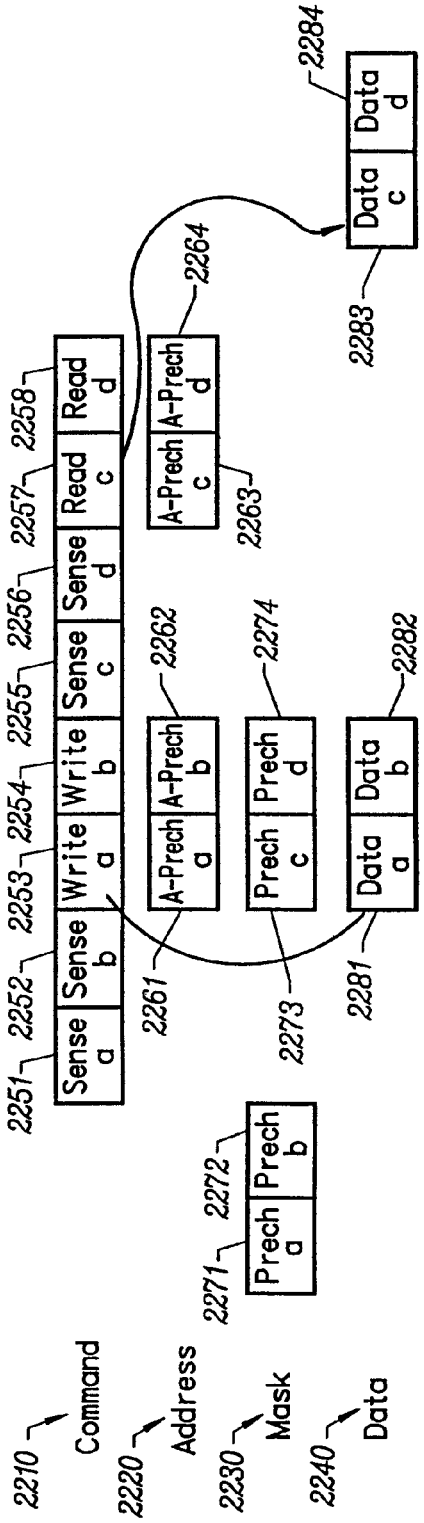
FIG. 15 illustrates a unified control universal read write sequence with mask precharge in accordance with an embodiment of the invention.

FIG. 14 shows the timing of the universal write sequence in an embodiment according to the present invention, when the Mask pins are used for the precharge step. The offset from data block 2182 to data block 2183 is two units of time just as in the read sequence shown in FIG. 13. However, the offset from the use of the command pins to the use of the data pins is shown as zero for the write case but three for the read case. As can be seen in FIG. 15, when these sequences are combined to produce a sequence that has both reads and writes, there is a substantial gap between the write data and the read data as can be seen by the delay between data 2282 and data 2283. Delaying the write data so that the offset from control information to data is the same, independent of whether the transfer is a read or a write, reduces or eliminates the delay.

Figure 1:
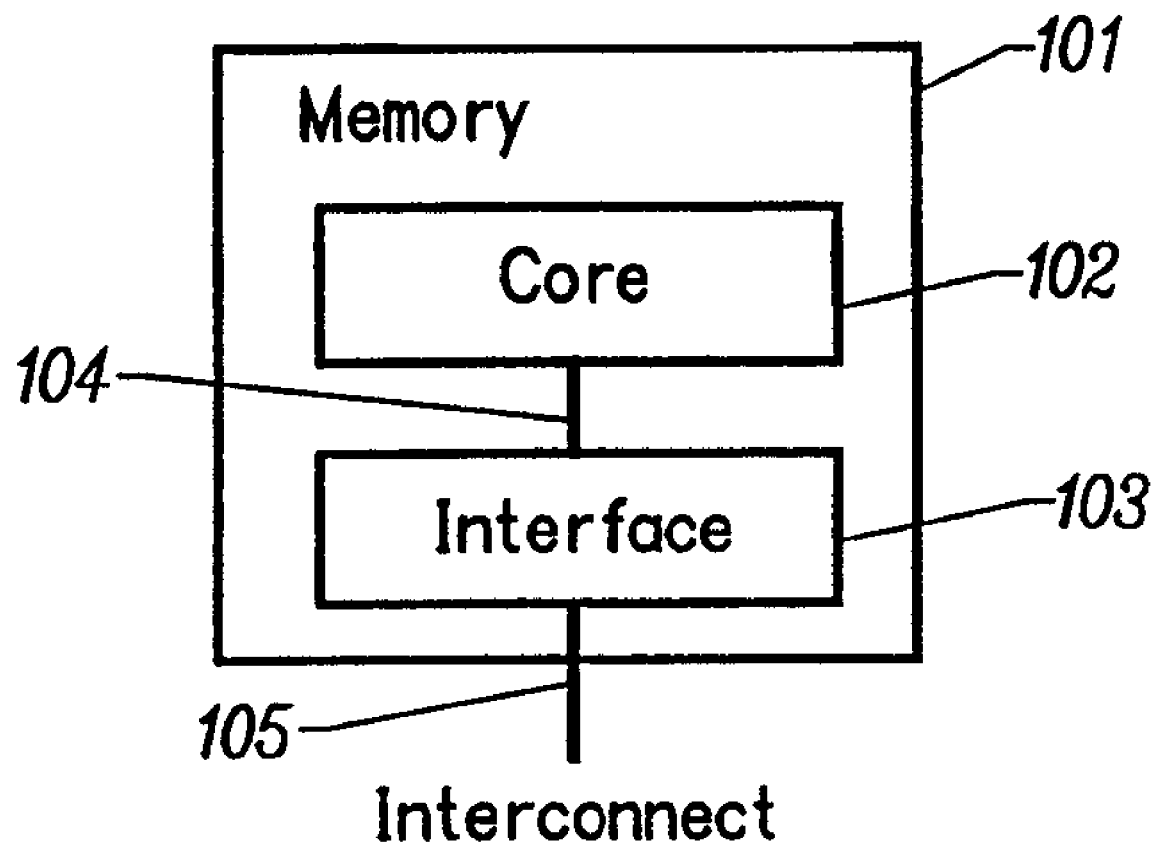
FIG. 1 illustrates a known memory structure architecture.
Figure 2:
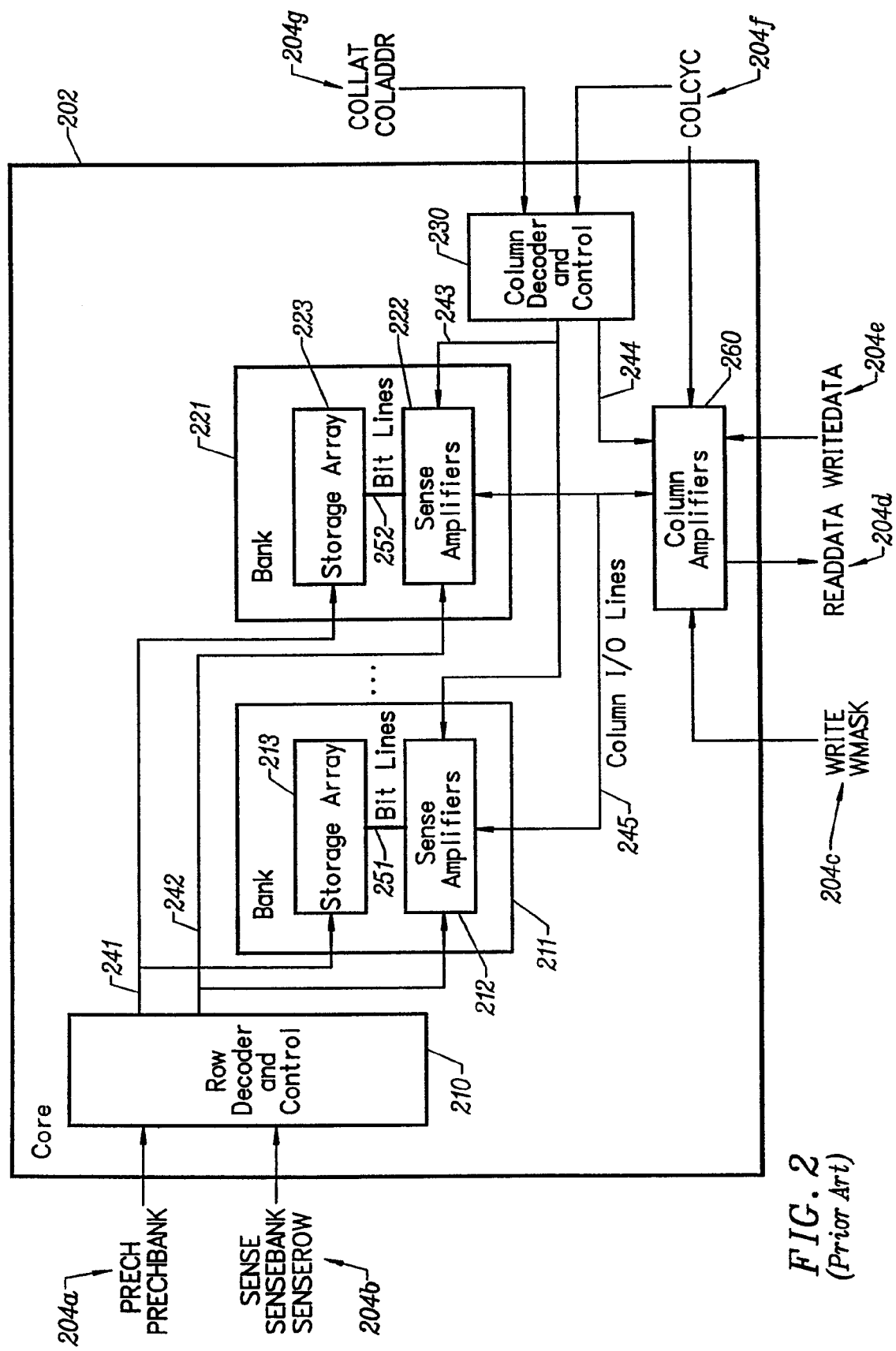
FIG. 2 illustrates a known DRAM core structure.
Figure 3:
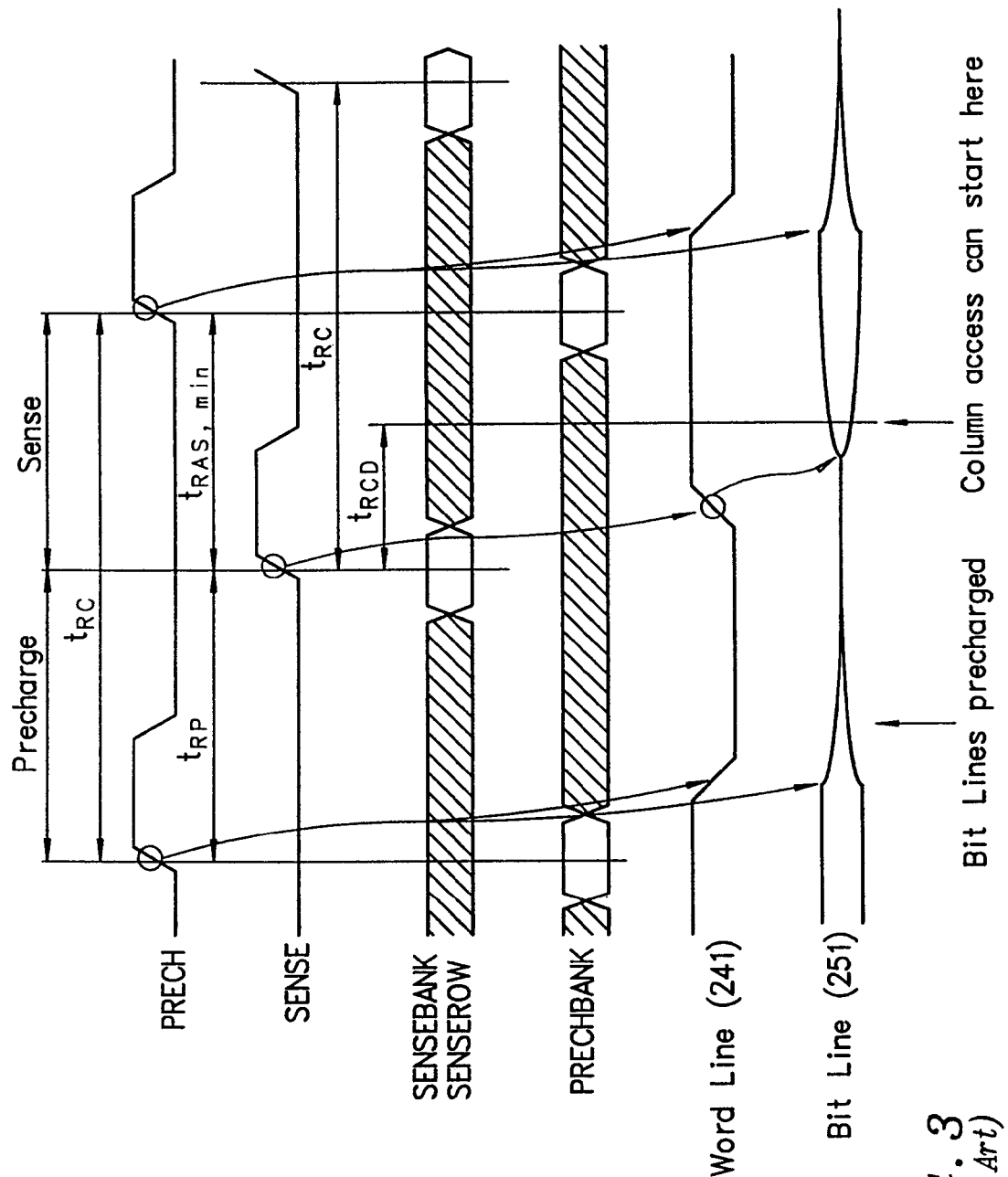
FIG. 3 illustrates Row Access Timing to a single bank in accordance with the prior art.
Figure 4:
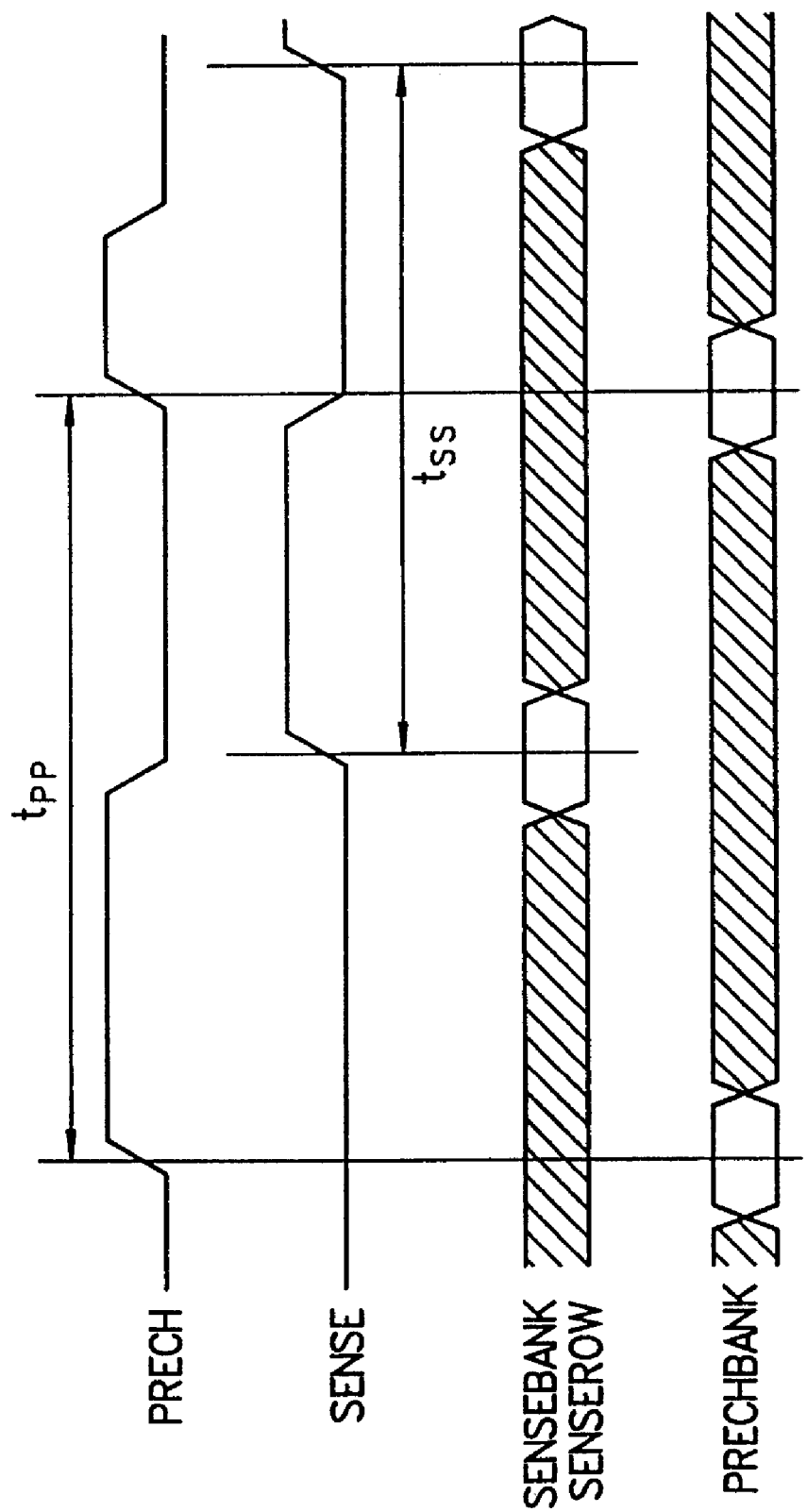
FIG. 4 illustrates Row Access Timing to different banks in accordance with the prior art.
Figure 5:
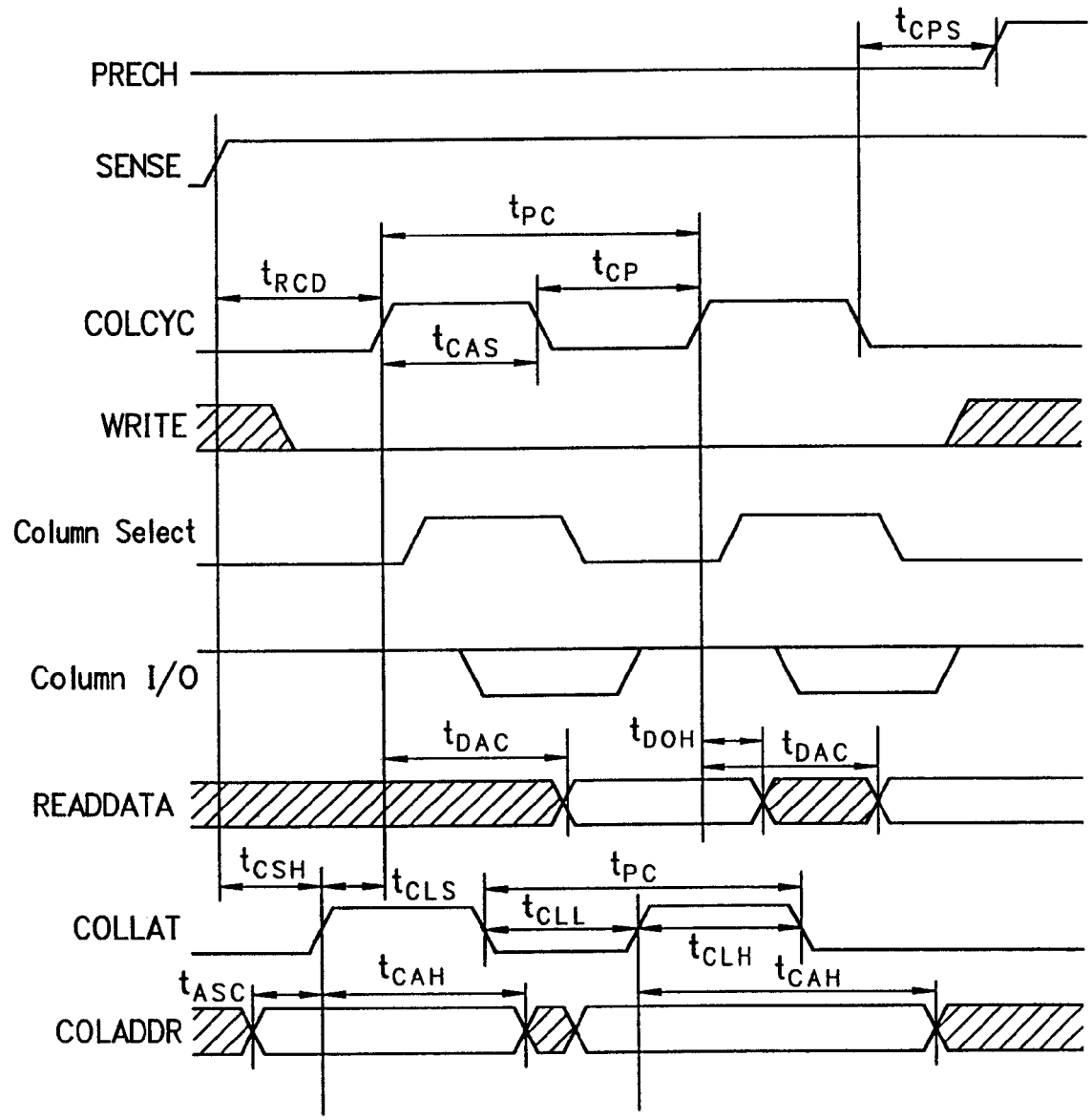
FIG. 5 illustrates Column Read Timing in accordance with the prior art.
Figure 6:
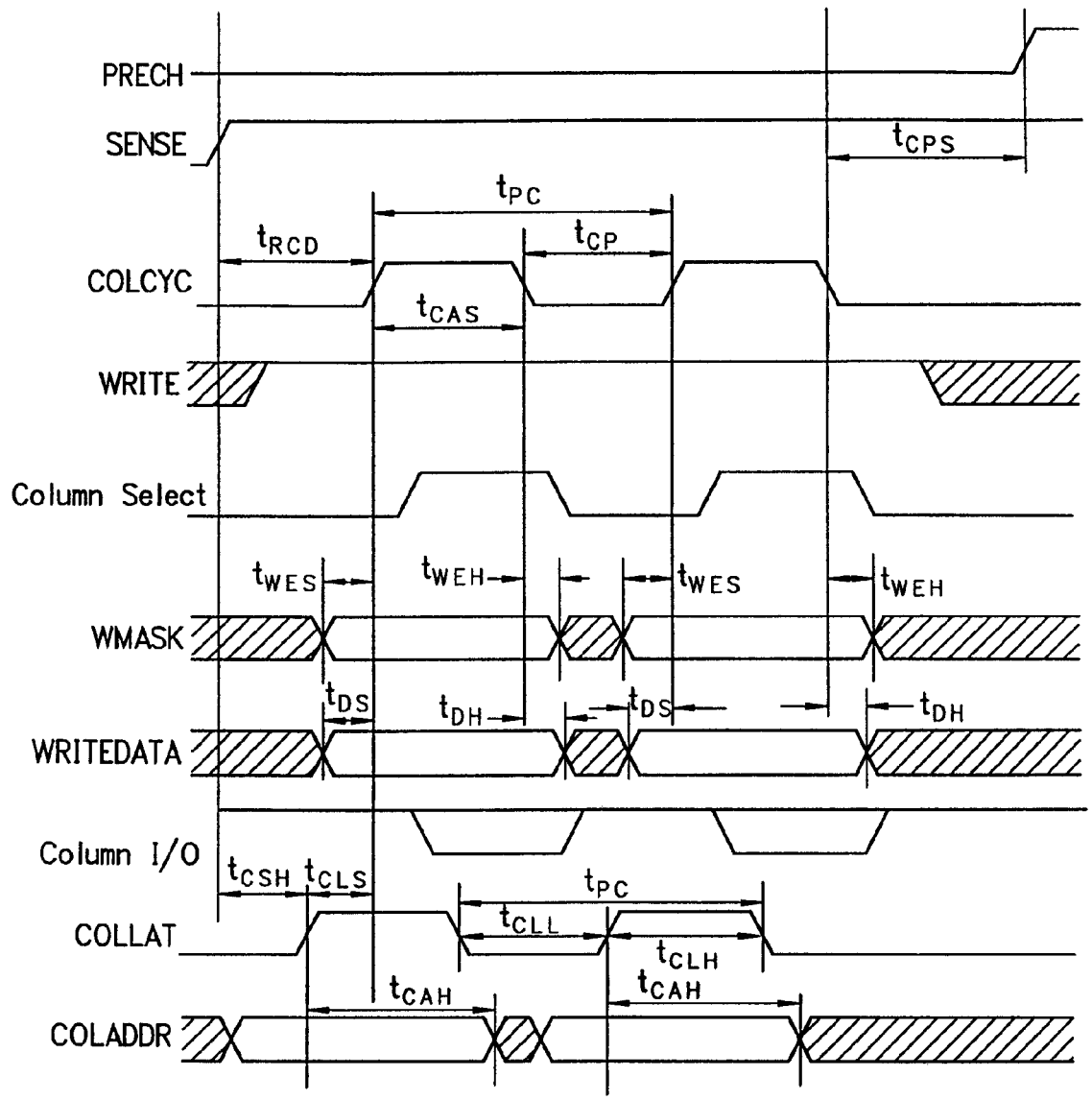
FIG. 6 illustrates Column Write Timing in accordance with the prior art.
Figure 7:
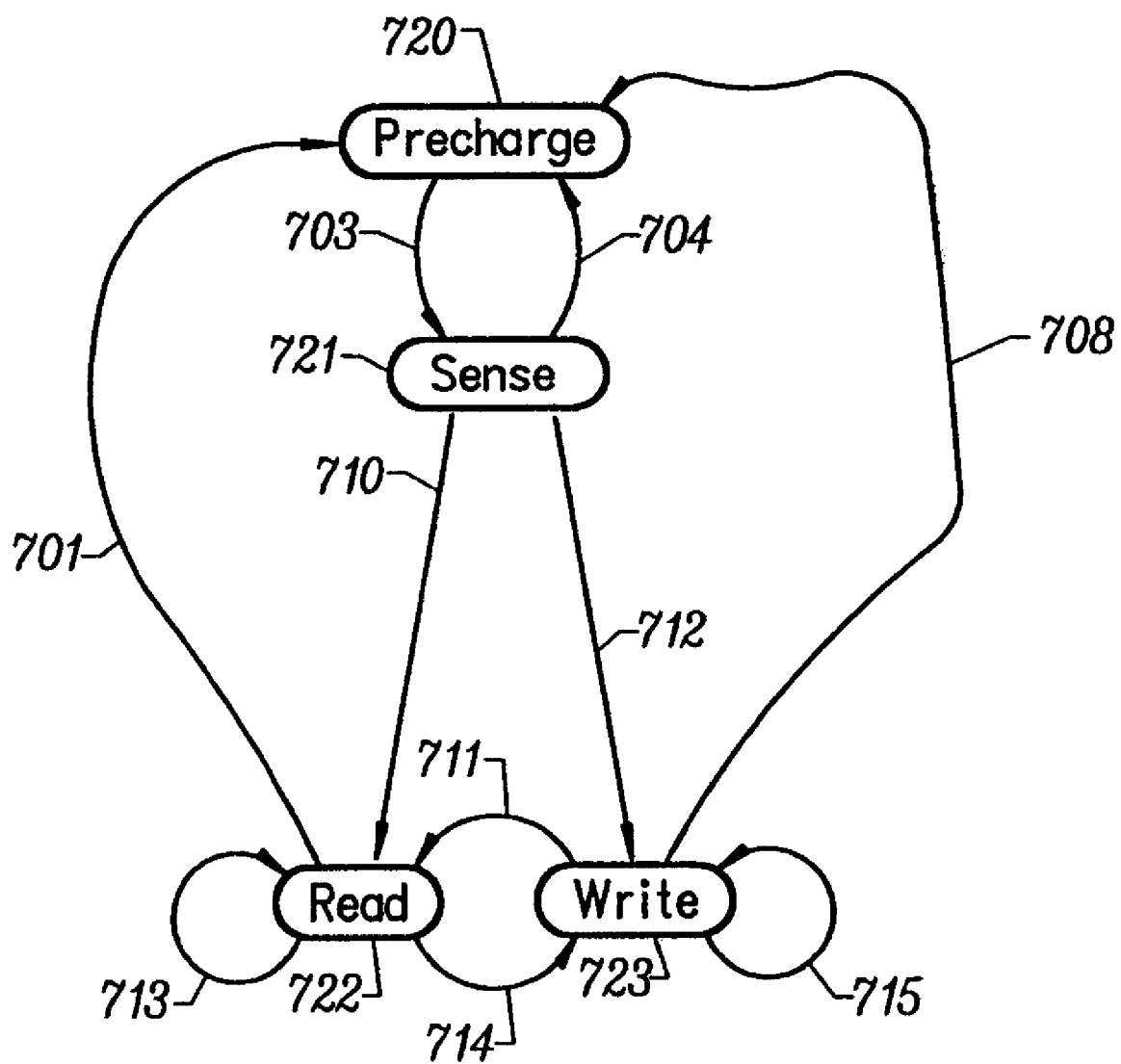
FIG. 7 illustrates operation sequences for a conventional core DRAM.
Figure 8:
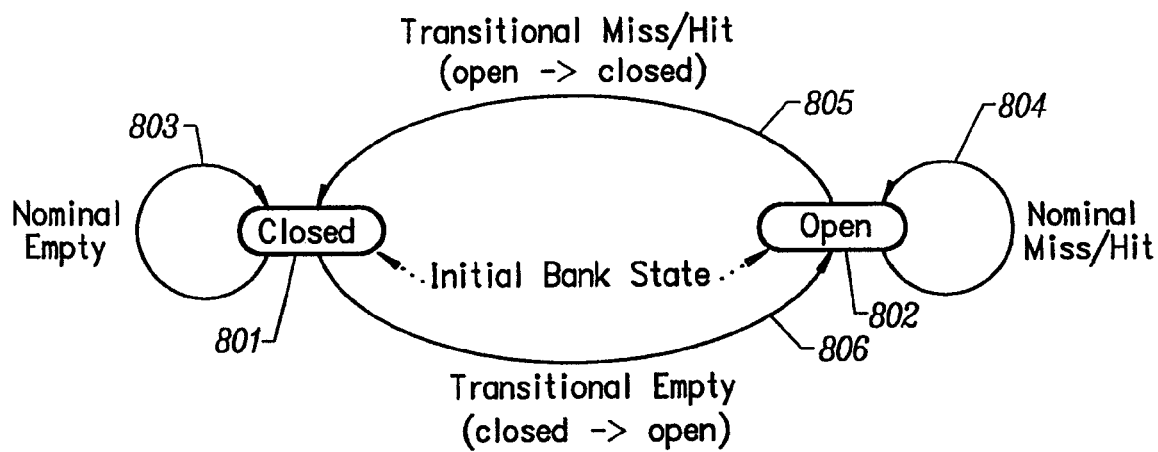
FIG. 8 illustrates initial and final bank states associated with a memory operation in accordance with the prior art.
Figure 9:
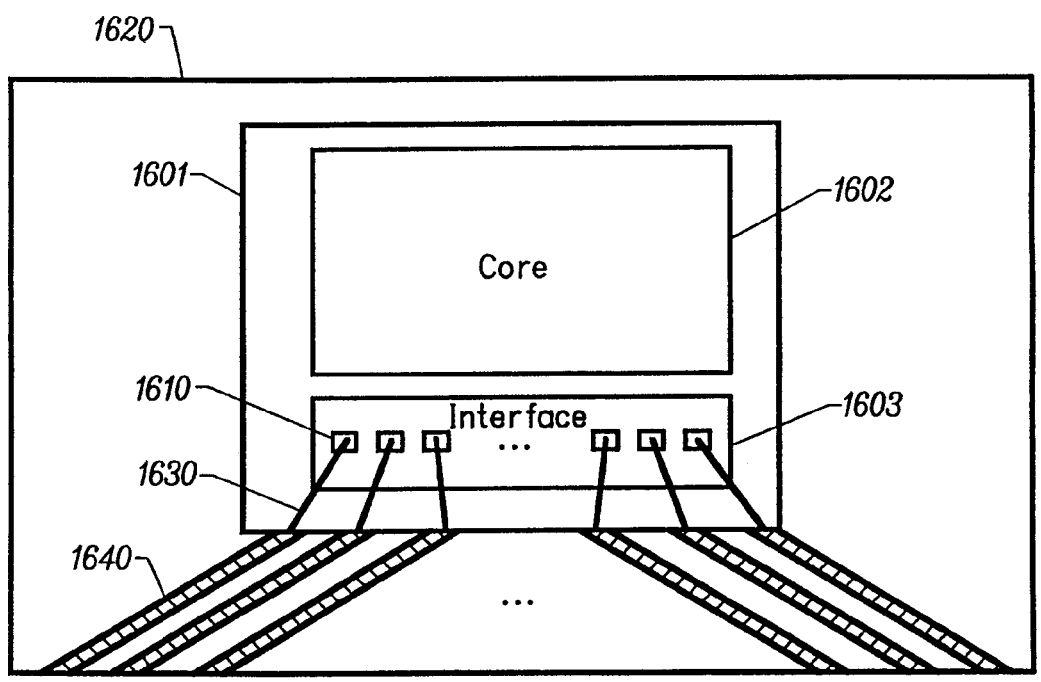
FIG. 9 illustrates a semiconductor packaging structure utilized in accordance with the prior art.
Figure 10:
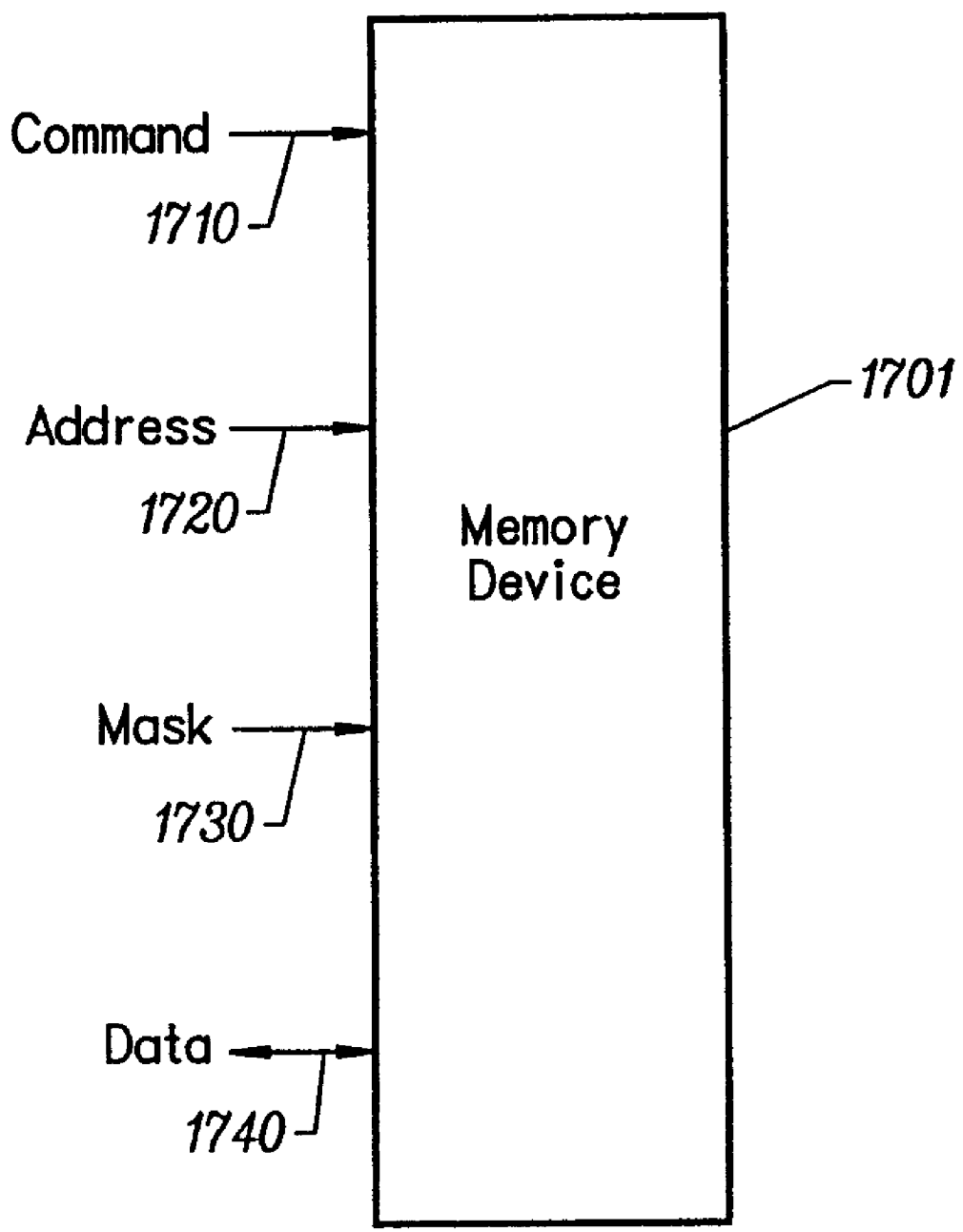
FIG. 10 illustrates DRAM interface signals in accordance with the prior art.
Figure 11:
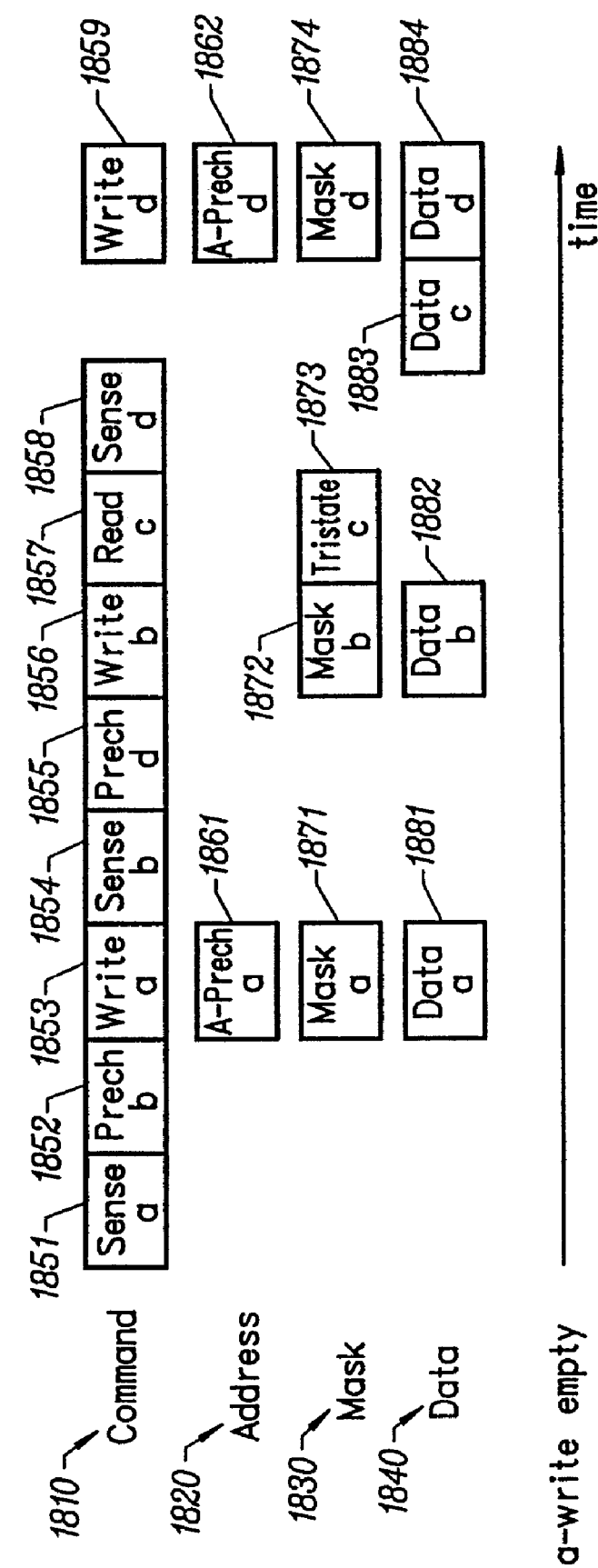
FIG. 11 illustrates a command control sequence in accordance with the prior art.
Figure 16:
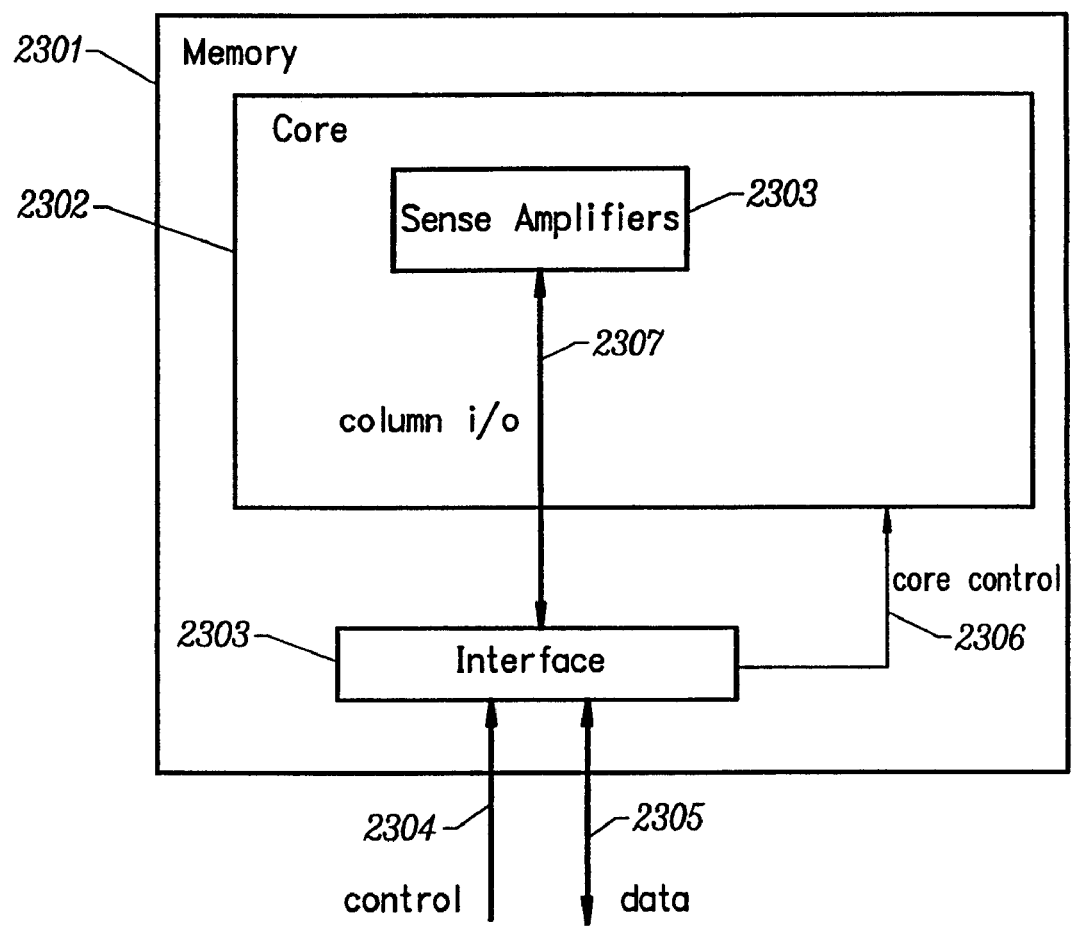
FIG. 16 illustrates a column access block diagram with no delayed write in accordance with an embodiment of the invention.

FIG. 16 shows the column access path of a memory device in an embodiment of the invention that does not delay write data with respect to read data. In FIG. 16, the delay from external control 2304 to internal column control 2306 is identical whether the access is a read or a write. As can be seen from FIG. 5 and FIG. 6, this means that the external data interconnect 2305 provides the data to the core prior to the write, while the external data interconnect is used after the core provides data for a read. In summary, a read uses resources in the order: (a) control interconnect 2304, (b) column i/o 2307, (c) data interconnect 2305. A write uses them in the order: (a) control interconnect 2304, (b) data interconnect 2305, (c) column i/o 2307.

Figure 17:
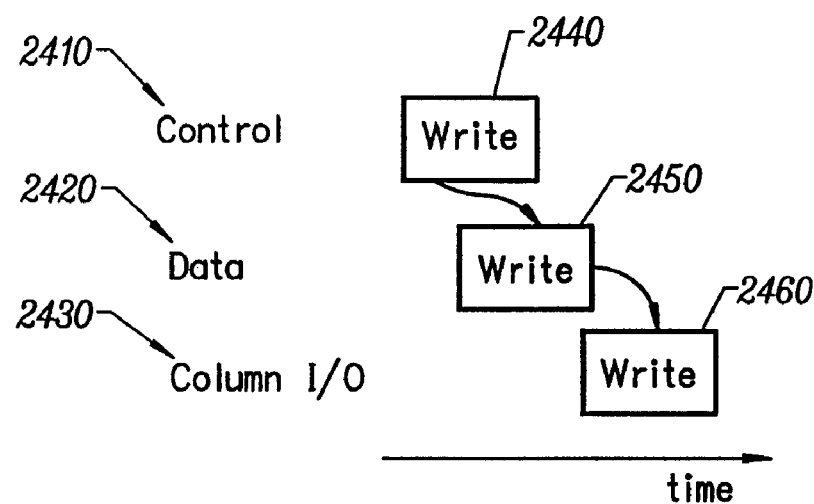
FIG. 17 illustrates timing operations associated with a write command of an embodiment of the invention.

This change in resource ordering gives rise to resource conflict problems that produce data bubbles when mixing reads and writes. The resource ordering of writes generally leads to the resource timing shown in FIG. 17. For example, a write uses resource as shown by block 2440, the data resource as shown by block 2450, and the column resource as shown by the block 2460. This resource timing minimizes the control logic and the latency of writing data into the memory core.

Figure 18:
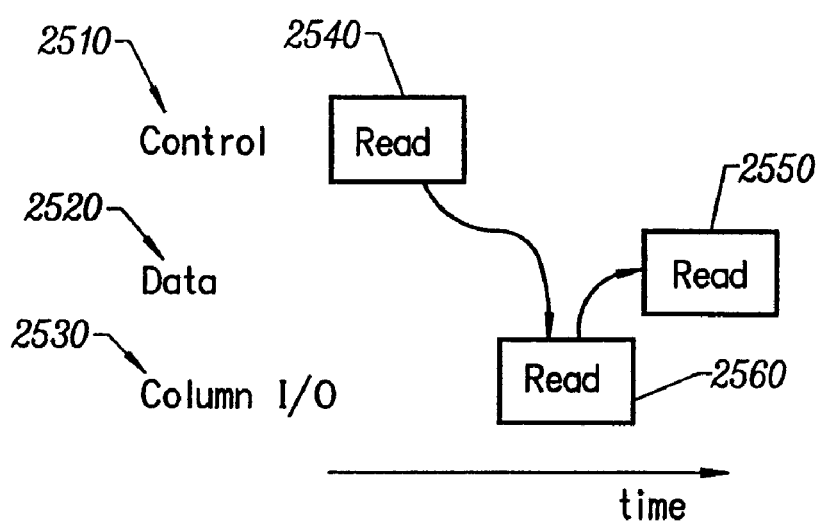
FIG. 18 illustrates timing operations associated with a read command of an embodiment of the invention.
Figure 19:
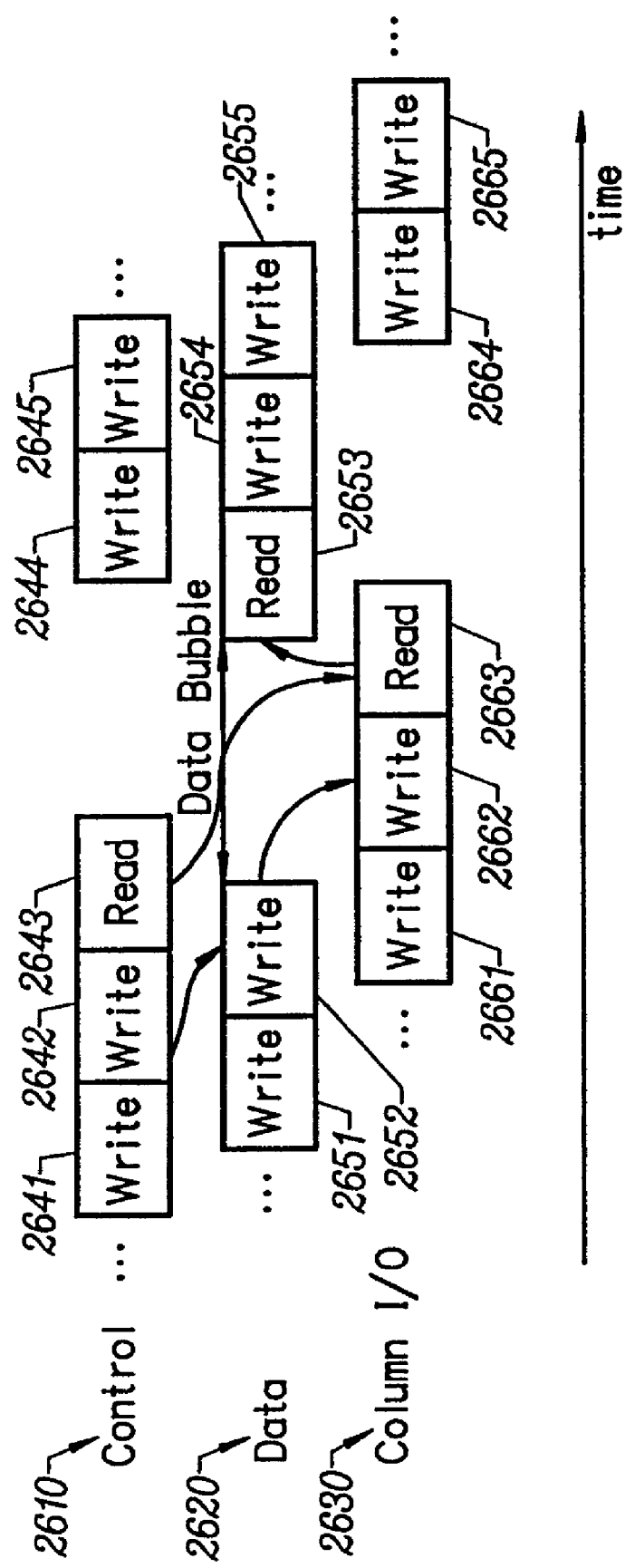
FIG. 19 illustrates mixed read and write timing in accordance with an embodiment of the invention.

The read resource timing of FIG. 18, illustrates a minimum latency read via block 2540, column i/o block 2560, and data block 2550. When these timings are combined as shown in FIG. 19, a data bubble is introduced between blocks 2652 and 2653 of FIG. 19. This data bubble constitutes time during which the data pins are not being utilized to transfer data; the pins are inactive. Forcing the data pins to do nothing as a result of mixing reads and writes is a problem.

Note that the data bubble appears regardless of whether the write 2642 and the read 2643 are directed to the same or different memory devices on the channel. Further note that the delay from the control resource to the column i/o resource is identical for reads and writes. In view of this, it is impossible for the data resource timing to be identical for reads and writes.

Matching the timing of the write-use of the data resource to the read-use of the data resource avoids the problem stated above. Since the use of the data pins in a system environment has an intrinsic turnaround time for the external interconnect, the optimal delay for a write does not quite match the delay for a read. Instead, it should be the minimum read delay minus the minimum turnaround time. Since the turnaround delay grows as the read delay grows, there is no need to change the write control to data delay as a function of the memory device position on the channel.

Figure 20:
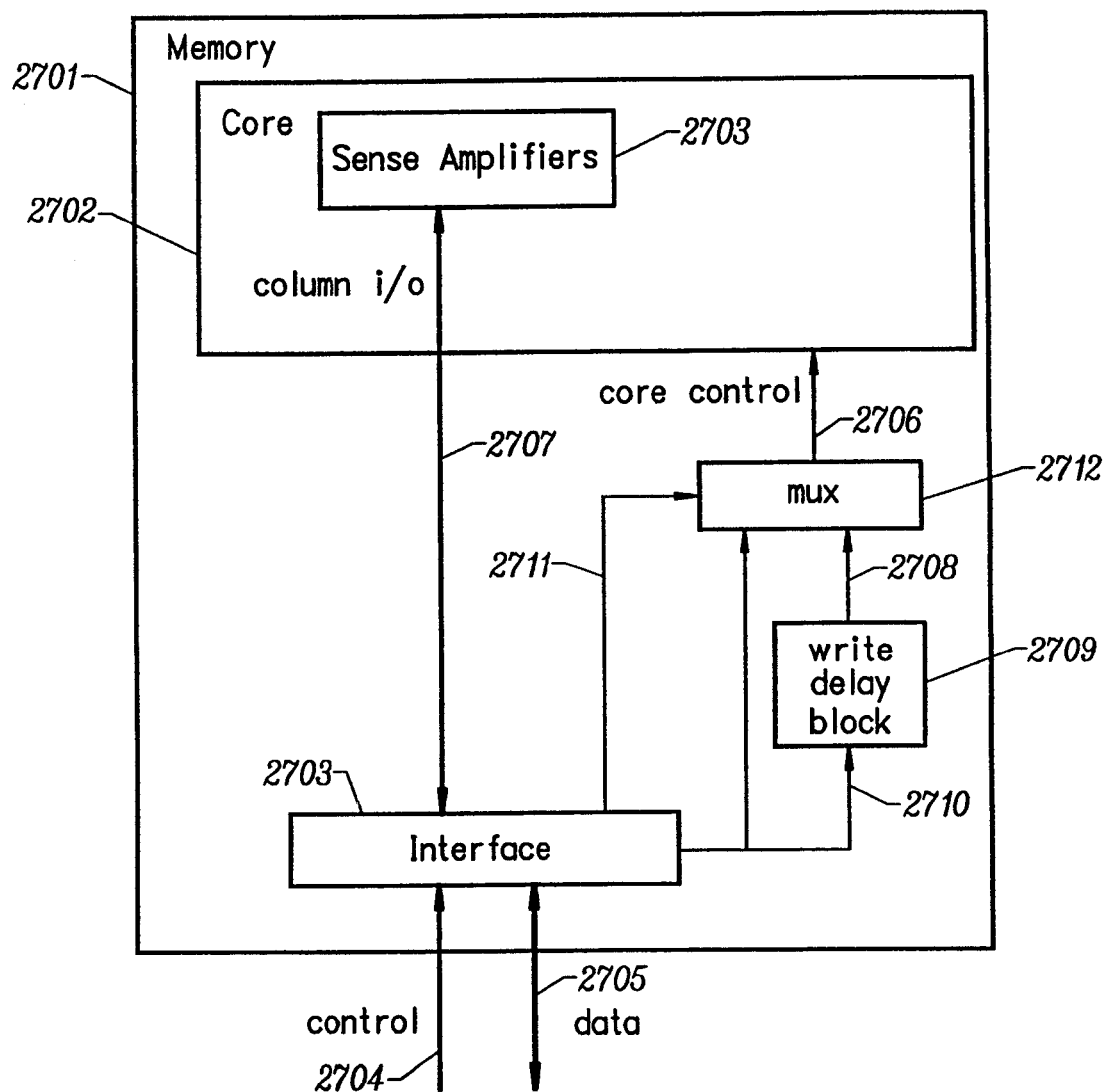
FIG. 20 illustrates a column access with a delayed write in accordance with an embodiment of the invention.

FIG. 20 shows an embodiment of the invention having delayed write circuitry. The column access control information on line 2706 is delayed for writes relative to when the column control information is presented to the core for reads. FIG. 20 shows multiplexor 2712 which selects between the write delay block 2709 and the normal column control output of the interface. The interface controls the multiplexor depending upon whether the transfer is a read or a write. However, there are many embodiments of this mechanism. For example, a state machine could introduce new delaying state transitions when the transfer is a write.

FIG. 21 shows the operation of delaying the write to match the read in accordance with the present invention. In this figure, the delay from write control block 2842 to write data block 2852 is set to match the delay from read control 2843 block to read data 2853 block less the channel turnaround time. As long as different column data paths are used to perform the read column cycle and the write column cycle, the data bubble is reduced to the minimum required by channel turnaround requirements and is no longer a function of control or data resource conflicts.

Since write latency is not an important metric for application performance, as long as the write occurs before the expiration of $t_{RAS,MIN}$ (so that it does not extend the time the row occupies the sense amplifiers, which reduces application performance), this configuration does not cause any loss in application performance, as long as the writes and reads are directed to separate column data paths.

Delayed writes help optimize data bandwidth efficiency over a set of bidirectional data pins. One method adds delay between the control and write data packets so that the delay between them is the same or similar as that for read operations. Keeping this Apattern≡the same or similar for reads and writes improves pipeline efficiency over a set of bidirectional data pins, but at the expense of added complexity in the interface.

FIG. 22 shows that the offset between write data 2984 block and read data 2985 block has been reduced by 2 units of time, compared to the analogous situation of FIG. 15.

Split Control Resources

Figure 23:
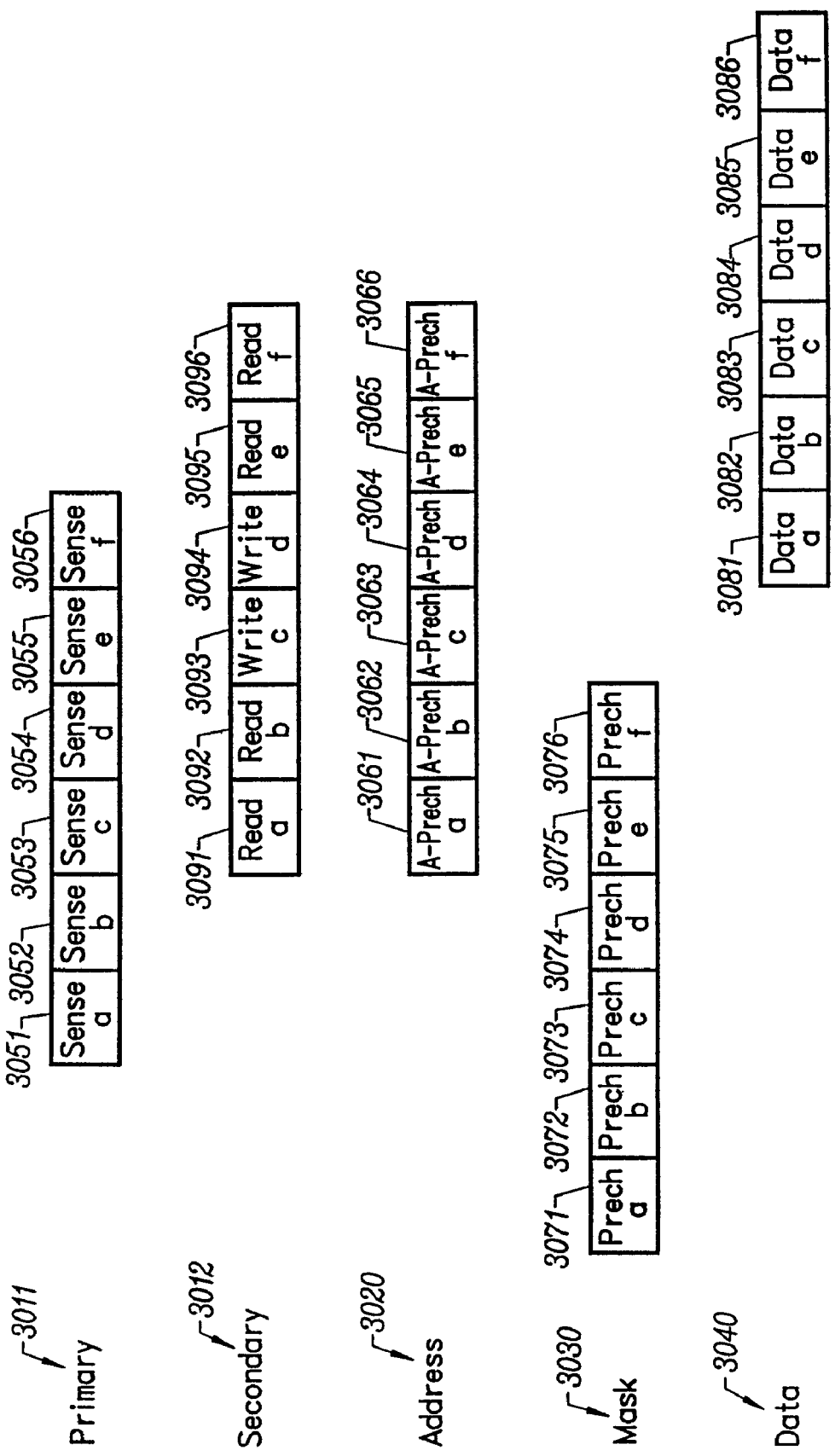
FIG. 23 illustrates a split control universal read write sequence with mask precharge and delayed write in accordance with an embodiment of the invention.

FIG. 22 shows less than full utilization of the data interconnect due to the overloaded use of the command pins 2910. The command pins can be partitioned so that these operations are delivered to the device in an independent fashion. The timing of such a control method is shown in FIG. 23 where the unified control has been partitioned into fields of control information, labeled primary field 3011 and secondary field 3012. Generally speaking the primary control pins can be used to control the sense operation while the secondary control pins control read or write operations. An embodiment of the present invention allows full utilization of the data pins and can transfer minimum size data blocks back-to-back, for any mix of reads or unmasked writes, for any mix of hits, misses, or empty traffic, to or from any device, any bank, any row, and any column address with only bank conflict, channel turnaround at the write-read boundaries, and 2nd order effects such as refresh limiting the data channel utilization. With the addition of more interconnect resources the writes could be masked or unmasked. Observe that FIG. 23 presumes that the memory device is designed for an interconnect structure that has zero turnaround delay between writes and reads.

Figure 24:
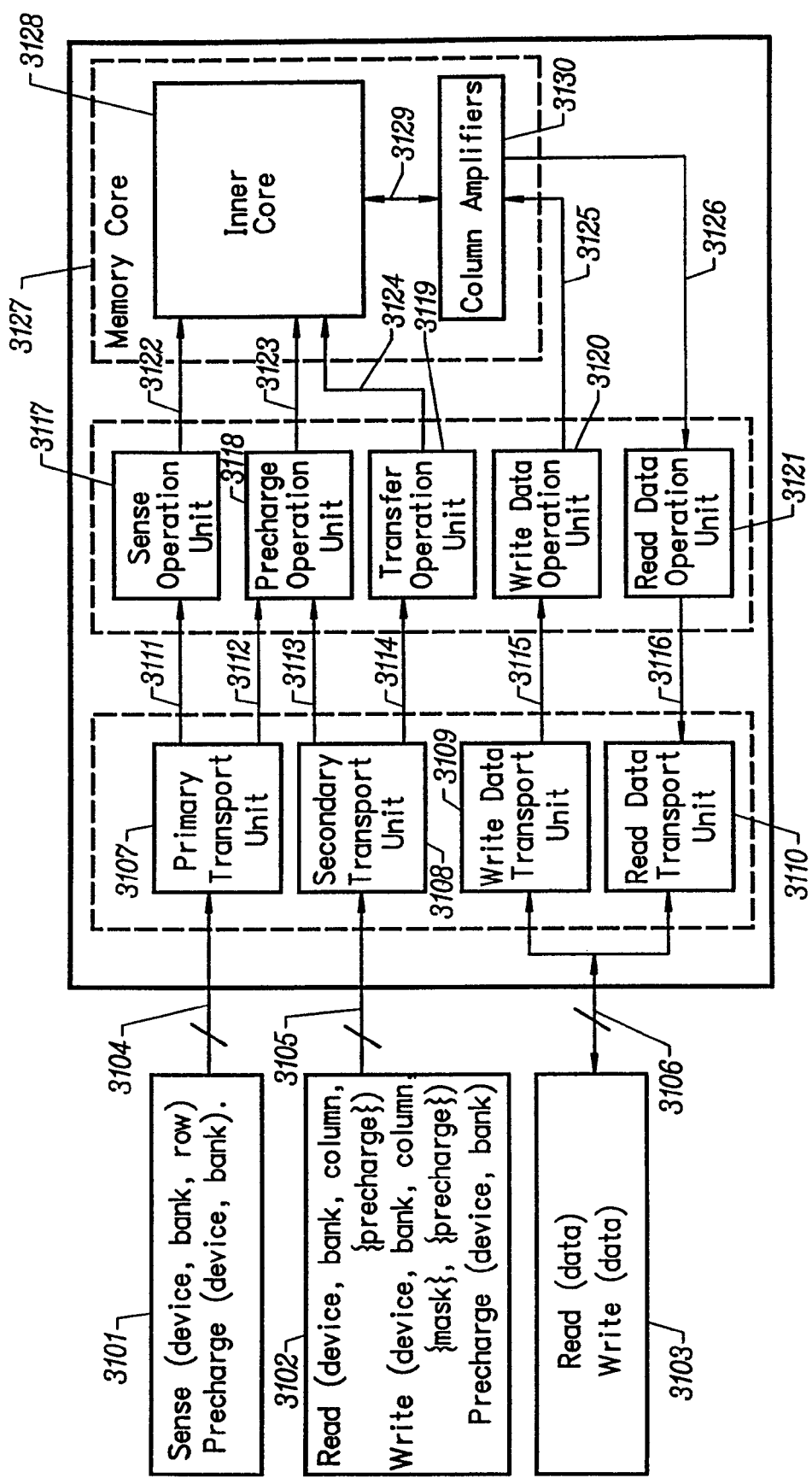
FIG. 24 illustrates a cost optimized highly concurrent memory in accordance with the invention.

FIG. 24 shows an embodiment of the invention that has separate control interconnect resources. In one embodiment it uses delayed writes. In another embodiment it can alternately specify either a masking or a precharge field, either singly or in conjunction with another field. In another embodiment it combines delayed writes and the masking versus precharge. In an alternative embodiment according to the present invention there are three methods for starting a precharge operation in the memory core:

in the sense operation field on the primary control lines 3104, as an alternative to the sense information;

in the mask field on the secondary control lines, 3105 as an alternative to the mask information; and according to the device and bank addresses specified in a read or a write.

Figure 25:
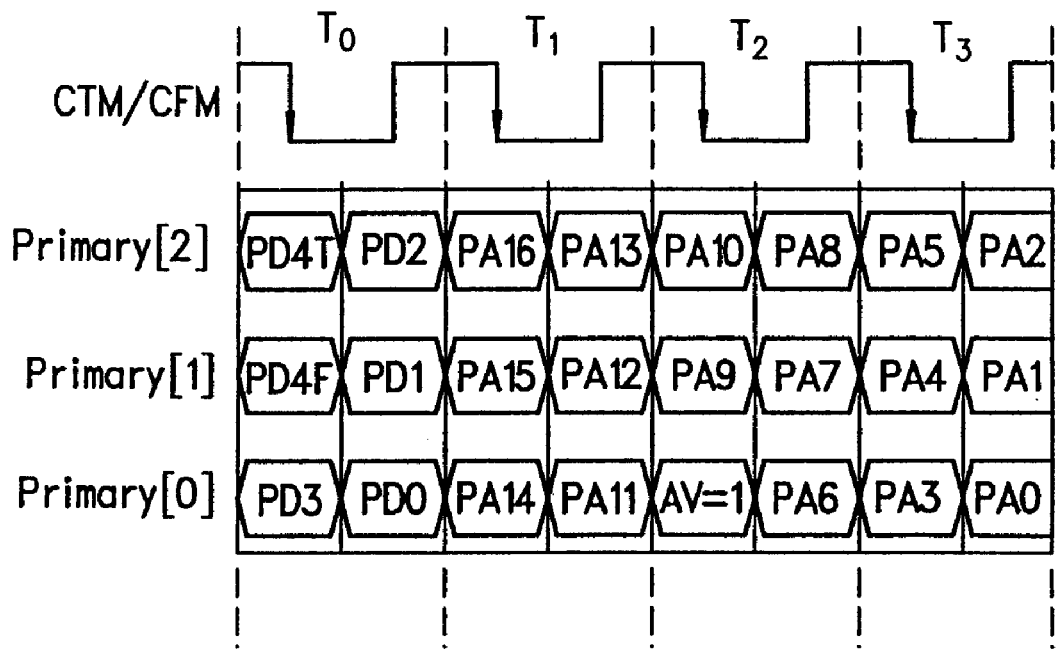
FIG. 25 illustrates a control packet format for encoding the sense operation on the primary control lines in accordance with an embodiment of the invention.
Figure 26:
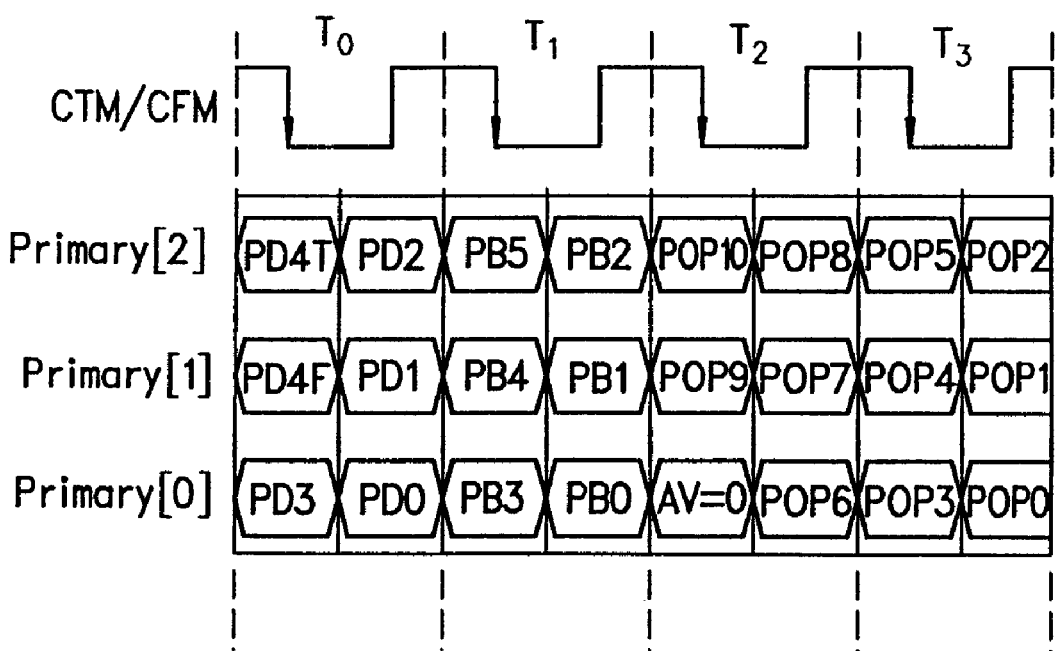
FIG. 26 illustrates a control packet format for encoding the precharge operation on the primary control lines in accordance with an embodiment of the invention.

The benefit of the present invention according to a specific embodiment is shown in Table 4 and FIG. 25 and FIG. 26. Table 4 shows the specific logical pinout of the embodiment of FIG. 24 to be used for this illustrative purpose.

TABLE 4

High Performance Logical Pin Description

| Name | Count | Description | FIG. 24 Reference |
|---|---|---|---|
| Primary[2:0] | 3 | Primary request control | 3104 |
| Secondary[4:0] | 5 | Secondary request control | 3105 |
| DQA[8:0] | 9 | Low order data byte | 3106 |
| DQB[8:0] | 9 | High order data byte | |

FIG. 25 and FIG. 26 show two alternative control packet formats for encoding, respectively, the sense and precharge operations on the primary control lines. Table 5 defines the fields in the alternative formats of the primary control packet. The PD field selects a specific memory device. A combined field carries both the bank and row address arguments of the sense operation, as previously defined.

TABLE 5

Primary Control Packet Fields

| Field | Description |
|---|---|
| PD4T | Device selector bit 4 True; for framing, device selection and broadcasting. |
| PD4F | Device selector bit 4 False; for framing, device selection and broadcasting. |
| PD[3:0] | Device selector, least significant bits. |
| AV | Activate row; also indicates format of packet. |
| PA[16:0] | Address; combining bank and row. |
| PB[5:0] | Bank address |
| POP[10:0] | Opcode of the primary control packet. |

Figure 27:
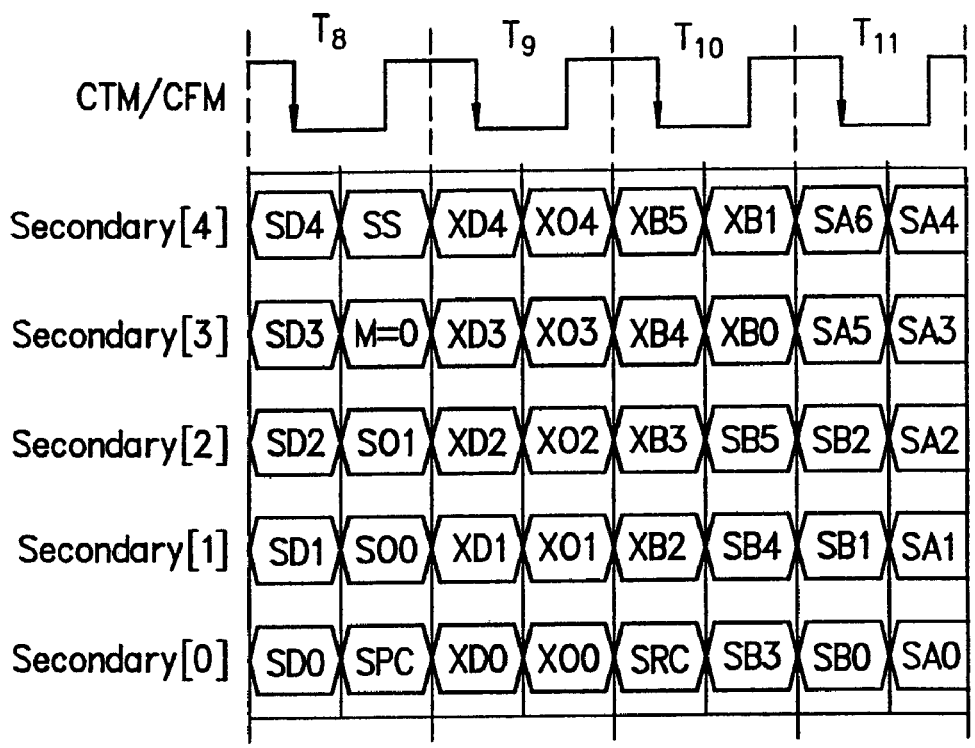
FIG. 27 illustrates a packet format when masking is not used on the secondary control lines of the invention.
Figure 28:
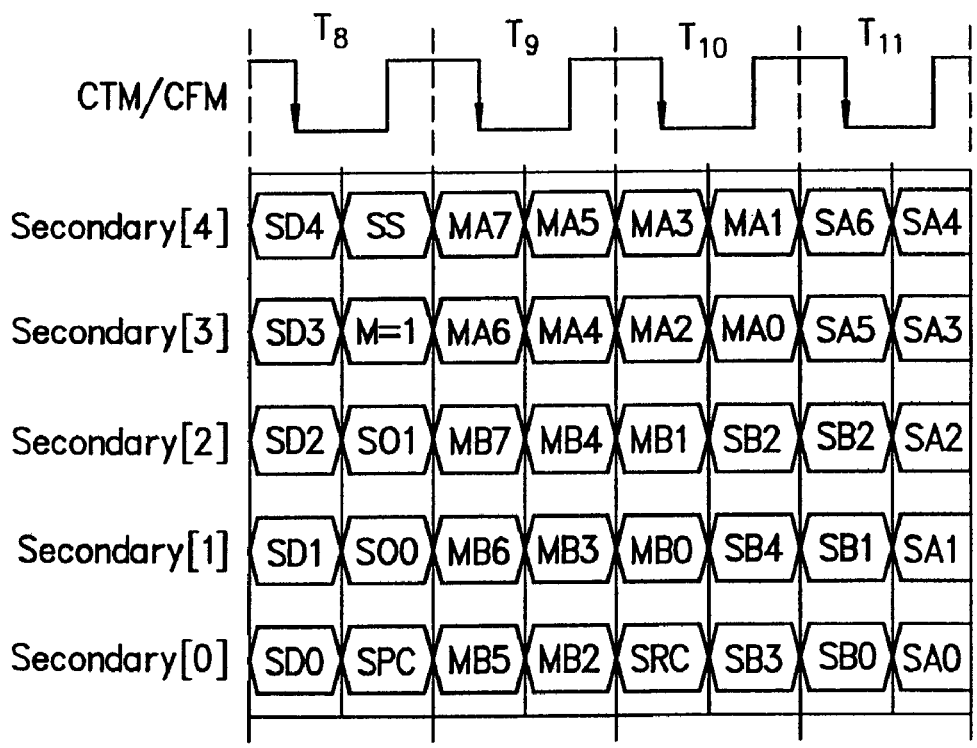
FIG. 28 illustrates a packet format when masking is used on the secondary control lines of the invention.

FIG. 27 and FIG. 28 show two alternative control packet formats for encoding various operations on the secondary control lines. FIG. 27 shows the packet format when masking is not being performed while FIG. 28 shows the format when masking is being performed. Table 6 defines the fields in either format of the secondary control packet. Packet framing is accomplished via a framing bit. The M field is used to indicate which format of the packet is being presented as well as indicating whether write data being written to the core should be masked. The SO field indicates whether a read or write operation should be performed. Device selection for SO specified operations is accomplished according to the SD field which is compared against an internal register that specifies the device address. The SA field encodes the column address of a read or write operation. The SB field encodes the bank address of a read or write operation. If the SPC field indicates precharge, then the precharge operation uses the SD device and SB bank address. The SRC field is used for power management functions. The MA and MB fields provide a byte masking capability when the M field indicates masking. The XO, XD, and XB fields provide the capability to specify a precharge operation when the M field does not indicate masking. Note that, unlike the SPC field, this specification of a precharge has a fully independent device, XD, and bank address, XB, that is not related to the read or write operations.

Figure 29:
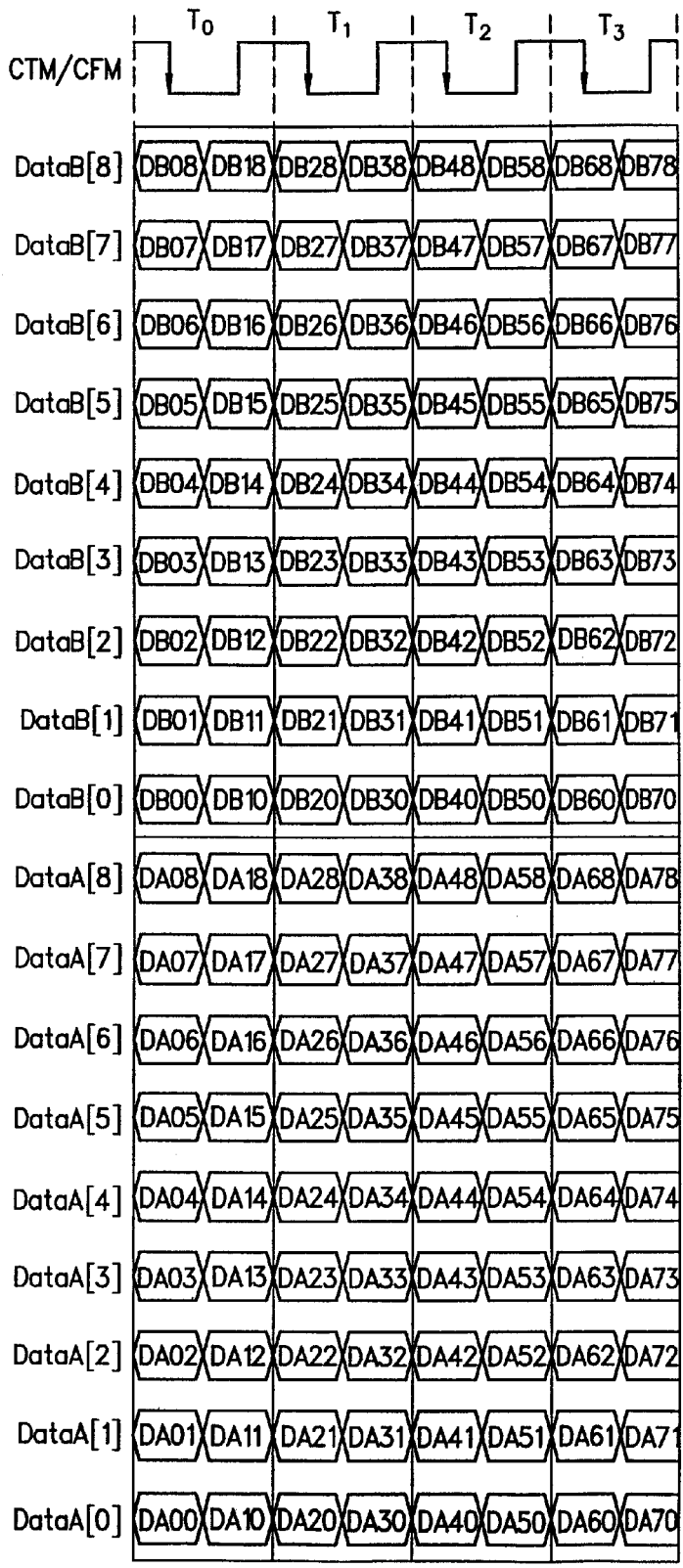
FIG. 29 illustrates a data block timing diagram for data packets transmitted on data wires of the invention.

FIG. 29 shows the format of the data packet transmitted on the data wires.

TABLE 6

Secondary Control Packet Fields

| Field | Description |
|---|---|
| SD[4:0] | Device selector for Column Operation |
| SS=1 | Start bit; for framing |
| M | Mask bit, indicates if mask format is being used |
| SO[1:0] | Secondary Operation code |
| SPC | Precharge after possible Column Operation |
| SRC | Power management |
| SA[6:0] | Address for Column Operation |
| SB[5:0] | Bank for Column Operation |
| MA[7:0] | Byte mask for lower order bytes |
| MB[7:0] | Byte mask for higher order bytes |
| XD[4:0] | Device selector for Extra Operation |
| XO[4:0] | Extra Operation code |
| XB[5:0] | Bank for Extra Operation |

Figure 42:
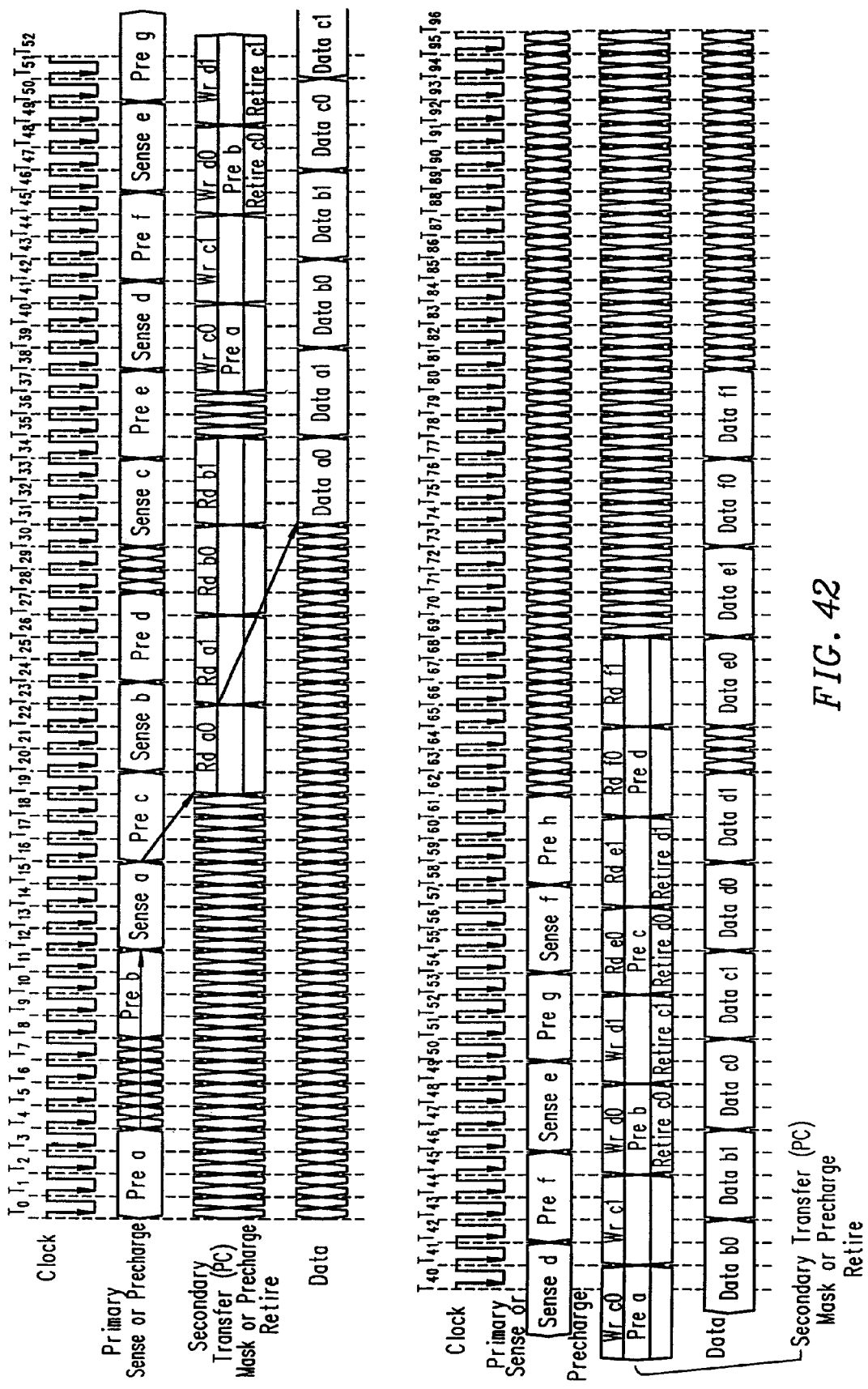
FIG. 42 illustrates reads or unmasked writes in accordance with an embodiment of the invention.
Figure 43:
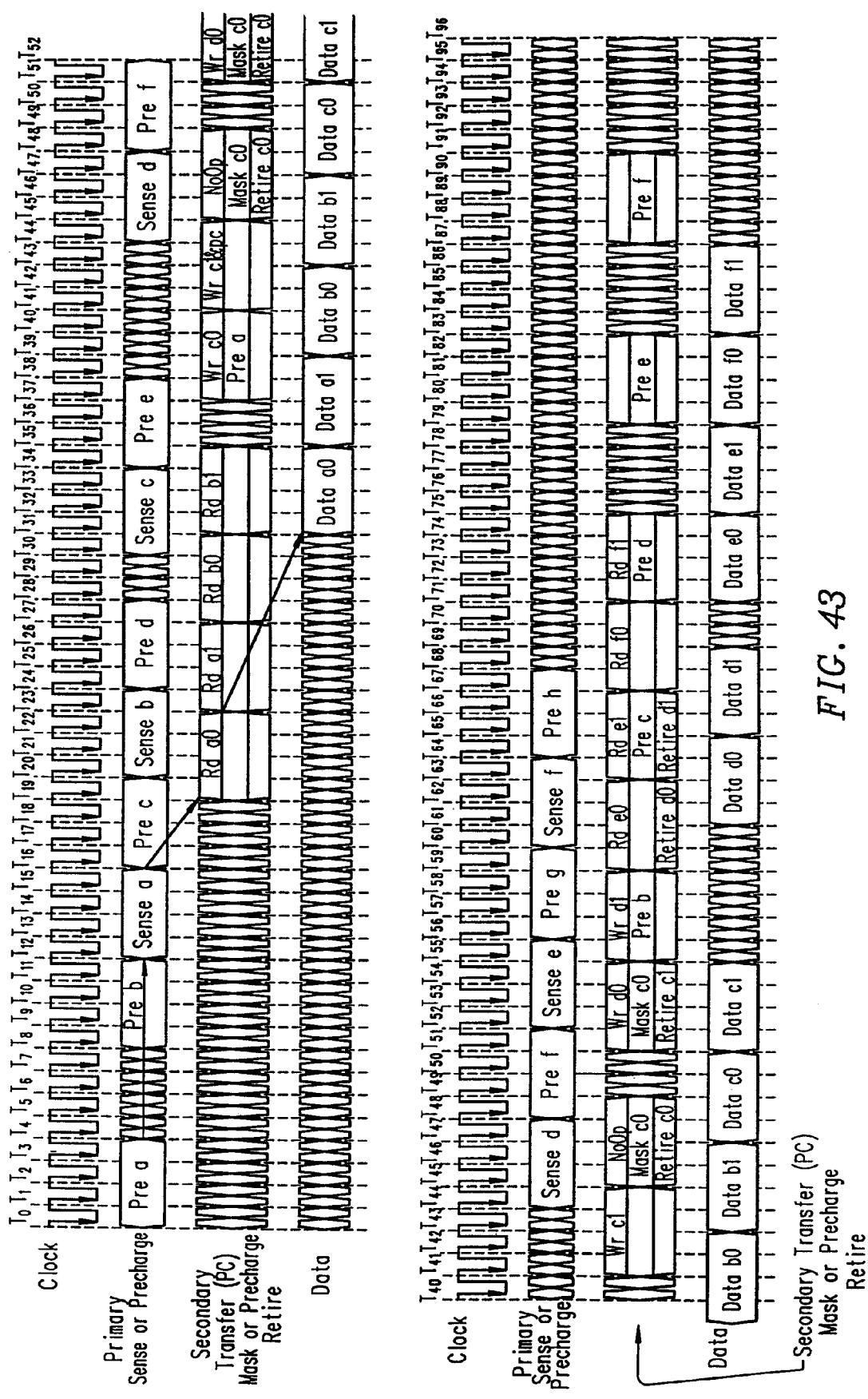
FIG. 43 illustrates reads or masked writes or unmasked writes in accordance with an embodiment of the invention.
Figure 44:
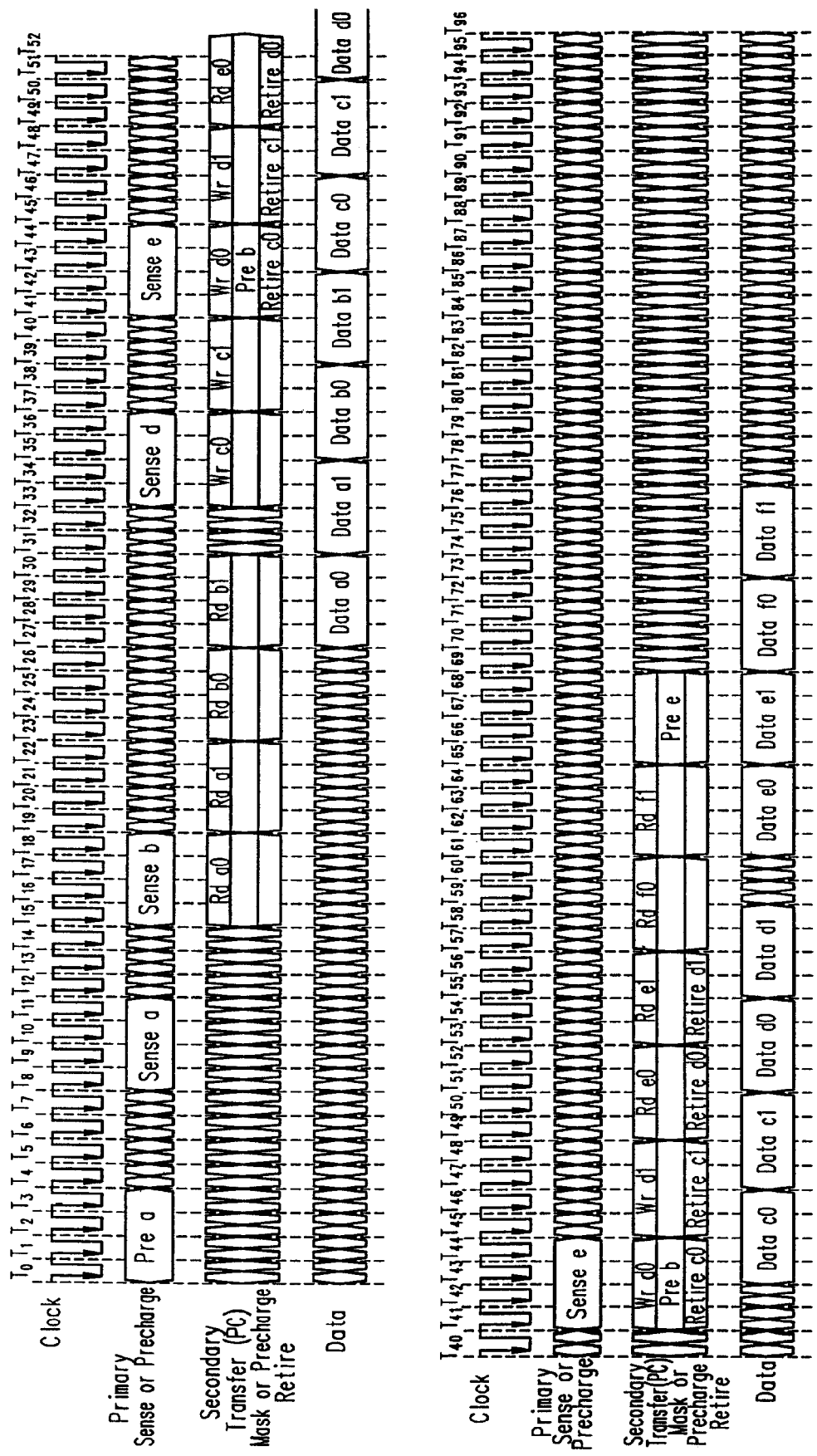
FIG. 44 illustrates reads and unmasked writes in accordance with an embodiment of the invention.
Figure 45:
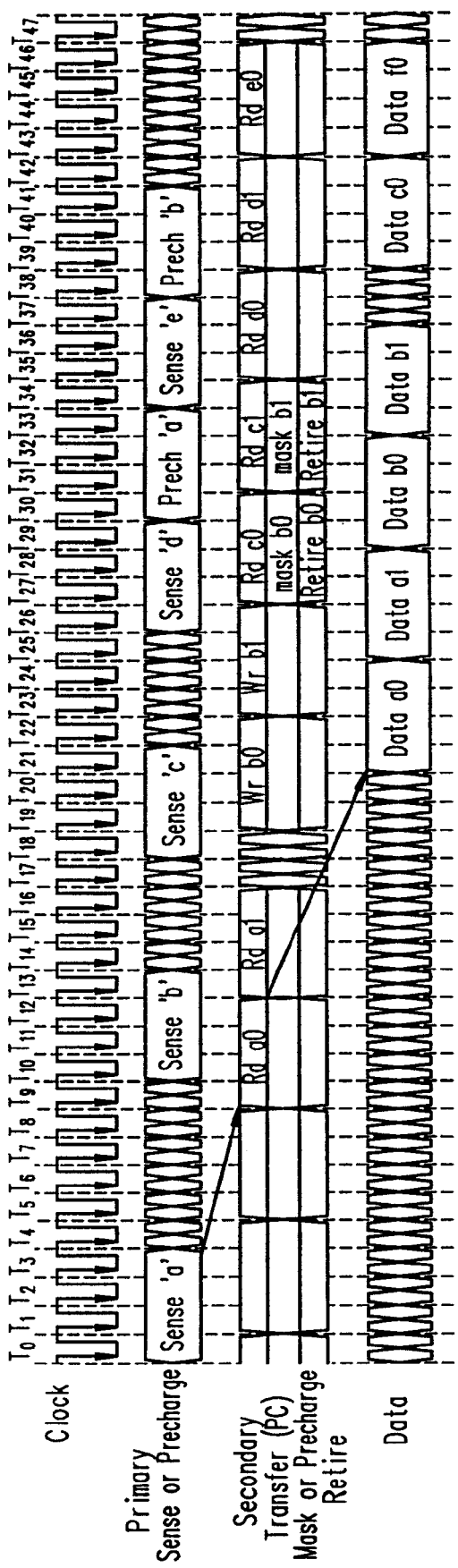
FIG. 45 illustrates transfers using a primary control packet for sense and precharge in accordance with an embodiment of the invention.

The operation of this embodiment can be most easily understood through various timing diagrams as shown in FIG. 30 through FIG. 45. These figures can be divided into several series, each of which depicts different aspects of this embodiment's operation:

FIG. 30 through FIG. 35 show a basic operation as an embodiment of the present invention, other operations can be thought of as compositions of these basic operations;

FIG. 36 through FIG. 39 show compositions of the basic operations but distinct from notions of the universal sequence;

FIG. 40 through FIG. 43 show operations according to the universal sequence, these figures demonstrate the ability of the embodiment to handle mixed read and write with mixed hit, miss, and empty traffic without control resource conflicts; and FIG. 44 through FIG. 45 show operations according to the universal sequence demonstrating less control conflicts than the prior art. Other control scheduling algorithms are possible which seek to minimize other metrics, such as service time, with or without compromising effective bandwidth.

The nominal timings for the examples are shown in Table 7.

TABLE 7

Nominal Timings

| Symbol | Value (ns) |
|---|---|
| $t_{RP}$ | 20 |
| $t_{RAS,min}$ | 60 |
| $t_{RCD}$ | 20 |
| $t_{CAC}$ | 20 |

A description of each of the timing diagrams follows.

Figure 30:
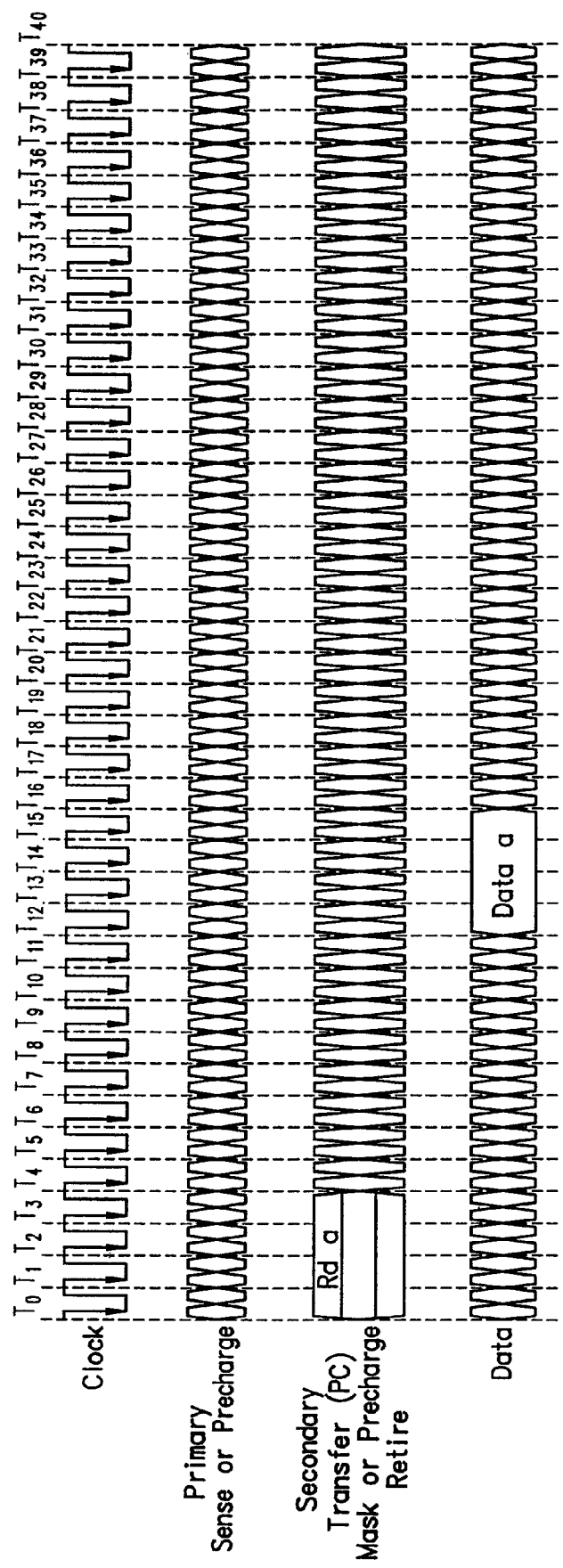
FIG. 30 illustrates a read hit in accordance with an embodiment of the invention.

FIG. 30 shows a timing diagram for a nominal read hit. Recall that a nominal hit reference means that the beginning and final state of the addressed bank is open and that the appropriate row is already in the sense amplifiers of the addressed bank. In this case no row operation is required. The secondary control packet specifies the read operation, device address, bank address, and column address. Some time later, the read data is driven on the data pins. In an embodiment according to the present invention it as a constant time, later fixed by the design of the memory device.

Figure 31:
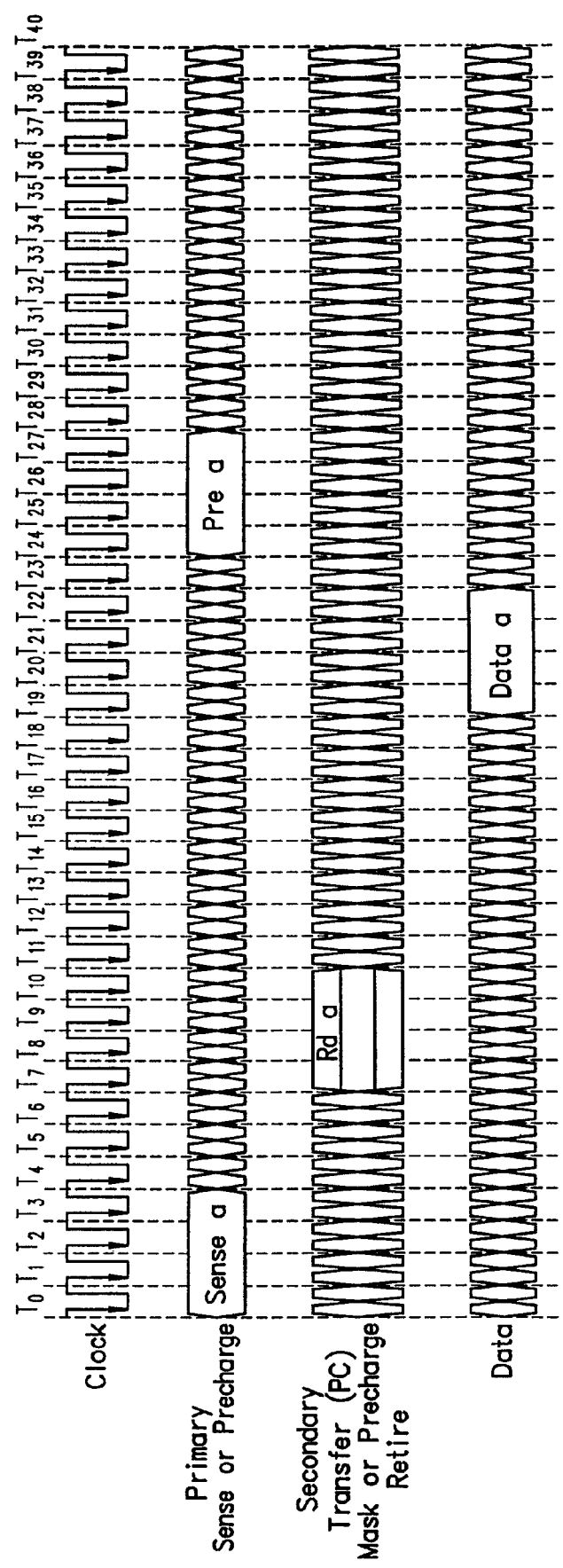
FIG. 31 illustrates an empty read in accordance with an embodiment of the invention.

FIG. 31 shows a timing diagram for a nominal read empty. Recall that a nominal empty reference means that the beginning and final state of the addressed bank is closed. In order to transfer data, the addressed bank is first sensed, and then, after $t_{RCD}$, the read operation takes place just as for the read hit of FIG. 30. Note that this particular example shows the precharge occurring using the primary control packet precharge mechanism. Alternately, other precharge mechanisms are used, since there are no other references contending for the control resources.

Figure 32:
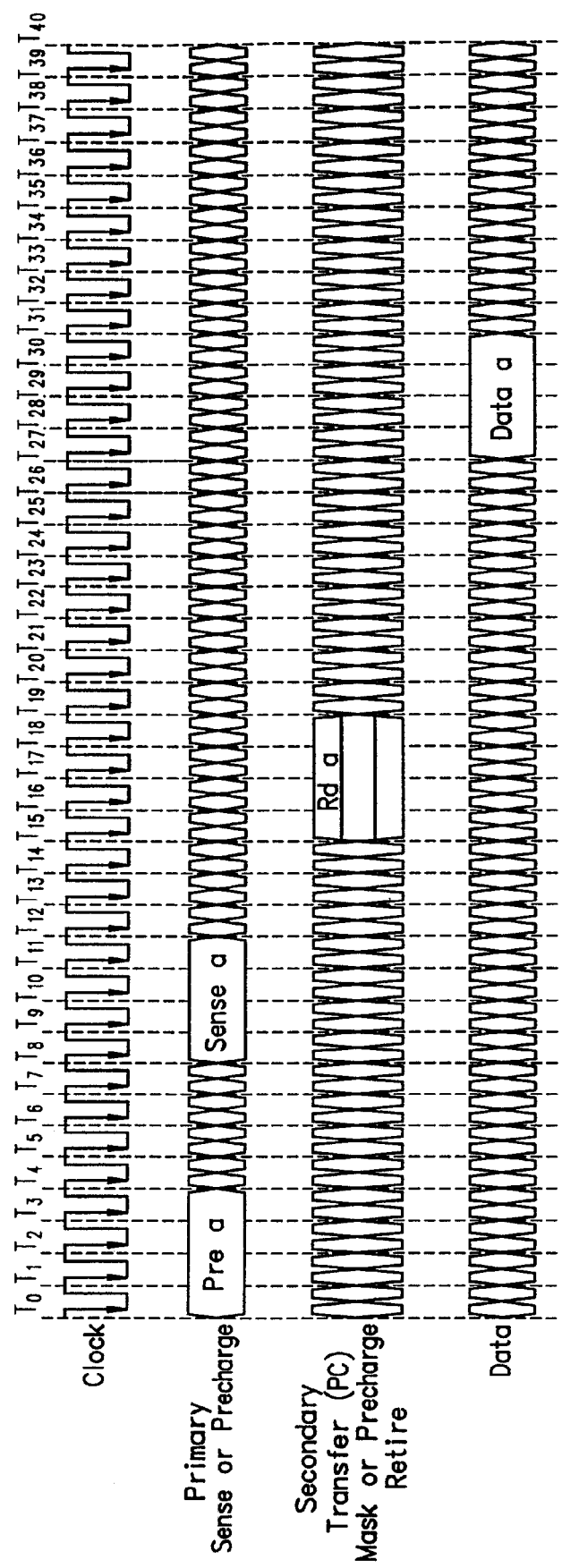
FIG. 32 illustrates a read miss in accordance with an embodiment of the invention.

FIG. 32 shows a timing diagram for a nominal read miss. Recall that a nominal miss reference means that the beginning and final state of the addressed bank is open, but that the row currently sensed in the bank is not the one addressed by the application reference. In this case, a precharge operation occurs, followed by a sense operation, and finally a read operation that causes the proper data to be driven out on the data pins. Any precharge mechanisms can be used.

Figure 33:
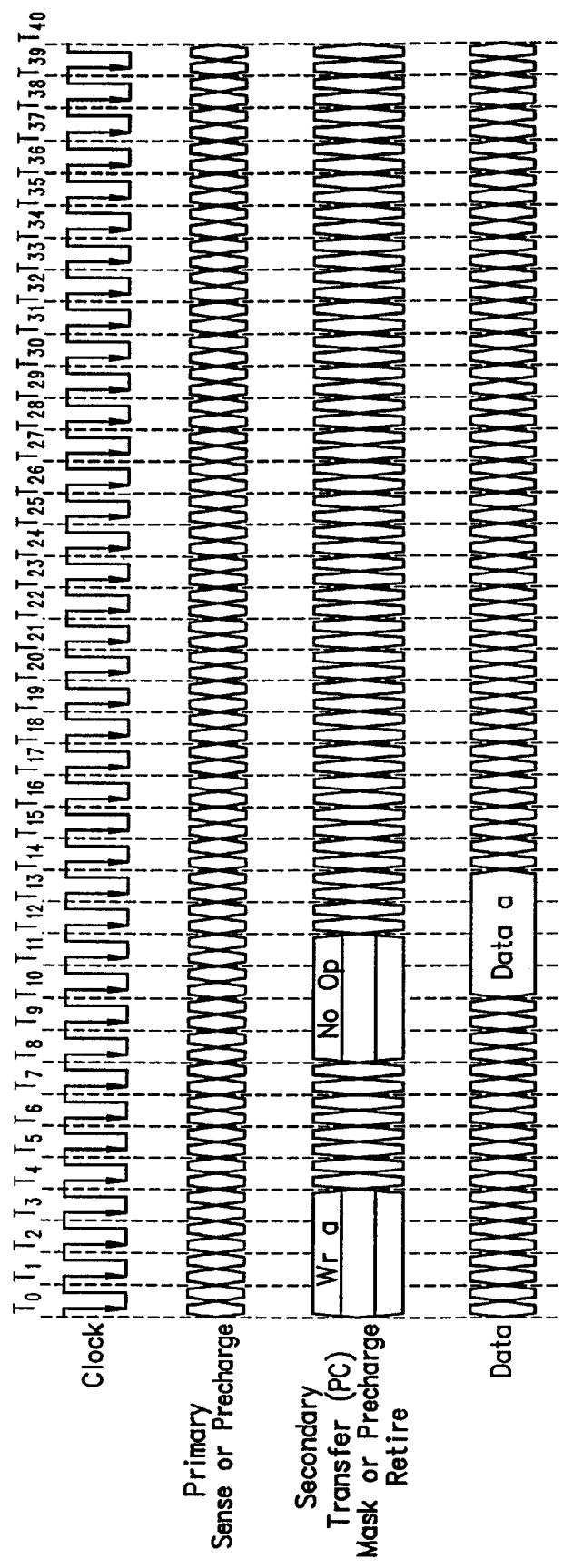
FIG. 33 illustrates a write hit in accordance with an embodiment of the invention.

FIG. 33 shows a nominal write hit. The figure relates to a multistep write operation. Thus, there is a secondary control packet in order to get the transported data sent all the way into the memory core. This second secondary control packet provides a timing reference that indicates to the memory device that it is time to send the data to the core.

Figure 34:
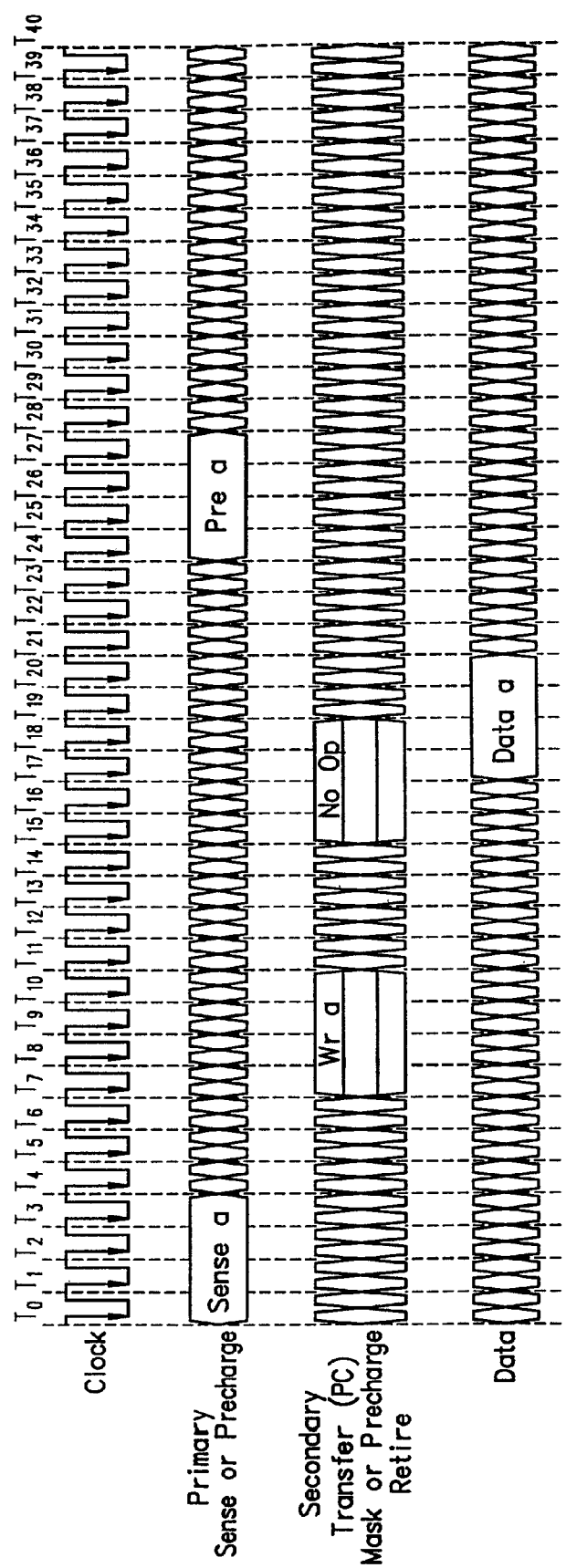
FIG. 34 illustrates an empty write in accordance with an embodiment of the invention.

FIG. 34 shows a timing diagram for a nominal write empty. A write empty operation is a combination of the actions needed for a read empty and a write hit. First, a sense operation is performed, followed by a write operation, including the secondary control packet, followed by some precharge operation, although a primary precharge operation is shown.

Figure 35:
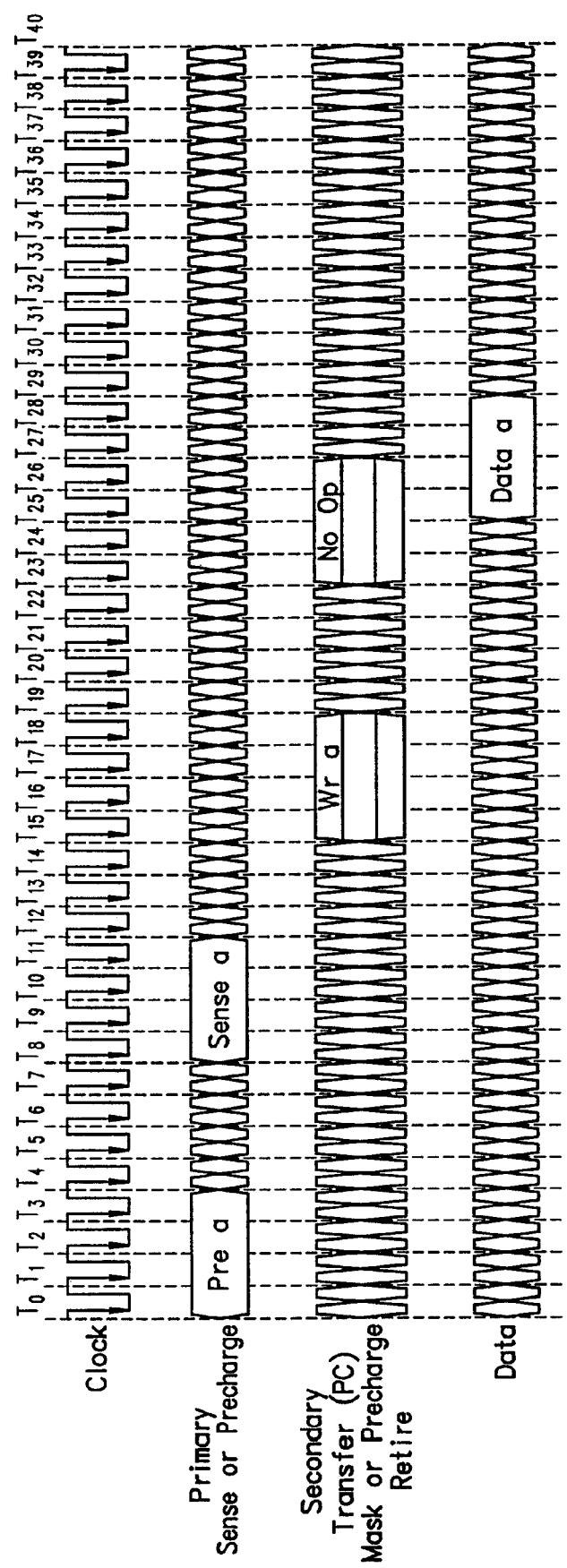
FIG. 35 illustrates a write miss in accordance with an embodiment of the invention.

FIG. 35 illustrates a timing diagram for a nominal write miss. Write miss operation is a combination of the actions needed for a read miss and a write hit. First, a precharge operation is invoked; a primary precharge operation is shown. A sense operation follows, along with the two secondary control packets needed to write the data all the way to the memory core.

Figure 36:
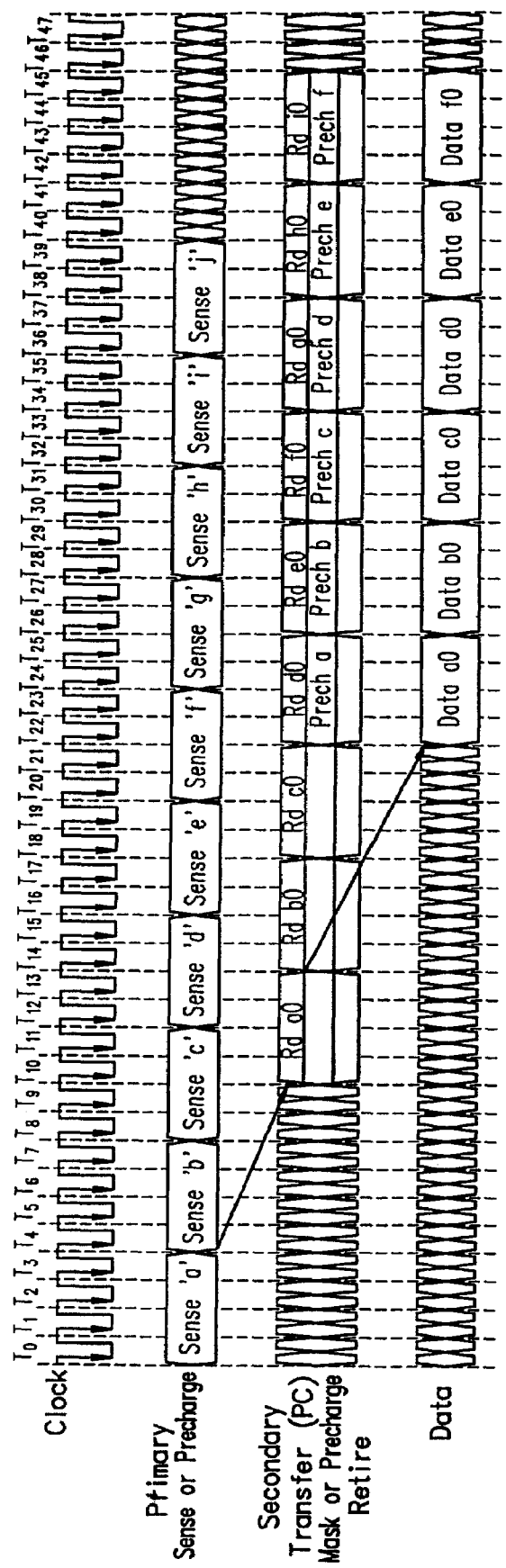
FIG. 36 illustrates reads in accordance with an embodiment of the invention.

The previous figures show how various application references can be decomposed into the memory operations. FIG. 36 illustrates how one of these isolated references can be used for a sequence of memory references. In FIG. 36 a sequence of nominal read empty references is shown. In this case the XO precharge operation is used to perform the close operation at the end of the sequence. The present invention thus provides another precharge mechanism that neither overloads the external control pin resources, nor adds logic to the memory device.

Figure 37:
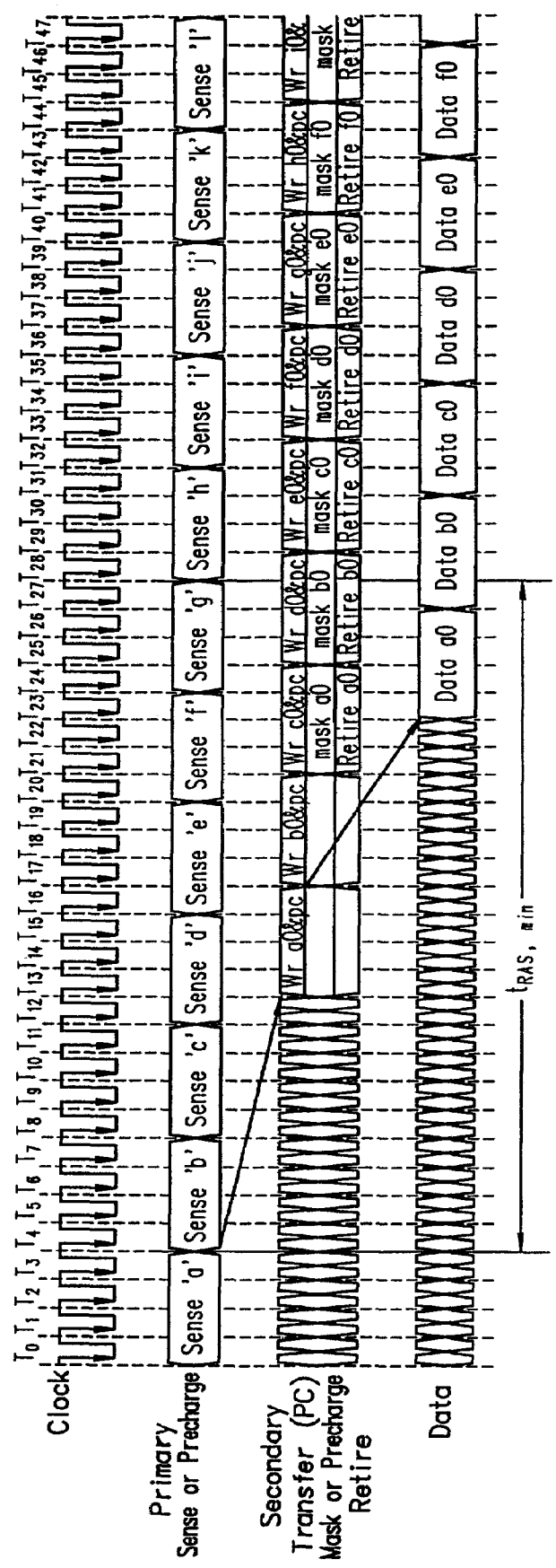
FIG. 37 illustrates empty byte masked writes in accordance with an embodiment of the invention.

FIG. 37 shows timing for a series of nominal masked write empty references. In this case, the XO precharge operation is not available because those control pin resources are being used to supply the mask information. Instead, the SPC field is used in order to avoid bubbles, since the primary control pins are already committed to the series of sense operations. Presuming that the delay between sense and write operations is such that write read conflict problems are being avoided, as shown with the previous discussion on delayed writes, there is no real penalty for using the SPC field. This is different from reads, which would normally complete, and which desire to complete, sooner. This asymmetry between reads and writes leads to the cost reductions of the present invention by reducing required control bandwidth, while minimally impacting application performance.

Figure 38:
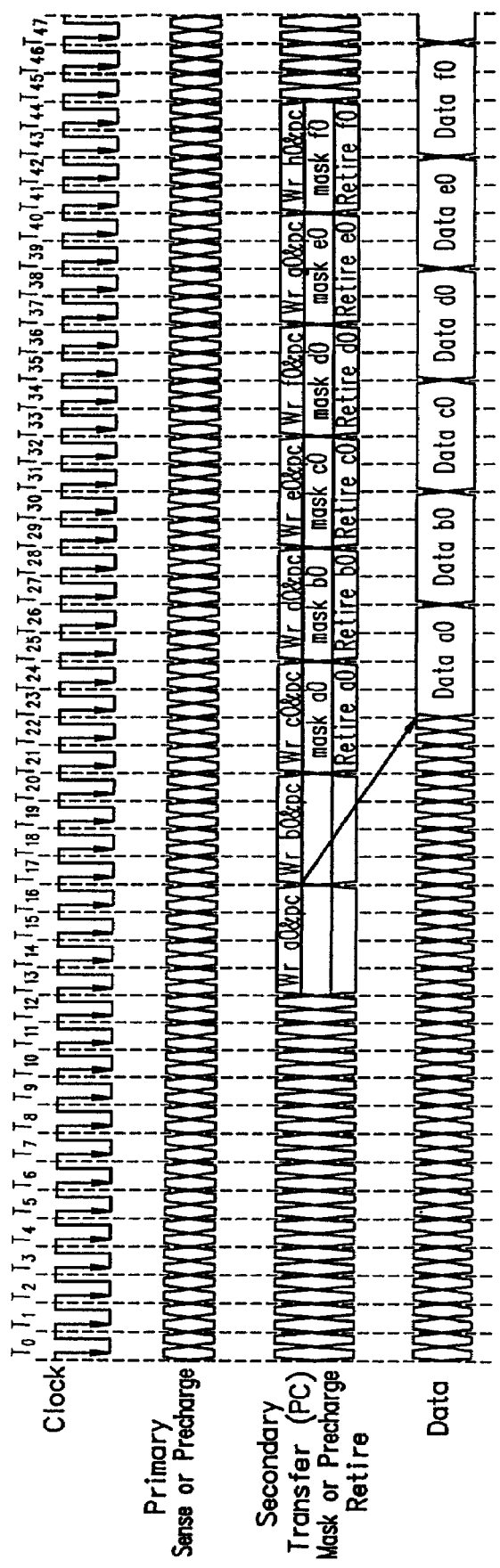
FIG. 38 illustrates byte masked write hits in accordance with an embodiment of the invention.

FIG. 38 shows a series of nominal masked write hit references. Note that although two secondary control packets were required to fully write data into the memory core for an isolated reference the average number needed is about one.

Figure 39:
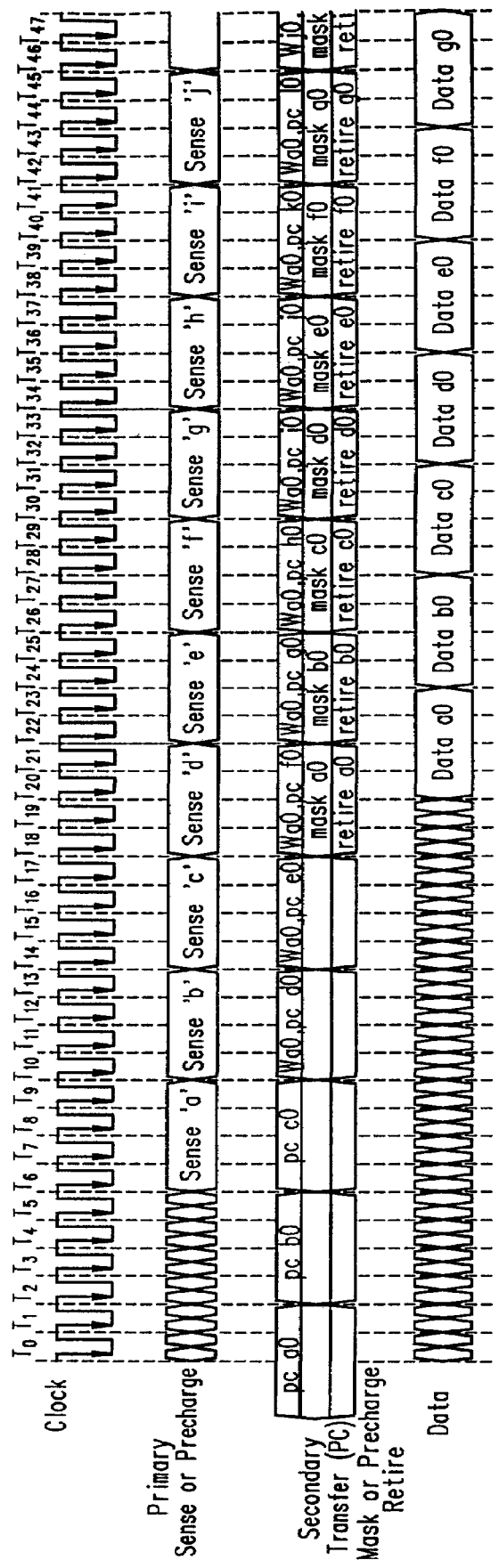
FIG. 39 illustrates byte masked write misses in accordance with an embodiment of the invention.

FIG. 39 shows a timing diagram for a series of masked writes misses. In this example the SPC field is used to precharge the bank. Such a sequence is useful in a graphics application which varies the length of time it keeps any bank open depending upon the amount of rendering to be done. If more than one transfer is directed to the same row of the same bank of the same device then some of the SPC precharge operations and the corresponding sense operations can be removed. This is useful both to eliminate unnecessary (precharge, sense) power but also to reduce the effective number of independent banks required to sustain the effective bandwidth, even when bank conflicts might occur.

FIG. 40 shows a timing diagram for the universal sequence for minimum size transfers when the write traffic is not masked. In this case the XO precharge operation can be consistently used for the precharge operation which begins the universal sequence, while the SPC field is used for the close operation which ends the universal sequence. As can be seen, once the first reference has completed its sequence every reference behind it continues without any delays due to control resource constraints. The only delays are due to external interconnect turnaround delays. The processor cache miss traffic typically does not contain frequent masked write activity but is latency sensitive. Since it does not use the masking capability it can use the XO precharge capability.

Figure 41:
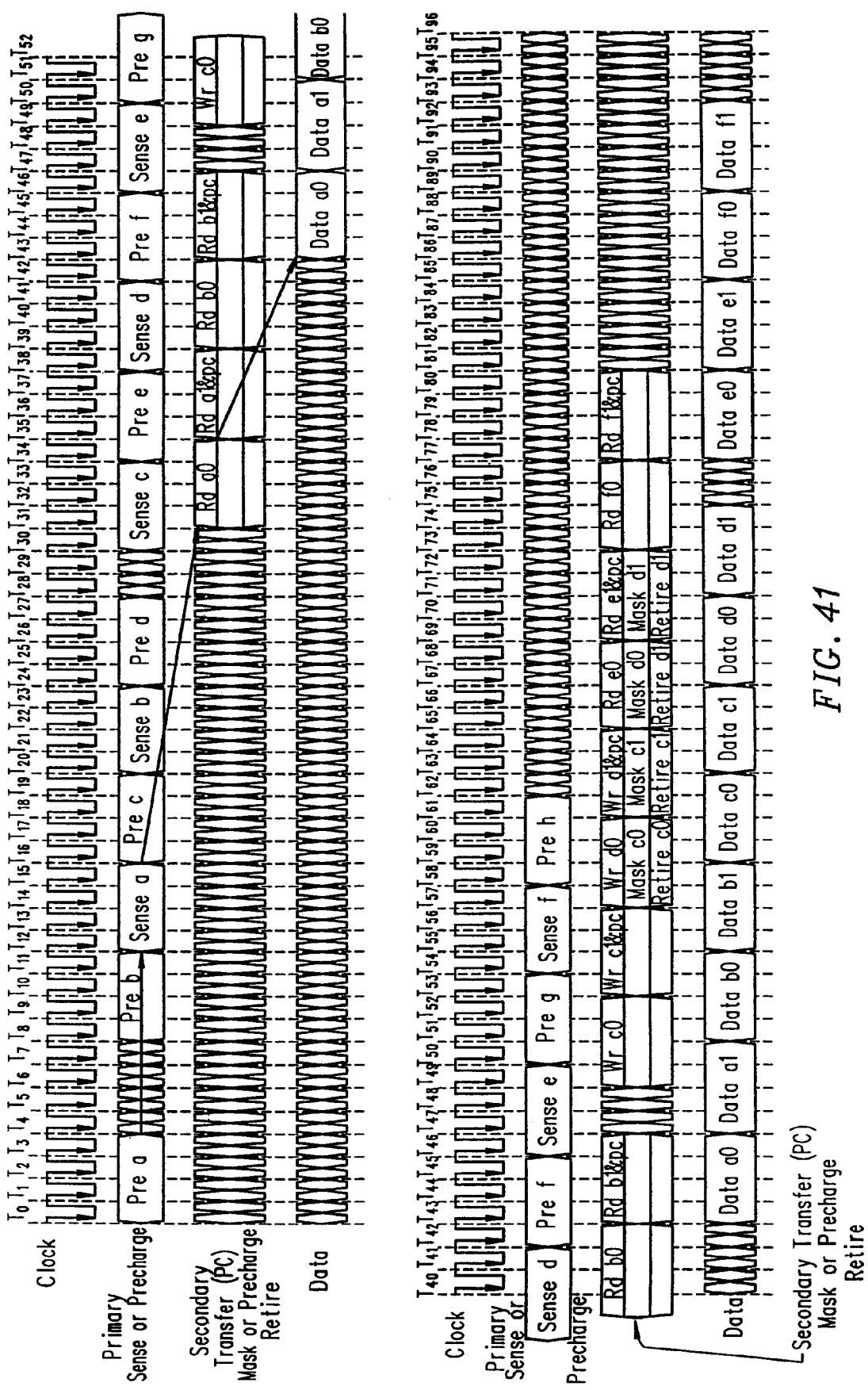
FIG. 41 illustrates universal byte masked writes in accordance with an embodiment of the invention.

FIG. 41 demonstrates the extra degree of freedom permitted when the transfer size per (sense, precharge) pair is twice the minimum transfer size. In this case some of the primary control bandwidth becomes available for precharge control. In this case the universal sequence can be implemented even for masked writes.

FIG. 42 shows a timing diagram for the universal sequence for reads and unmasked writes when the transfer size is twice the minimum per (precharge, sense) pair. In this case the precharge step of the universal sequence is scheduled with the primary packet precharge while the close step is scheduled with the XO precharge. In this case not only is there adequate control bandwidth but there is more scheduling freedom for each of the steps of the universal sequence compared to the minimum transfer size per (precharge, sense) pair case.

FIG. 43 shows a timing diagram for universal reads or masked writes or unmasked writes. In this case the precharge step of the universal sequence is still scheduled in the primary control packet but the close step is scheduled with the XO precharge operation. This reduces the scheduling flexibility compared to the unmasked case 24 but still permits full data pin utilization.

The previous figures demonstrate the conditions in which the universal sequence can be scheduled. The ability to schedule the universal sequence guarantees that there will not be any control conflicts which reduce available data transfer bandwidth. However, none of the nominal reference sequences actually requires two precharges to be scheduled. So there is generally adequate control bandwidth for various mixes of miss and empty traffic as shown in FIG. 44.

FIG. 45 shows a timing diagram for another scheduling alternative when the transfer size is twice the minimum per (precharge, sense) pair and the traffic consists of all empty references. In this case both the sense and precharge can be scheduled on the primary control pins.

Figure 46:
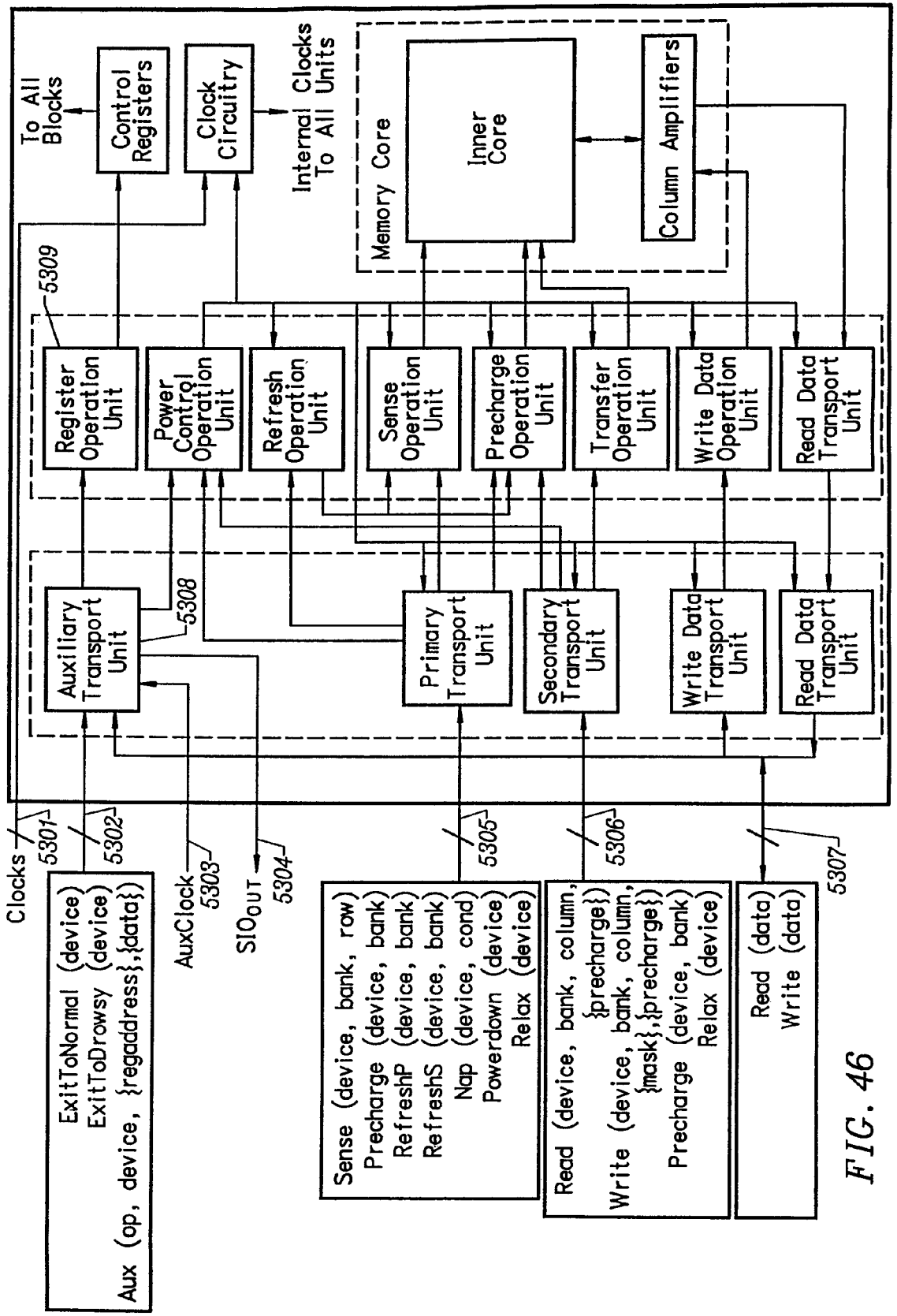
FIG. 46 illustrates a memory block constructed in accordance with an embodiment of the invention.

FIG. 46 shows an alternative embodiment that includes all of the features of FIG. 24, but includes additional capability to initialize, read and write registers, and supply power control information to the memory device. The pinout of this embodiment is summarized in Table 8.

TABLE 8

Alternative High Performance Logical Pin Description

| Name | Count | Type | Description | FIG. 46 Reference |
|---|---|---|---|---|
| CTM<br>CTMN | 2 | RSL | Transmit Clock<br>(Clock To Master) | 5301 |
| CFM<br>CFMN | 2 | RSL | Receive Clock<br>(Clock From Master) | |
| Primary[2:0] | 3 | RSL | Primary request control | 5305 |
| Secondary[4:0] | 5 | RSL | Secondary request control | 5305 |
| DQA[8:0] | 9 | RSL | Low order data byte | 5307 |
| DQB[8:0] | 9 | RSL | High order data byte | |
| SIO[1:0] | 2 | CMOS | Bidirectional serial in/out for device initialization, register ops, power mode control, and device reset. Used to form the SIO daisy chain. | 5302 and 5304 |
| SCK | 1 | CMOS | Serial clock for SIO and CMD pins. | 5303 |
| CMD | 1 | CMOS | Command input used for power mode control, configuring SIO daisy chain, and framing SIO operations. | 5302 |

Figure 47:
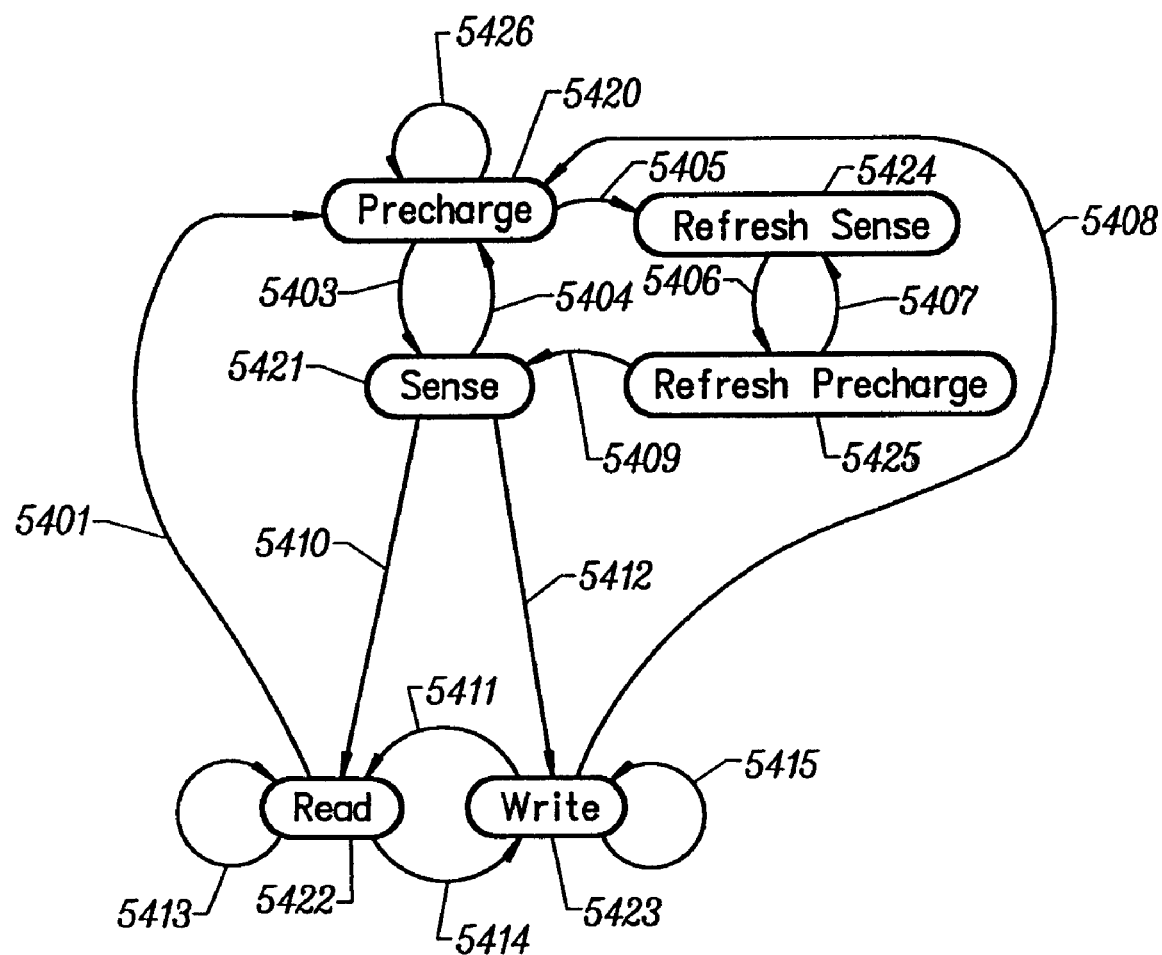
FIG. 47 illustrates DRAM refresh operations utilized in connection with an embodiment of the invention.

FIG. 47 shows the operation sequence for the alternative embodiment of FIG. 46. The refresh specific operations support a novel method of handling core refresh. These new core operations create the requirements for the Refresh and RefreshS operations coded in the primary control packet as shown in FIG. 46. In addition, various power control operations are added to the primary control packet.

Figure 48:
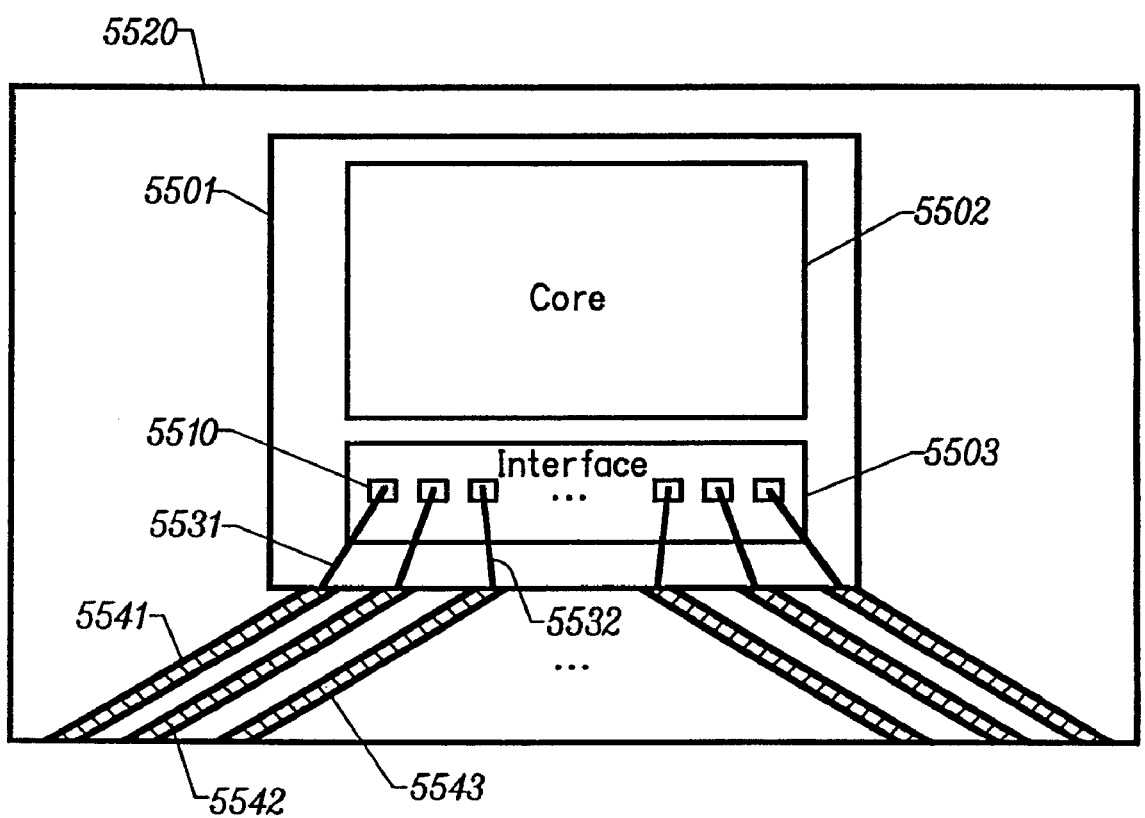
FIG. 48 illustrates isolation pins without accompanying pads in accordance with an embodiment of the invention.

FIG. 48 shows an embodiment of the physical construction in which not all of the pins of the memory device are connected to the bond pads of the die. These non-connected pins provide signal isolation and shielding, thus avoiding the expense of additional bond pads. For example, pin and internal conductor 5542 provides isolation for pin and internal conductors 5541 and 5543. In one embodiment the non-connected pins are signal returns, such as ground, which are adjacent to the connected pins.

Figure 49:
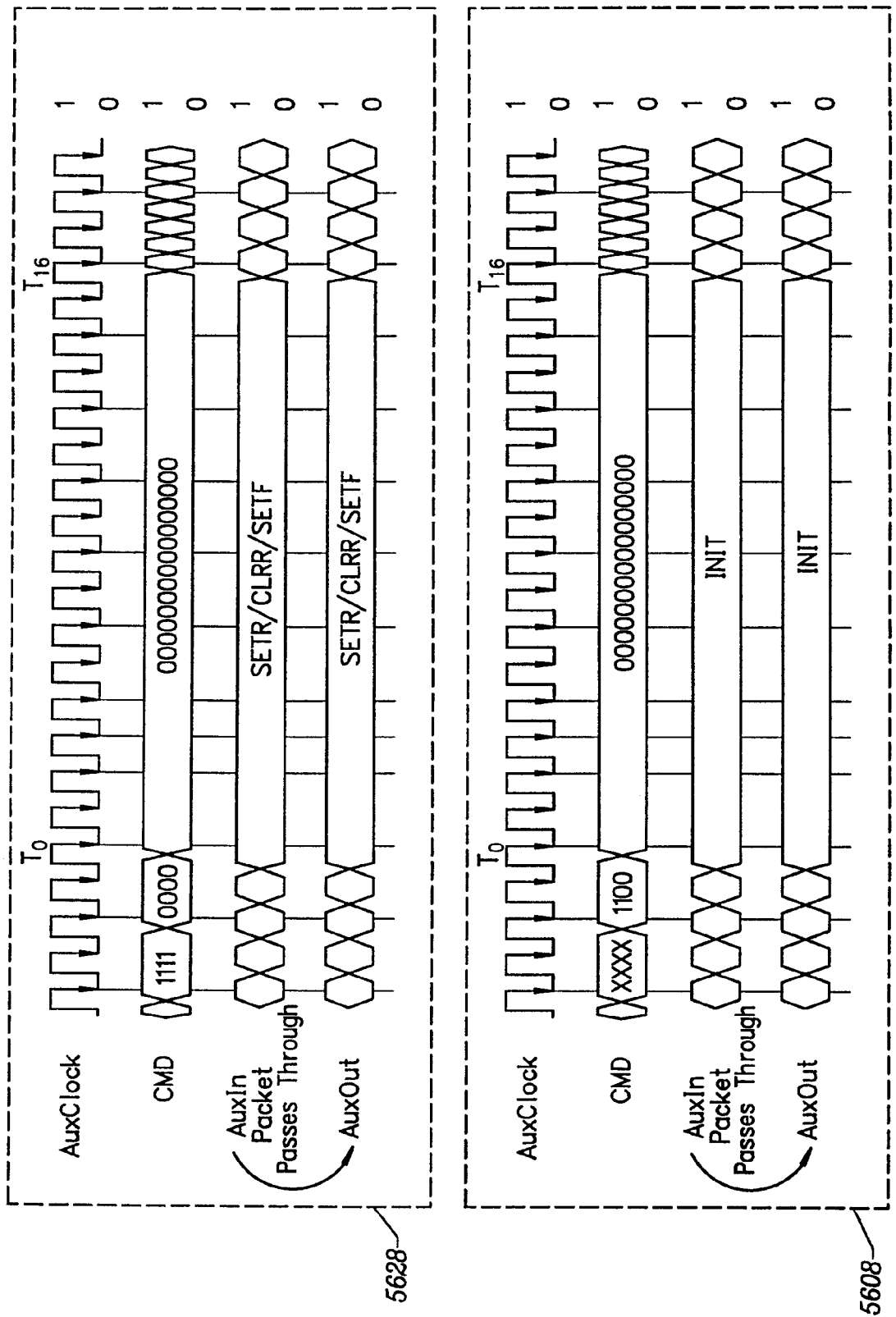
FIG. 49 illustrates the transport of auxiliary information in accordance with an embodiment of the invention.

According to an embodiment of the present invention the memory device of FIG. 46 has Auxiliary information 5302 transported in time according to FIG. 49. Auxiliary information 5302 includes a field to specify an auxiliary operation, a control register address in the memory device, and data to be read or written from or to the control register. AuxClock is the AuxClock signal to the Auxiliary Transport Unit 5308 and is used to receive information from the auxiliary connections 5302 in FIG. 46. Since Auxiliary Transport Unit 5308 operates to reset or initialize the memory device, the unit need only operate slowly. Accordingly, information is framed by the CMD signal, which can be a portion of the auxiliary connections 5302, and received on the AuxIn signal as a serial bit stream. The format of the bit stream is shown in the tables below. As can be noted from Table 9 there are sixteen clock cycles during which a packet of information is received or obtained from the Auxiliary Transport Unit. The Aux information fields are the SOP[3:0] field and the SDEV[4:0] field for the SRQ packet. The SA packet has field SA[11:0], the SINT packet has a field of all zeros and the SD packet has SD[15:0]. In this embodiment of the present invention, the SRQ, SA, SINT and SD packets are received or obtained from the Auxiliary Transport unit in the order listed, unless only the SRQ packet is needed, in which case the other packets are not sent. The functions of each of the fields in the packets is tabulated in Table 10.

TABLE 9

Control Register Packet Formats

| AuxClock | SRQ packet | SA packet | SINT | SD |
|---|---|---|---|---|
| 0 | rsrv | rsrv | 0 | SD15 |
| 1 | rsrv | rsrv | 0 | SD14 |
| 2 | rsrv | rsrv | 0 | SD13 |
| 3 | rsrv | rsrv | 0 | SD12 |
| 4 | rsrv | SA11 | 0 | SD11 |
| 5 | rsrv | SA10 | 0 | SD10 |
| 6 | SOP3 | SA9 | 0 | SD9 |
| 7 | SOP2 | SA8 | 0 | SD8 |
| 8 | SOP1 | SA7 | 0 | SD7 |
| 9 | SOP0 | SA6 | 0 | SD6 |
| 10 | SBC | SA5 | 0 | SD5 |
| 11 | SDEV4 | SA4 | 0 | SD4 |
| 12 | SDEV3 | SA3 | 0 | SD3 |
| 13 | SDEV2 | SA2 | 0 | SD2 |
| 14 | SDEV1 | SA1 | 0 | SD1 |
| 15 | SDEV0 | SA0 | 0 | SD0 |

TABLE 10

Field Description for Control Register Packets

| Field | Description |
|---|---|
| rsrv | Reserved |
| SOP3 . . . SOP0 | Serial opcode. Specifies command for control register transaction.<br>0000 - SRD. Serial read of control register {SA11 . . . SA0} of memory device {SDEV4 . . . SDEV0}.<br>0001 - SWR. Serial write of control register {SA11 . . . SA0} of memory device {SDEV4 . . . SDEV0}.<br>0010 - SETR. Set Reset bit, all control registers assume their reset values.<br>0011 - CLRR. Clear Reset bit, all control registers retain their reset values.<br>0100 - SETF. Set fast (normal) clock mode for the clock circuitry |
| SDEV4 . . . SDEV0 | Serial device field. |
| SBC | Serial broadcast. When set, memory device ignores {SDEV4 . . . SDEV0} serial device field |
| SA11 . . . SA0 | Serial address. Selects which control register of the selected memory device is read or written. |
| SD15 . . . SD0 | Serial data. The 16 bits of data written to or read from the selected control register of the selected memory device. |

As is shown in Table 10, the memory device is selected by the SDEV field and the SOP field determines the Auxiliary Operation to be performed by the Register Operation Unit 5309 in FIG. 46. The Auxiliary Transport Unit also supports the initialization of the memory device because the Auxiliary Transport Unit itself does not require initialization. This function is shown in FIG. 49. In this diagram the CMD signal received by the Auxiliary Transport Unit has different framing information to indicate that an initialization packet follows. This causes all of the memory devices which are connected together on the same external connections in FIG. 46 to break apart a daisy chain connection formed from AuxIn through AuxOut to AuxIn of the next memory device in the chain as the initialization packet passes through the daisy chain. Next, the first memory device in the chain receives a device identification field from the Auxiliary Transport unit into one of its control registers. This field serves to identify the device for future Auxiliary Transport Operations. After the memory device has its control registers configured properly, the device field register is written again to change a bit, causing the first device in the chain to pass the Auxiliary information it receives to the next device in the chain. The sequence is repeated until all of the memory devices have their control registers properly configured and each device has an unique identification.

Figure 50:
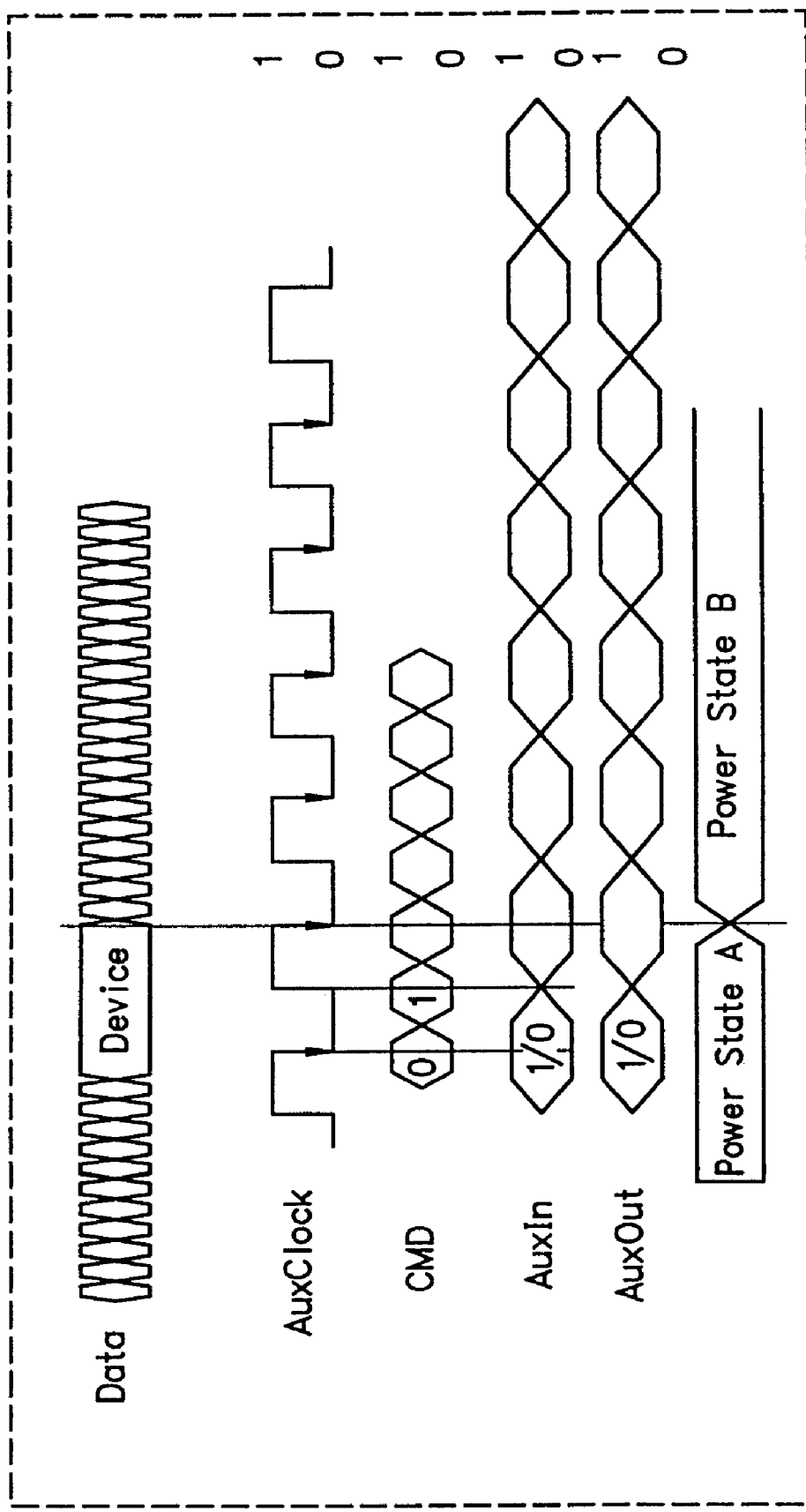
FIG. 50 illustrates framing of the CMD for processing by the auxiliary transport unit in accordance with an embodiment of the invention.

According to an embodiment of the present invention the memory device of FIG. 46 receives power control information, specifying a change in the power mode of the memory device. While power control operations such as Powerdown and Nap are encoded into the precharge packets in one embodiment according to the present invention, other power control operations, such as ExitToNormal and ExitToDrowsy come in through the Auxiliary Transport Unit because the other units in FIG. 46 are not operational due to their reduced power state and because the Auxiliary Transport Unit operates relatively slowly compared to, for example, the Transfer Units, and so does not require much power while the other units are in their reduced power state. These Exit operations may be performed according to FIG. 50. FIG. 50 shows a different framing by the CMD signal so that the Auxiliary Transport Unit can recognize the ExitToNormal or ExitToDrowsy request. According to the timing diagram, when a memory device receives a CMD signal 01 with 0 on the falling edge of AuxClock and 1 on the rising edge of AuxClock, the memory device will exit either the power down state or the nap state (Power State A in the timing diagram) and move to a new power state (Power State B in the diagram), depending on the state of the AuxIn Signal Line. If the AuxIn line is a 1, the memory device will exit to the normal state and if the AuxIn line is a 0 the memory device will exit to the drowsy state. In other embodiments, the meaning of the AuxIn bits is reversed. The device that is targeted for the ExitToNormal or ExitToDrowsy operation is received by the Auxiliary Transport Unit 5308 on the data input field via path 5307 of the memory device in FIG. 46.

In an alternate embodiment, each memory device receives a different CMD signal, one for each device, rather than using the data input field via path 5307 to identify the device for a ExitToNormal or ExitToDrowsy operation.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An integrated circuit memory device comprising:
a memory core including a plurality of memory cells;
a first set of pins to receive, using a clock signal, a row address, followed by a column address;
a second set of pins to receive, using the clock signal:
a sense command, the sense command to specify that the memory device activate a row of memory cells of the plurality of memory cells identified by the row address, and
a write command during a first time period, the write command to specify that the memory device receive write data and store the write data at a location in the row of memory cells, the location identified by the column address, wherein the write command is posted internally to the memory device after a first delay has transpired from the first time period; and
a third set of pins to receive the write data after a second delay has transpired from the first time period.

2. The integrated circuit memory device of claim 1, further comprising a pin to receive the clock signal, wherein the third set of pins receives two consecutive bits of the write data for every pin of the third set of pins during a clock cycle of the clock signal.

3. The integrated circuit memory device of claim 1, wherein the third set of pins outputs read data in response to a read command received at the second set of pins, wherein the read data is output after a third delay from the first time period.

4. The integrated circuit memory device of claim 3, wherein the second delay corresponds to the third delay minus a turnaround time on the third set of pins.

5. The integrated circuit memory device of claim 3, wherein the third set of pins outputs two consecutive bits of the read data for every pin of the third set of pins during a clock cycle of the clock signal.

6. The integrated circuit memory device of claim 1, wherein the third set of pins outputs read data in response to a read command received by the second set of pins, and wherein, for every pin of the third set of pins, at least two bits of the read data are output during a clock cycle of the clock signal.

7. The integrated circuit memory device of claim 1, further comprising a plurality of sense amplifiers to store the write data to the memory core, and wherein the plurality of memory cells are dynamic memory cells.

8. The integrated circuit memory device of claim 7, wherein the second set of pins includes at least one pin to receive precharge information that specifies whether to precharge the plurality of sense amplifiers after the write data is stored in the memory core.

9. The integrated circuit memory device of claim 1, further comprising:
a circuit to cause a fourth delay, after the write command is received at the second set of pins, when issuing control information internally to the memory core of the memory device in response to the write command.

10. The integrated circuit memory device of claim 9, wherein the third set of pins outputs read data in response to a read command received at the second set of pins, the device further comprising:
a multiplexer coupled to the memory core and the circuit, the multiplexer circuit to provide a path to bypass the circuit when issuing control information in response to the read command received at the second set of pins.

11. An integrated circuit memory device comprising:
a memory core including a plurality of memory cells;
a command interface to receive, using a clock signal, an activate command, a row address, a first bank address associated with the activate command, a write command, a column address, and a second bank address associated with the write command, wherein:
the activate command specifies that the memory device activate a row of memory cells identified by the row address, located in a bank of the memory cells identified by the first bank address, and
the write command specifies that the memory device receive write data to be stored to a location in the row of memory cells in a bank identified by the second bank address, wherein the location is identified by the column address;

a data interface to receive the write data after a first delay has transpired from when the write command is received at the command interface; and a circuit to cause a second delay, after the write command is received at the command interface, when issuing control information internally to the integrated circuit memory device in response to the write command.

12. The integrated circuit memory device of claim 11, wherein the command interface includes a set of pins to receive the activate command and the write command, wherein the activate command is included in a first packet and the write command is included in a second packet.

13. The integrated circuit memory device of claim 12, wherein the data interface includes a set of pins to receive two consecutive bits of the write data for every pin of the set of pins during a clock cycle of the clock signal.

14. The integrated circuit memory device of claim 13, wherein the set of pins provide read data output in response to a read command received at the command interface, wherein, for every pin of the set of pins, two bits of the read data are output during a clock cycle of the clock signal.

15. The integrated circuit memory device of claim 11, wherein the command interface includes a set of pins to receive the activate command, the write command and a read command, the device further comprising:

a multiplexer coupled to the memory core and the circuit, the multiplexer circuit to provide a path to bypass the circuit when the control information is issued in response to the read command.

16. The integrated circuit memory device of claim 11, further comprising:

a plurality of sense amplifiers to store the write data to the memory core, wherein the plurality of memory cells are dynamic memory cells.

17. The integrated circuit memory device of claim 16, wherein the command interface includes at least one pin to receive precharge information that specifies whether to precharge the plurality of sense amplifiers after the write data is stored in the memory core.

18. The integrated circuit memory device of claim 11, wherein the first bank address is the same as the second bank address.

19. A method of operation of an integrated circuit memory device that includes a memory core having a plurality of memory cells:

receiving, using a clock signal, a row address, followed by a column address at a first set of pins;

receiving, using the clock signal, a sense command at a second set of pins, wherein the sense command specifies that the memory device activate a row of memory cells of the plurality of memory cells identified by the row address;

receiving, using the clock signal, a write command at the second set of pins, wherein the write command specifies that the memory device receive write data and store the write data at a column of the row of memory cells, the column identified by the column address;

presenting the write command internally after a first delay has transpired from receiving the write command; and receiving at a third set of pins, after a second delay has transpired from receiving the write command, two consecutive bits of write data for every pin of the third set of pins, during a clock cycle of the clock signal.

20. The method of claim 19, further comprising:

receiving a read command at the second set of pins;

in response to the read command, outputting read data after a third delay from when the read command is received, wherein the second delay is based on the third delay.

21. The method of claim 20, wherein the second delay corresponds to the third delay minus a turnaround time on the third set of pins.

22. A method of operation of an integrated circuit memory device having a memory core including a plurality of memory cells, the method comprising:

receiving, using a clock signal, a row address that identifies a row of memory cells of the plurality of memory cells;

receiving, using the clock signal, a first bank address that identifies a bank of the memory core that contains the row;

receiving, using the clock signal, a column address that identifies a location in the row of memory cells;

receiving, using the clock signal, a second bank address that identifies a bank of the memory core that contains the location;

receiving, using the clock signal, a sense command and a write command, wherein:

the sense command specifies that the memory device activate the row identified by the row address and the first bank address, and the write command specifies that the memory device receive write data and store the write data to the location identified by the column address and the second bank address; and receiving at a first set of pins, after a first delay has transpired from receiving the write command, two consecutive bits of the write data for every pin of the first set of pins, during a clock cycle of the clock signal.

23. The method of claim 22, further comprising:

receiving a read command;

in response to the read command, outputting read data after a second delay has transpired from receiving the read command, wherein the first delay is based on the second delay.

24. The method of claim 23, wherein the first delay corresponds to the second delay minus a turnaround time on the first set of pins.

25. The method of claim 22, wherein the sense command, the row address and the first bank address are included in a first packet, and wherein the write command, the column address and the second bank address are included in a second packet.

26. The method of claim 22, wherein the sense command and the write command are received at a second set of pins, wherein the sense command is included in a first packet and the write command is included in a second packet.

27. The method of claim 22, wherein the sense command is received at a second set of pins and the write command is received at a third set of pins, wherein the second set of pins are separate from the third set of pins.

28. The method of claim 22, further comprising:

issuing control information internally to the memory core of the memory device, in response to the write command, after a third delay transpires from receiving the write command.

29. A method of operating an integrated circuit memory device that receives a clock signal and includes a memory core having a plurality of banks, the method comprising:

providing a sense command to a command interface of the memory device, wherein the sense command specifies that the memory device activate a row of memory cells in a bank identified by a first bank address;

providing a row address that identifies the row of memory cells in the bank identified by the first bank address;

providing a column address that identifies a location within the row of memory cells in a bank identified by a second bank address;

providing a write command to the command interface of the memory device after providing the sense command, wherein the write command specifies that the memory device receive write data and store the write data in the location within the row of memory cells, wherein the write command is posted internally to the memory device after a first delay has transpired from when the write command is received at the command interface of the memory device; and providing to a data interface of the memory device, at least two consecutive bits of write data during a clock cycle of the clock signals, after a second delay has transpired after providing the write command.

30. The method of claim 29, wherein the sense command is included in a first control packet and the write command is included in a second control packet.

31. The method of claim 29, wherein the first bank address is the same as the second bank address.

* * * * *

(12) EX PARTE REEXAMINATION CERTIFICATE (8226th)

United States Patent
Barth et al.

(10) Number: US 7,360,050 C1
(45) Certificate Issued: May 10, 2011

(54) INTEGRATED CIRCUIT MEMORY DEVICE HAVING DELAYED WRITE CAPABILITY

(76) Inventors: Richard M. Barth, Palo Alto, CA (US); Frederick A. Ware, Los Altos Hills, CA (US); Donald C. Stark, Los Altos, CA (US); Craig E. Hampel, San Jose, CA (US); Paul G. Davis, San Jose, CA (US); Abhijit M. Abdyankar, Sunnyvale, CA (US); James A. Gasbarro, Mountain View, CA (US); David Nguyen, San Jose, CA (US)

Reexamination Request:
No. 90/009,370, Dec. 23, 2008

Reexamination Certificate for:
Patent No.: 7,360,050
Issued: Apr. 15, 2008
Appl. No.: 11/681,375
Filed: Mar. 2, 2007

Related U.S. Application Data

(60) Continuation of application No. 11/059,216, filed on Feb. 15, 2005, now Pat. No. 7,197,611, which is a continuation of application No. 10/128,167, filed on Apr. 22, 2002, now Pat. No. 6,868,474, which is a division of application No. 09/169,206, filed on Oct. 9, 1998, now Pat. No. 6,401,167.
(60) Provisional application No. 60/061,770, filed on Oct. 10, 1997.

(51) Int. Cl.
*G06F 12/00* (2006.01)

(52) U.S. Cl. .................. 711/167; 711/105; 711/169; 365/190; 365/222
(58) Field of Classification Search .................. 711/167
See application file for complete search history.

(56) References Cited

U.S. PATENT DOCUMENTS

| 3,950,735 | A | 4/1976 | Patel |
| 4,183,095 | A | 1/1980 | Ward |
| 4,315,308 | A | 2/1982 | Jackson |
| 4,330,852 | A | 5/1982 | Redwine et al. |
| 4,337,523 | A | 6/1982 | Hotta et al. |

(Continued)

FOREIGN PATENT DOCUMENTS

| EP | 0 339 224 A2 | 11/1989 |
| EP | 0 487 819 A2 | 6/1992 |
| EP | 0 535 670 A1 | 4/1993 |
| EP | 0 561 370 A2 | 9/1993 |
| EP | 0 605 887 A2 | 7/1994 |

(Continued)

OTHER PUBLICATIONS

U.S. Appl. No. 60/026,594, filed Sep. 20, 1996, Gillingham.
U.S. Appl. No. 60/055,349, filed Aug. 11, 1997, Ryan et al.

(Continued)

*Primary Examiner*—Woo H. Choi

(57) ABSTRACT

An integrated circuit memory device has a first set of pins to receive, using a clock signal, a row address followed by a column address. The device has a second set of pins to receive, using the clock signal, a sense command and a write command. The sense command specifies that the device activate a row of memory cells identified by the row address. The write command specifies that the memory device receive write data and store the write data at a location, identified by the column address, in the row of memory cells. The write command is posted internally to the memory device after a first delay has transpired from a first time period in which the write command is received at the second set of pins. The write data is received at a third set of pins after a second delay has transpired from the first time period.

At the time of issuance and publication of this certificate, the patent remains subject to pending reexamination control number 95/001,205 filed Jun. 23, 2009. The claim content of the patent may be subsequently revised if a reexamination certificate issues from the reexamination proceeding.

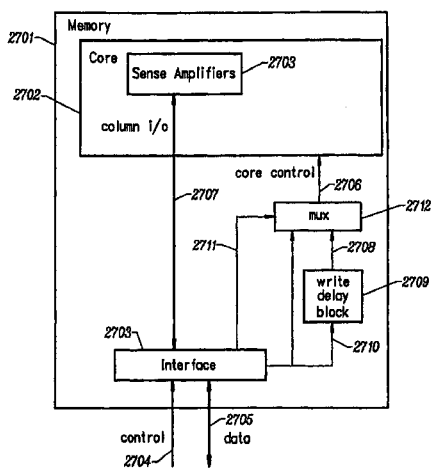

U.S. PATENT DOCUMENTS

| | | |
|---|---|---|
| 4,445,204 A | 4/1984 | Nishiguchi |
| 4,499,536 A | 2/1985 | Gemma et al. |
| 4,528,661 A | 7/1985 | Bahr et al. |
| 4,637,018 A | 1/1987 | Flora et al. |
| 4,646,270 A | 2/1987 | Voss |
| 4,712,190 A | 12/1987 | Guglielmi et al. |
| 4,719,602 A | 1/1988 | Hag et al. |
| 4,755,937 A | 7/1988 | Glier |
| 4,763,249 A | 8/1988 | Bomba et al. |
| 4,792,926 A | 12/1988 | Roberts |
| 4,792,929 A | 12/1988 | Olson et al. |
| 4,799,199 A | 1/1989 | Scales, III et al. |
| 4,800,530 A | 1/1989 | Itoh et al. |
| 4,821,226 A | 4/1989 | Christopher et al. |
| 4,825,411 A | 4/1989 | Hamano |
| 4,845,644 A | 7/1989 | Anthias et al. |
| 4,845,664 A | 7/1989 | Aichelmann, Jr. et al. |
| 4,845,677 A | 7/1989 | Chappell et al. |
| 4,849,937 A | 7/1989 | Yoshimoto |
| 4,866,675 A | 9/1989 | Kawashima |
| 4,875,192 A | 10/1989 | Matsumoto |
| 4,882,712 A | 11/1989 | Ohno et al. |
| 4,891,791 A | 1/1990 | Iijima |
| 4,916,670 A | 4/1990 | Suzuki et al. |
| 4,920,483 A | 4/1990 | Pogue et al. |
| 4,928,265 A | 5/1990 | Higuchi et al. |
| 4,937,734 A | 6/1990 | Bechtolsheim |
| 4,945,516 A | 7/1990 | Kashiyama |
| 4,953,128 A | 8/1990 | Kawai |
| 5,001,672 A | 3/1991 | Ebbers et al. |
| 5,022,004 A | 6/1991 | Kurtze et al. |
| 5,077,693 A | 12/1991 | Hardee et al. |
| 5,083,296 A | 1/1992 | Hara et al. |
| 5,111,386 A | 5/1992 | Fujishima et al. |
| 5,124,589 A | 6/1992 | Shiomi et al. |
| 5,140,688 A | 8/1992 | White et al. |
| 5,150,467 A | 9/1992 | Hayes |
| 5,159,676 A | 10/1992 | Wicklund et al. |
| 5,179,687 A | 1/1993 | Hidaka et al. |
| 5,260,905 A | 11/1993 | Mori |
| 5,272,664 A | 12/1993 | Alexander et al. |
| 5,276,858 A | 1/1994 | Oak et al. |
| 5,301,278 A | 4/1994 | Bowater et al. |
| 5,305,278 A | 4/1994 | Inoue |
| 5,311,483 A | 5/1994 | Takasugi |
| 5,319,755 A | 6/1994 | Farmwald et al. |
| 5,323,358 A | 6/1994 | Toda et al. |
| 5,327,390 A | 7/1994 | Takasugi |
| 5,337,285 A | 8/1994 | Ware et al. |
| 5,339,276 A | 8/1994 | Takasugi |
| 5,341,341 A | 8/1994 | Fukuzo |
| 5,345,573 A | 9/1994 | Bowden, III et al. |
| 5,365,489 A | 11/1994 | Jeong |
| 5,375,089 A | 12/1994 | Lo |
| 5,381,376 A | 1/1995 | Kim et al. |
| 5,381,538 A | 1/1995 | Amini et al. |
| 5,384,745 A | 1/1995 | Konishi et al. |
| 5,386,385 A | 1/1995 | Stephens, Jr. |
| 5,388,222 A | 2/1995 | Chisvin et al. |
| 5,388,250 A | 2/1995 | Lewis et al. |
| 5,390,149 A | 2/1995 | Vogley et al. |
| 5,392,239 A | 2/1995 | Margulis et al. |
| 5,404,338 A | 4/1995 | Murai et al. |
| 5,404,463 A | 4/1995 | McGarvey |
| 5,430,676 A | 7/1995 | Ware et al. |
| 5,432,468 A | 7/1995 | Moriyama et al. |
| 5,438,535 A | 8/1995 | Lattibeaudiere |
| 5,444,667 A | 8/1995 | Obara |
| 5,452,401 A | 9/1995 | Lin |
| 5,455,803 A | 10/1995 | Kodama |
| 5,471,607 A | 11/1995 | Garde |
| 5,483,640 A | 1/1996 | Isfeld et al. |
| 5,504,874 A | 4/1996 | Galles et al. |
| 5,508,960 A | 4/1996 | Pinkham |
| 5,511,024 A | 4/1996 | Ware et al. |
| 5,533,054 A | 7/1996 | DeAndrea et al. |
| 5,533,204 A | 7/1996 | Tipley |
| 5,542,067 A | 7/1996 | Chappell et al. |
| 5,548,786 A | 8/1996 | Amini et al. |
| 5,553,248 A | 9/1996 | Melo et al. |
| 5,560,000 A | 9/1996 | Vogley |
| 5,568,445 A | 10/1996 | Park et al. |
| 5,577,236 A | 11/1996 | Johnson et al. |
| 5,581,746 A | 12/1996 | Watanabe |
| 5,588,130 A | 12/1996 | Fujishima et al. |
| 5,594,704 A | 1/1997 | Konishi et al. |
| 5,598,376 A | 1/1997 | Merritt et al. |
| 5,611,058 A | 3/1997 | Moore et al. |
| 5,613,075 A | 3/1997 | Wade et al. |
| 5,615,358 A | 3/1997 | Vogley |
| 5,623,607 A | 4/1997 | Kodama et al. |
| 5,636,173 A | 6/1997 | Schaefer |
| 5,638,531 A | 6/1997 | Crump et al. |
| 5,646,904 A | 7/1997 | Ohno et al. |
| 5,649,161 A | 7/1997 | Andrade et al. |
| 5,655,113 A | 8/1997 | Leung |
| 5,659,515 A | 8/1997 | Matsuo et al. |
| 5,673,226 A | 9/1997 | Yumitori et al. |
| 5,680,361 A | 10/1997 | Ware et al. |
| 5,708,622 A | 1/1998 | Ohtani et al. |
| 5,715,407 A | 2/1998 | Barth et al. |
| 5,737,587 A | 4/1998 | Leung et al. |
| 5,740,398 A | 4/1998 | Quattromani et al. |
| 5,748,914 A | 5/1998 | Barth et al. |
| 5,758,132 A | 5/1998 | Stralin |
| 5,764,963 A | 6/1998 | Ware et al. |
| 5,765,020 A | 6/1998 | Barth et al. |
| 5,774,409 A | 6/1998 | Yamazaki et al. |
| 5,777,942 A | 7/1998 | Dosaka et al. |
| 5,778,419 A | 7/1998 | Hansen et al. |
| 5,781,918 A | 7/1998 | Lieberman et al. |
| 5,793,227 A | 8/1998 | Goldrian |
| 5,796,995 A | 8/1998 | Nasserbakht et al. |
| 5,802,356 A | 9/1998 | Gaskins et al. |
| 5,802,555 A | 9/1998 | Shigeeda |
| 5,805,873 A | 9/1998 | Roy |
| 5,815,693 A | 9/1998 | McDermott et al. |
| 5,819,076 A | 10/1998 | Jeddeloh et al. |
| 5,828,606 A | 10/1998 | Mick |
| 5,844,855 A | 12/1998 | Ware et al. |
| 5,857,095 A | 1/1999 | Jeddeloh et al. |
| 5,870,350 A | 2/1999 | Bertin et al. |
| 5,872,996 A | 2/1999 | Barth et al. |
| 5,884,100 A | 3/1999 | Normoyle et al. |
| 5,886,948 A | 3/1999 | Ryan |
| 5,896,545 A | 4/1999 | Barth et al. |
| 5,917,760 A | 6/1999 | Millar |
| 5,918,058 A | 6/1999 | Budd |
| 5,940,340 A | 8/1999 | Ware et al. |
| 5,948,081 A | 9/1999 | Foster |
| 5,953,263 A | 9/1999 | Farmwald et al. |
| 5,956,284 A | 9/1999 | Ware et al. |
| 5,966,343 A | 10/1999 | Thurston |
| 5,970,019 A | 10/1999 | Suzuki et al. |
| 5,978,296 A | 11/1999 | Zibert |
| 5,987,620 A | 11/1999 | Tran |
| 6,006,290 A | 12/1999 | Suh |
| 6,021,264 A | 2/2000 | Morita |
| 6,034,916 A | 3/2000 | Lee |
| 6,035,369 A | 3/2000 | Ware et al. |
| 6,041,419 A | 3/2000 | Huang et al. |

| | | |
|---|---|---|
| 6,044,429 A | 3/2000 | Ryan et al. |
| 6,065,092 A | 5/2000 | Roy |
| 6,075,730 A | 6/2000 | Barth et al. |
| 6,088,774 A | 7/2000 | Gillingham |
| 6,105,144 A | 8/2000 | Wu |
| 6,115,318 A | 9/2000 | Keeth |
| 6,125,078 A | 9/2000 | Ooishi et al. |
| 6,131,149 A | 10/2000 | Lu et al. |
| 6,134,638 A | 10/2000 | Olarig et al. |
| 6,151,648 A | 11/2000 | Haq |
| 6,182,207 B1 | 1/2001 | Poivre et al. |
| 6,185,151 B1 | 2/2001 | Cho |
| 6,209,071 B1 | 3/2001 | Barth et al. |
| 6,226,723 B1 | 5/2001 | Gustavson et al. |
| 6,226,757 B1 | 5/2001 | Ware et al. |
| 6,256,716 B1 | 7/2001 | Pham |
| 6,260,097 B1 | 7/2001 | Farmwald et al. |
| 6,263,448 B1 | 7/2001 | Tsern et al. |
| 6,266,285 B1 | 7/2001 | Farmwald et al. |
| 6,279,077 B1 | 8/2001 | Nasserbakht et al. |
| 6,292,903 B1 | 9/2001 | Coteus et al. |
| 6,301,627 B1 | 10/2001 | Neal et al. |
| 6,304,937 B1 | 10/2001 | Farmwald et al. |
| 6,314,051 B1 | 11/2001 | Farmwald et al. |
| 6,321,316 B1 | 11/2001 | Manning |
| 6,343,352 B1 | 1/2002 | Davis et al. |
| 6,359,815 B1 | 3/2002 | Sato et al. |
| 6,401,167 B1 | 6/2002 | Barth et al. |
| 6,404,178 B2 | 6/2002 | Kato |
| 6,404,258 B2 | 6/2002 | Ooishi |
| 6,437,619 B2 | 8/2002 | Okuda et al. |
| 6,442,644 B1 | 8/2002 | Gustavson et al. |
| 6,456,544 B1 | 9/2002 | Zumkehr |
| 6,462,998 B1 | 10/2002 | Proebsting |
| 6,463,066 B2 | 10/2002 | Moriwaki et al. |
| 6,470,405 B2 | 10/2002 | Barth et al. |
| 6,493,789 B2 | 12/2002 | Ware et al. |
| 6,496,897 B2 | 12/2002 | Ware et al. |
| 6,510,503 B2 | 1/2003 | Gillingham |
| 6,526,462 B1 | 2/2003 | Elabd |
| 6,560,652 B1 | 5/2003 | Larson et al. |
| 6,570,873 B1 | 5/2003 | Isoyama et al. |
| 6,584,037 B2 | 6/2003 | Farmwald et al. |
| 6,591,353 B1 | 7/2003 | Barth et al. |
| 6,629,222 B1 | 9/2003 | Jeddeloh |
| 6,640,292 B1 | 10/2003 | Barth et al. |
| 6,658,578 B1 | 12/2003 | Laurenti et al. |
| 6,677,791 B2 | 1/2004 | Okuda et al. |
| 6,681,288 B2 | 1/2004 | Ware et al. |
| 6,701,446 B2 | 3/2004 | Tsern et al. |
| 6,748,507 B2 | 6/2004 | Kawasaki et al. |
| 6,757,779 B1 | 6/2004 | Nataraj et al. |
| 6,868,474 B2 | 3/2005 | Barth et al. |
| 6,889,300 B2 | 5/2005 | Davis et al. |
| 6,892,273 B1 | 5/2005 | James et al. |
| 6,928,571 B1 | 8/2005 | Bonella et al. |
| 6,931,467 B2 | 8/2005 | Barth et al. |
| 6,934,201 B2 | 8/2005 | Ware et al. |
| 7,047,375 B2 | 5/2006 | Davis et al. |
| 7,177,998 B2 | 2/2007 | Ware et al. |
| 7,197,611 B2 | 3/2007 | Barth et al. |
| 7,210,016 B2 | 4/2007 | Ware et al. |
| 7,287,103 B2 | 10/2007 | Ganfield et al. |
| 7,287,109 B2 | 10/2007 | Barth et al. |
| 7,287,119 B2 | 10/2007 | Barth et al. |
| 7,330,952 B2 | 2/2008 | Barth et al. |
| 7,330,953 B2 | 2/2008 | Barth et al. |
| 7,360,050 B2 | 4/2008 | Barth et al. |
| 7,496,709 B2 | 2/2009 | Barth et al. |
| 2009/0129178 A1 | 5/2009 | Barth et al. |

FOREIGN PATENT DOCUMENTS

| | | |
|---|---|---|
| EP | 0 638 858 A1 | 2/1995 |
| EP | 0 709 786 A1 | 5/1996 |
| EP | 0 778 575 A2 | 6/1997 |
| FR | 2 695 227 A1 | 3/1994 |
| JP | 57-210495 A | 12/1982 |
| JP | 58-192154 A | 11/1983 |
| JP | 61-107453 A | 5/1986 |
| JP | 61-160556 U | 10/1986 |
| JP | 62-016289 A | 1/1987 |
| JP | 63-034795 A | 2/1988 |
| JP | 63-091766 A | 4/1988 |
| JP | 63-217452 A | 9/1988 |
| JP | 63-239676 A | 10/1988 |
| JP | 01-236494 A | 9/1989 |
| WO | WO 96/30838 A1 | 10/1996 |
| WO | WO 99/46687 A1 | 9/1999 |

OTHER PUBLICATIONS

U.S. Appl. No. 60/657,092, filed Sep. 27, 1997, Gustavson, et al.

"Future SDRAM–Clock Issues: PLL/DLL Circuits and/or Echo Clocks", JEDEC Meeting Jan. 31, 1996, 6 pgs.

"M5M4V16807ATP–10, 12–, –15 Target Spec. (Rev. 0.3)," Mitsubishi Electric, May 7, 1993, pp. 1–36.

"MT4LC4M4E9 (S) 4 MEG×DRAM," Micron Semiconductor, Inc., 1994, pp. 1–183/1–196.

"Synchronous Dram" Micron Technology, Inc., Rev. Apr. 1996.

Arimoto et al. "A Circuit Design of Intelligent Cache DRAM with Automatic Write–Back Capability", IEEE Journal of Solid–State Circuits, vol. 26, No. 4, Apr. 1991, pp. 560–565.

Ayukawa et al., "An Access–Sequence Control Scheme to Enhance Random–Access Performance of Embedded DRAM's", IEEE Journal of Solid–State Circuits, vol. 33, No. 5, May 1998, pp. 800–806.

Diamond, Stephen L. "SyncLink: High–Speed DRAM for the Future", Micro Standards, IEEE Micro, IEEE Computer Society, vol. 16, No. 6, Dec. 1996, pp. 74–75.

Fujiwara et al., "A 200MHz 16Mbit Synchronous DRAM with Block Access Mode", 1994 Symposium on VLSI Circuits Digest of Technical Papers, IEEE, 1994, pp. 79–80.

Gillingham et al., "SLDRAM: High–Performance, Open–Standard Memory", IEEE Micro, vol. 17, No. 6, Nov. 1997, pp. 29–39.

Gillingham, Peter, "SLDRAM Architecural and Functional Overview", SLDRAM Consortium, Aug. 29, 1997, 14 pgs.

Haining et al., "Management Policies For Non–Volatile Write Caches", IEEE, International Conference on Performance, Computing, and Communications, FE. 10–12, 1999, pp. 321–328.

Jedec, "Configurations for Solid State Memories", Jedec Standard No. 21–C Release 4, Electronic Industries Association, Nov. 1993, 214 pgs.

Kristiansen, et al., "Scalable Coherent Interface", Eurobus Conference Proceedings, May 1989, 8 pgs.

Kumanoya et al, "Trends in High–Speed DRAM Architecture", IEICE Trans. Electron. vol. E79–C, No. 4, Apr. 1996, pp. 472–481.

Micron Semiconductor, Inc. "MT48LC2M8S1 (S) 2 MEG×8 SDRAM, Synchronous Dram, 2 MEG×8 SDRAM, Pulsed RAS, Dual Bank, Burst Mode, 3.3V, Self Refresh", Advance, Apr. 1994, Section 2, pp. 44–83.

Mosys, Inc., "MD904 to MD920, ½ to 2½ Mbyte, Multibank DRAM (MDRAM), 128K×32 to 656K×32: Preliminary Information", 1996, 16 pgs.

MT48LC2M8xxS 2 Meg×8 SDRAM Micron Technology, Inc., Rev. Apr. 1996.

Nvidia's First Supplement to its Objections and Responses to Rambus's First Set of Interrogatories (Nos. 1–37), Jan. 29, 2009, USITC, Investigation No. 337–TA–661, 34 pgs.

Ohno, Chikai, "Self–Timed RAM: STRAM", Fujitsu Sci. Tech J., 24, Dec. 4, 1988, pp. 293–300.

Przybylski, Steven A., "New DRAM Technologies: A Comprehensive Analysis of the New Architectures," *Evolutionary Alternatives,* MicroDesign Resources, 1994, pp. iii–iv, 119–121, 138–158, 177–203.

Rambus Inc., "16/18Mbit (2M×8/9) & 64/72Mbit (8M×8/9) Concurrent RDRAM", Advance Information Data Sheet, Jul. 1996, 61 pgs.

Rambus Inc., "16/18Mbit (2M×8/9) and 64/72Mbit (8M×8/9) Concurrent RDRAM", Preliminary Information—Rambus Company Confidential, Data Sheet, Mar. 1996, pp. 1–30.

Rambus Inc., "8/9–Mbit (1M×8/9) and 16/18–Mbit (2M×8/9) RDRAM" Preliminary Information Data Sheet, Mar. 1996, 30 pgs.

Rambus, Inc., "Architectural Overview", 1992, pp. 1–19.

Shiratake et al., "A Pseudo Multi–Bank DRAM with Categorized Access Sequence", Symposium on VLSI Circuits Digest of Technical Papers, Jun. 17–19, 1999, pp. 127–130.

SLDRAM Inc., "SLD4M18DR400, 4 MEG×18 SLDRAM, 400 Mb/s/pin SLDRAM: 4M×18 SLDRAM Pipelined, Eight Bank, 2.5V Operation", Draft/Advance, Jul. 9, 1998, 69 pgs.

TMS626402, "2097 152–Word by 4–Bit by 2–Bank Synchronous Dynamic Random–Access Memory," Texas Instruments, Jun. 1994, Section 5, pp. 3–23.

Respondents' Responsive Claim Construction Brief, dated Mar. 12, 2009, In the Matter of: Certain Semiconductor Chips Having Synchronous Dynamic Random Access Memory Controllers and Prodcuts Containing Same, 84 pages.

Rambus Inc.'s Responsive Brief on Disputed Claim Terms, dated Mar. 16, 2009, In the Matter of: Certain Semiconductor Chips Having Synchronous Dynamic Random Access Memory Controllers and Products Containing Same, 223 pages.

English Abstract for FR2695227A1 published Mar. 4, 1994, 1 pg.

English Abstract for JP1–236494A published Sep. 21, 1989, 1 pg.

English Abstract and brief description for JP58–192154A published Nov. 9, 1983, 3 pgs.

English Abstract and brief description for JP61–107453A published May 26, 1986, 3 pgs.

Brief description for JP61–160556U published Oct. 4, 1986, 1 pg.

English Abstract and brief description for JP62–016289A published Jan. 24, 1987, 3 pgs.

English Abstract and brief description for JP63–034795A published Feb. 15, 1988, 3 pgs.

English Abstract and Translation for JP63–091766A published Apr. 22, 1988, 11 pgs.

English Abstract for JP63–217452A published Sep. 9, 1988, 1 pg.

English Abstract and Translation for JP63–239676A publsihed Oct. 5, 1988, 32 pgs.

Ayukawa et al., "An Access–Sequence Control Scheme to Enhance Random–Access Performance of Embedded DRAM's", IEEE Journal of Solid–State Circuits, vol. 33, No. 5, May 1998, pp. 800–806.

Prince, B., Semiconductor Memories: A Handbook of Design, Manufacture, and Application, $2^{nd}$ ed., 1991, p. 275.

Ohshima, Shigeo et al., "High Speed DRAMs with Innovative Architectures," IEICE Trans. Electron, vol. E77–C, No. 8, Aug. 1994.

Kushiyama, Natsuki et al, "A 500–Megabyte/s Data–Rate 4.5M DRAM" IEEE Journal of Solid State Circuits, IEEE Service Center, Piscataway, NJ, US, vol. 28, No. 4, Apr. 1, 1993 (Apr. 1, 1993), pp. 490–498.

8–MBIT (512K×16, 1024K×8) SmartVoltage Boot Block Flash Memory Family product preview ("Intel Datasheet"). The Intel Datasheet was published Sep. 1995.

Betty Prince, "High Performance Memories: New Architecture DRAMs and SRAMs—evolution and function", John Wiley & Sons, New York, 1996.

Betty Prince, "High Performance Memories: New Architecture DRAMs and SRAMs—evolution and function", John Wiley & Sons, New York, 1999.

Gustavson, David B. et al., "Packetized Communicated for a High Performance Random Access Memory System," U.S. Appl. No. 60/026,419, filed Sep. 20, 1996.

Gustavson, David B. et al., "Packets for a High Performance Random Access Memory System," U.S. Appl. No. 60/026,896, filed Sep. 20, 1996.

Thurston, Paulette, "Variable Latency Memory Circuit," U.S. Appl. No. 60/034,470, filed Jan. 2, 1997.

Nakamura, Masayuki et al., "Four Bit Pre–Fetch SDRAM Column Select Architecture," U.S. Appl. No. 60/021,567, filed Jul. 11, 1996.

Nakamura, Masayuki et al., "DRAM Architecture with Aligned Data Storage and Bond Pads," U.S. Appl. No. 60/021,565, filed Jul. 11, 1996.

McAdams, Hugh P. et al., "Data Sequencing and Registering in a Four Bit Pre–Fetch SDRAM," U.S. Appl. No. 60/021,524, filed Jul. 11, 1996.

EX PARTE REEXAMINATION CERTIFICATE ISSUED UNDER 35 U.S.C. 307

NO AMENDMENTS HAVE BEEN MADE TO THE PATENT

AS A RESULT OF REEXAMINATION, IT HAS BEEN DETERMINED THAT:

The patentability of claims 29 and 31 is confirmed.

Claims 1-28 and 30 were not reexamined.

\* \* \* \* \*

(12) INTER PARTES REEXAMINATION CERTIFICATE (626th)
United States Patent
Barth et al.

(10) Number: US 7,360,050 C2
(45) Certificate Issued: Jun. 17, 2013

(54) INTEGRATED CIRCUIT MEMORY DEVICE HAVING DELAYED WRITE CAPABILITY

(75) Inventors: Richard M. Barth, Palo Alto, CA (US); Frederick A. Ware, Los Altos Hills, CA (US); Donald C. Stark, Los Altos, CA (US); Craig E. Hampel, San Jose, CA (US); Paul G. Davis, San Jose, CA (US); Abhijit M. Abhyankar, Sunnyvale, CA (US); James A. Gasbarro, Mountain View, CA (US); David Nguyen, San Jose, CA (US)

(73) Assignee: Rambus Incorporated, Mountain View, CA (US)

Reexamination Request:
No. 95/001,205, Jul. 1, 2009

Reexamination Certificate for:
Patent No.: 7,360,050
Issued: Apr. 15, 2008
Appl. No.: 11/681,375
Filed: Mar. 2, 2007

Reexamination Certificate C1 7,360,050 issued May 10, 2011

Related U.S. Application Data

(60) Continuation of application No. 11/059,216, filed on Feb. 15, 2005, now Pat. No. 7,197,611, which is a continuation of application No. 10/128,167, filed on Apr. 22, 2002, now Pat. No. 6,868,474, which is a division of application No. 09/169,206, filed on Oct. 9, 1998, now Pat. No. 6,401,167.

(60) Provisional application No. 60/061,770, filed on Oct. 10, 1997.

(51) Int. Cl.
*G06F 12/00* (2006.01)

(52) U.S. Cl.
USPC ........... 711/167; 711/105; 711/169; 365/190; 365/222

(58) Field of Classification Search
None
See application file for complete search history.

(56) References Cited

To view the complete listing of prior art documents cited during the proceeding for Reexamination Control Number 95/001,205, please refer to the USPTO's public Patent Application Information Retrieval (PAIR) system under the Display References tab.

*Primary Examiner* — Zoila Cabrera

(57) ABSTRACT

An integrated circuit memory device has a first set of pins to receive, using a clock signal. a row address followed by a column address. The device has a second set of pins to receive, using the clock signal, a sense command and a write command. The sense command specifies that the device activate a row of memory cells identified by the row address. The write command specifies that the memory device receive write data and store the write data at a location, identified by the column address, in the row of memory cells. The write command is posted internally to the memory device after a first delay has transpired from a first time period in which the write command is received at the second set of pins. The write data is received at a third set of pins after a second delay has transpired from the first time period.

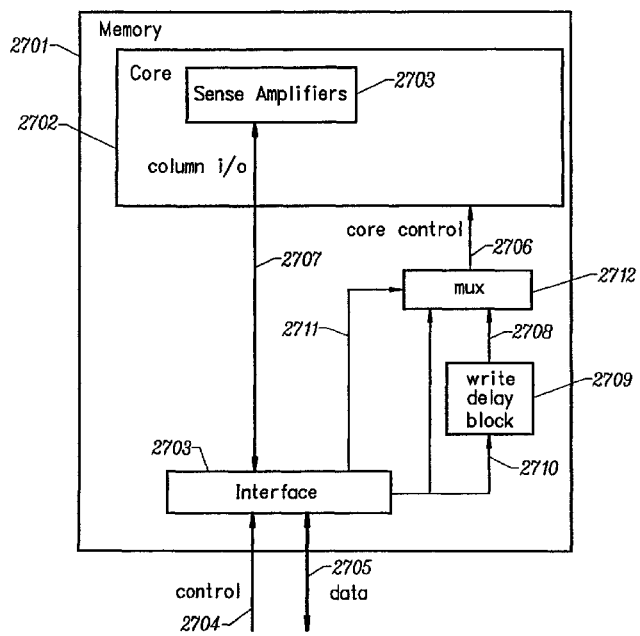

INTER PARTES REEXAMINATION CERTIFICATE ISSUED UNDER 35 U.S.C. 316

THE PATENT IS HEREBY AMENDED AS INDICATED BELOW.

AS A RESULT OF REEXAMINATION, IT HAS BEEN DETERMINED THAT:

The patentability of claims 4, 21, 24 and 27 is confirmed.

Claims 1-3, 5-20, 22, 23, 25, 26 and 28-31 are cancelled.

\* \* \* \* \*